(12) United States Patent
Miyanaga et al.

(10) Patent No.: US 9,048,094 B2
(45) Date of Patent: Jun. 2, 2015

(54) METHOD FOR MANUFACTURING SEMICONDUCTOR DEVICE COMPRISING FORMING OXIDE SEMICONDUCTOR BY SPUTTERING

(71) Applicant: Semiconductor Energy Laboratory Co., Ltd., Atsugi-shi, Kanagawa-ken (JP)

(72) Inventors: Akiharu Miyanaga, Hadano (JP); Junichiro Sakata, Atsugi (JP); Masayuki Sakakura, Tochigi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/945,487

(22) Filed: Jul. 18, 2013

(65) Prior Publication Data
US 2013/0330914 A1    Dec. 12, 2013

Related U.S. Application Data

(63) Continuation of application No. 12/887,674, filed on Sep. 22, 2010, now abandoned.

(30) Foreign Application Priority Data

Sep. 24, 2009 (JP) ................................. 2009-219128

(51) Int. Cl.
*H01L 21/02* (2006.01)
*H01L 29/786* (2006.01)
*H01L 29/66* (2006.01)

(52) U.S. Cl.
CPC ...... *H01L 21/02565* (2013.01); *H01L 29/7869* (2013.01); *H01L 29/66969* (2013.01)

(58) Field of Classification Search
CPC ......................... H01L 29/7869; H01L 27/1225
USPC .............................. 257/43, E21.461; 438/795
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 001405898 A | 3/2003 |
| EP | 1737044 A | 12/2006 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Matthew Gordon
(74) *Attorney, Agent, or Firm* — Eric J. Robinson; Robinson Intellectual Property Law Office, P.C.

(57) ABSTRACT

It is an object to provide a thin film transistor having favorable electric characteristics and high reliability and a semiconductor device which includes the thin film transistor as a switching element. An In—Ga—Zn—O-based film having an incubation state that shows an electron diffraction pattern, which is different from a conventionally known amorphous state where a halo shape pattern appears and from a conventionally known crystal state where a spot appears clearly, is formed. The In—Ga—Zn—O-based film having an incubation state is used for a channel formation region of a channel etched thin film transistor.

18 Claims, 35 Drawing Sheets

(56) References Cited

U.S. PATENT DOCUMENTS

| | | | |
|---|---|---|---|
| 5,972,527 A * | 10/1999 | Kaijou et al. | 428/697 |
| 6,294,274 B1 | 9/2001 | Kawazoe et al. | |
| 6,563,174 B2 | 5/2003 | Kawasaki et al. | |
| 6,726,812 B1 * | 4/2004 | Toyama | 204/192.11 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,719,185 B2 | 5/2010 | Jin et al. | |
| 7,732,819 B2 | 6/2010 | Akimoto et al. | |
| 7,745,798 B2 | 6/2010 | Takahashi | |
| 8,158,974 B2 | 4/2012 | Yano et al. | |
| 8,445,903 B2 | 5/2013 | Inoue et al. | |
| 8,461,583 B2 | 6/2013 | Yano et al. | |
| 8,723,175 B2 | 5/2014 | Yano et al. | |
| 8,779,419 B2 | 7/2014 | Yano et al. | |
| 8,791,457 B2 | 7/2014 | Yano et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0111663 A1 | 6/2003 | Yagi | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0233374 A1 * | 11/2004 | Yamazaki et al. | 349/153 |
| 2005/0006667 A1 * | 1/2005 | Yamazaki | 257/200 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0072439 A1 * | 3/2007 | Akimoto et al. | 438/795 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0246407 A1 * | 10/2008 | Yoshida et al. | 315/169.3 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0315194 A1 | 12/2008 | Kim et al. | |
| 2008/0315200 A1 | 12/2008 | Kim et al. | |
| 2009/0002590 A1 | 1/2009 | Kimura | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0179199 A1 | 7/2009 | Sano et al. | |
| 2009/0189155 A1 | 7/2009 | Akimoto | |
| 2009/0189156 A1 | 7/2009 | Akimoto | |
| 2009/0278122 A1 | 11/2009 | Hosono et al. | |
| 2009/0280600 A1 | 11/2009 | Hosono et al. | |
| 2009/0283762 A1 | 11/2009 | Kimura | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117999 A1 | 5/2010 | Matsunaga et al. | |
| 2013/0234134 A1 | 9/2013 | Inoue et al. | |

FOREIGN PATENT DOCUMENTS

| | | |
|---|---|---|
| EP | 2226847 A | 9/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-029293 A | 1/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2007-081362 A | 3/2007 |
| JP | 2007-096055 A | 4/2007 |
| JP | 2007-123861 A | 5/2007 |

(56) References Cited

FOREIGN PATENT DOCUMENTS

| | | |
|---|---|---|
| JP | 2007-163467 A | 6/2007 |
| JP | 2007-171932 A | 7/2007 |
| JP | 2009-265271 A | 11/2009 |
| JP | 2010-098280 A | 4/2010 |
| WO | WO-2004/114391 | 12/2004 |
| WO | WO-2006/051993 | 5/2006 |
| WO | WO-2008/117739 | 10/2008 |
| WO | WO-2008/126884 | 10/2008 |
| WO | WO-2008/156311 | 12/2008 |
| WO | WO-2008/156312 | 12/2008 |
| WO | WO-2009/081885 | 7/2009 |
| WO | WO-2010/047077 | 4/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Lay,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2010/065884) Dated Dec. 14, 2010.

Written Opinion (Application No. PCT/JP2010/065884) Dated Dec. 14, 2010.

Chinese Office Action (Application No. 201080043173.1) Dated May 5, 2014.

Taiwanese Office Action (Application No. 099131867) Dated Apr. 10, 2015.

\* cited by examiner

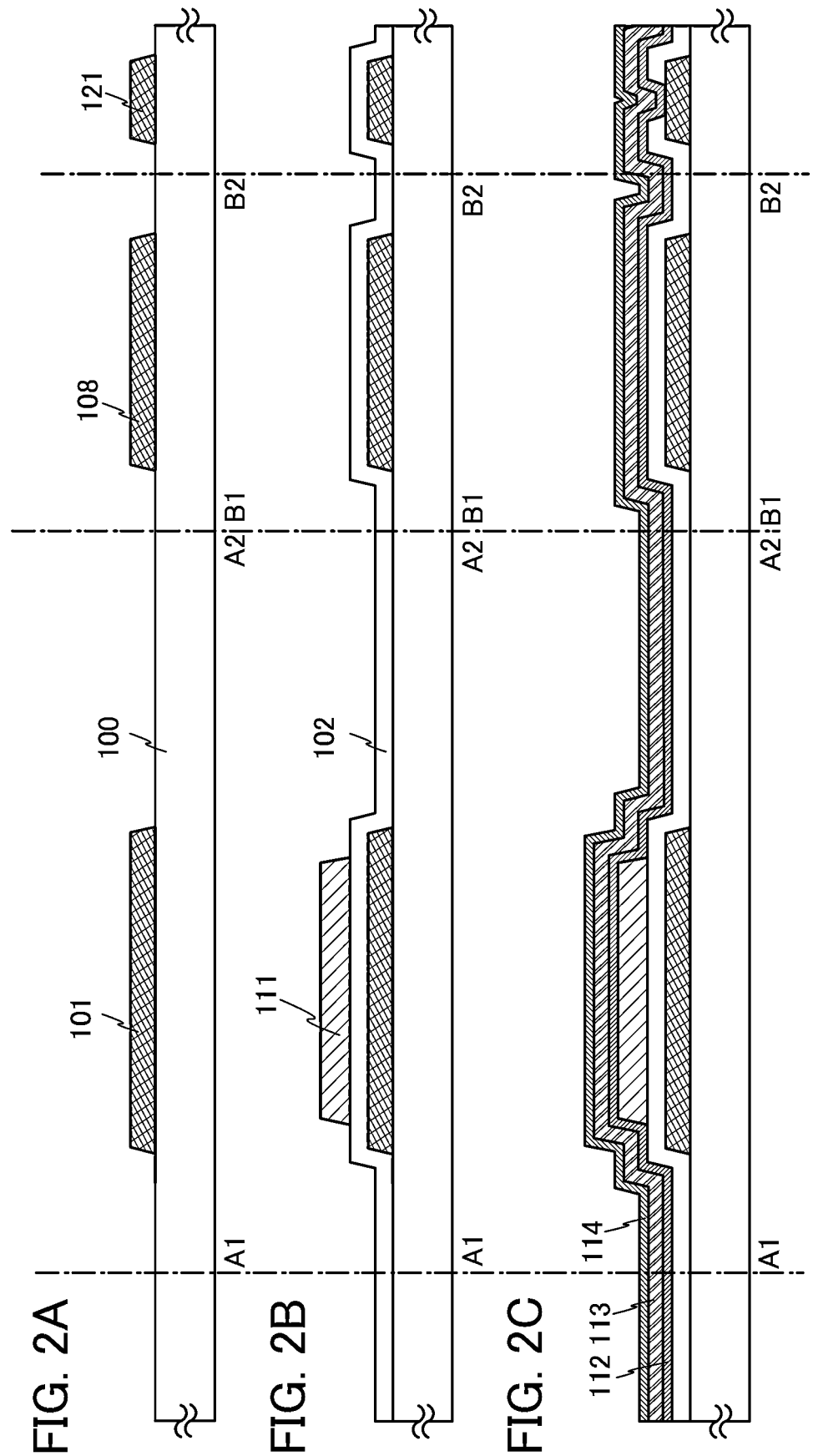

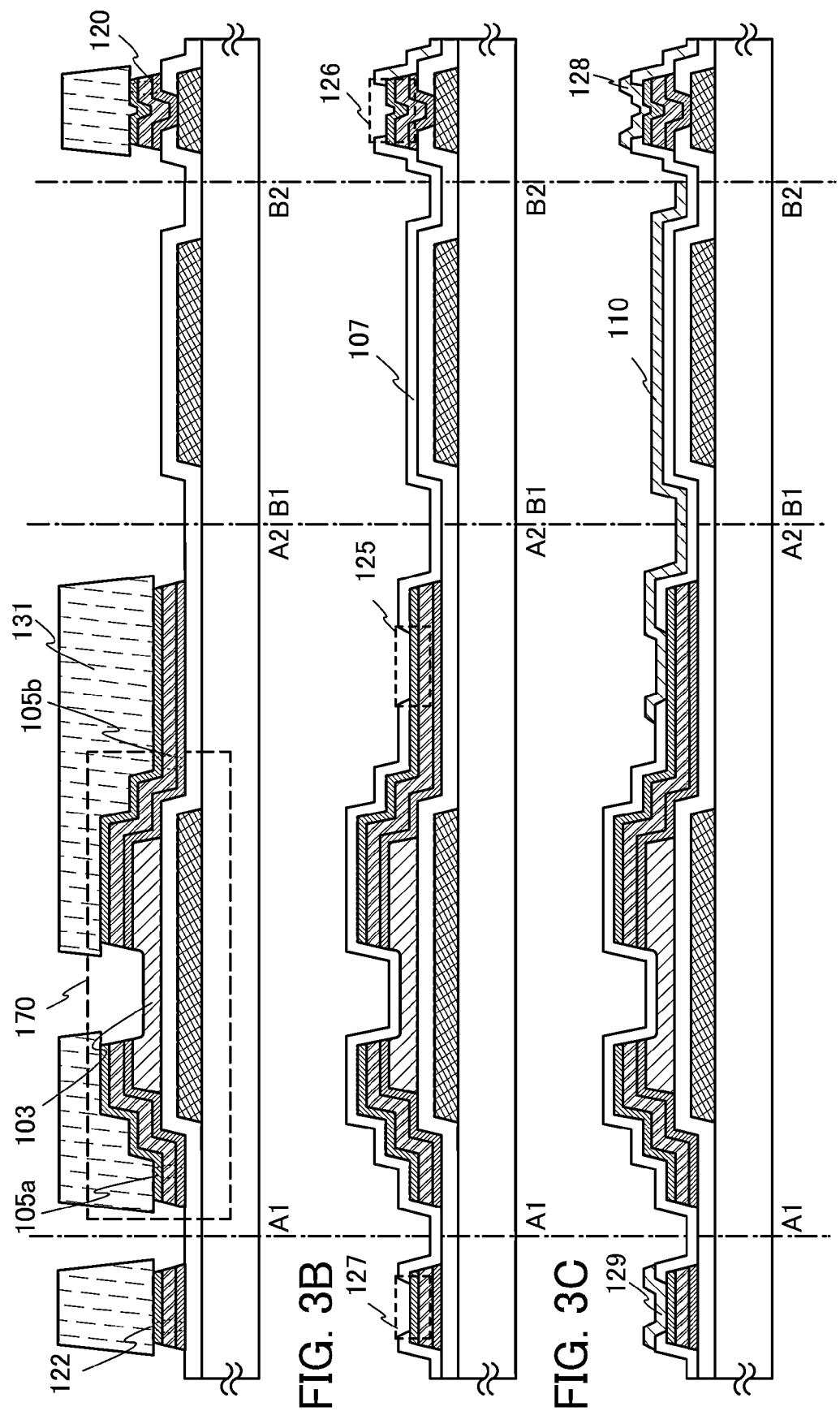

FIG. 8A1
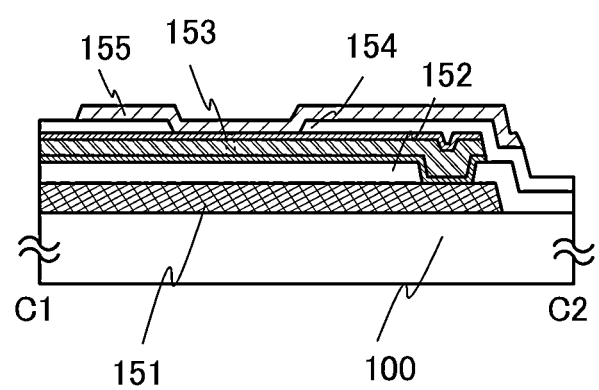
FIG. 8A2
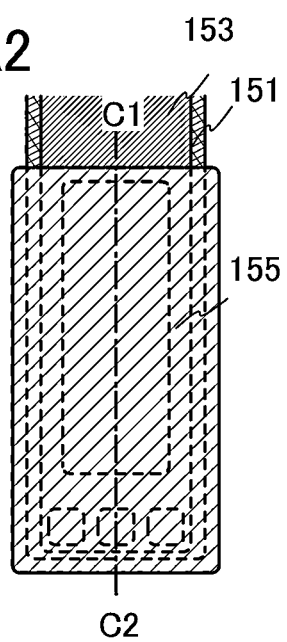
FIG. 8B1
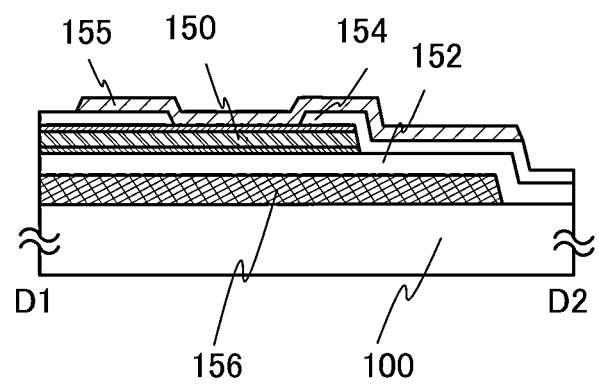
FIG. 8B2
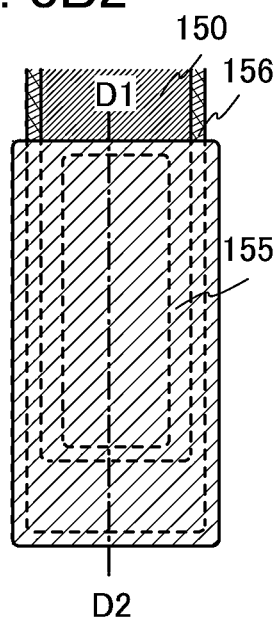

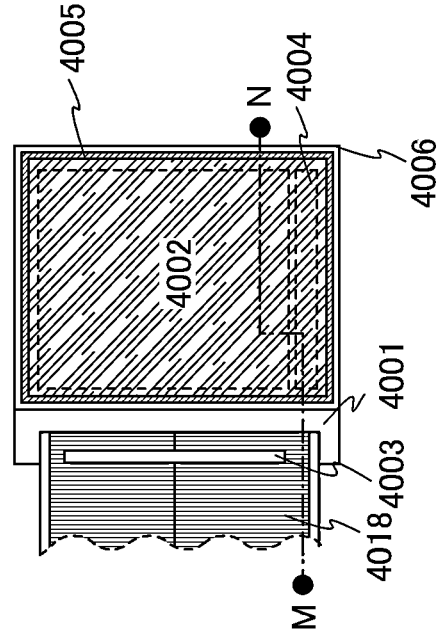
FIG. 15A1
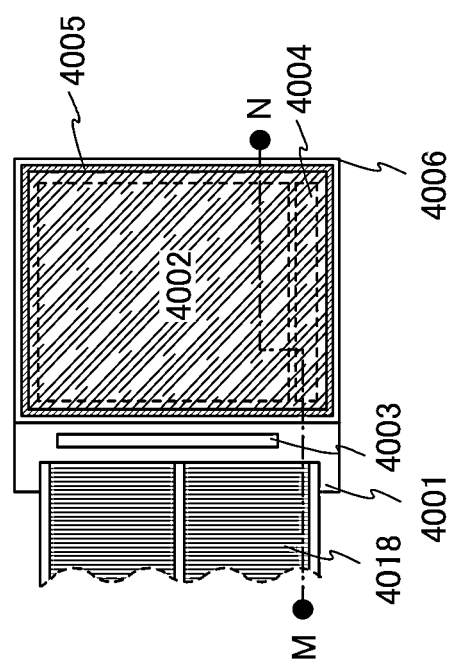
FIG. 15A2
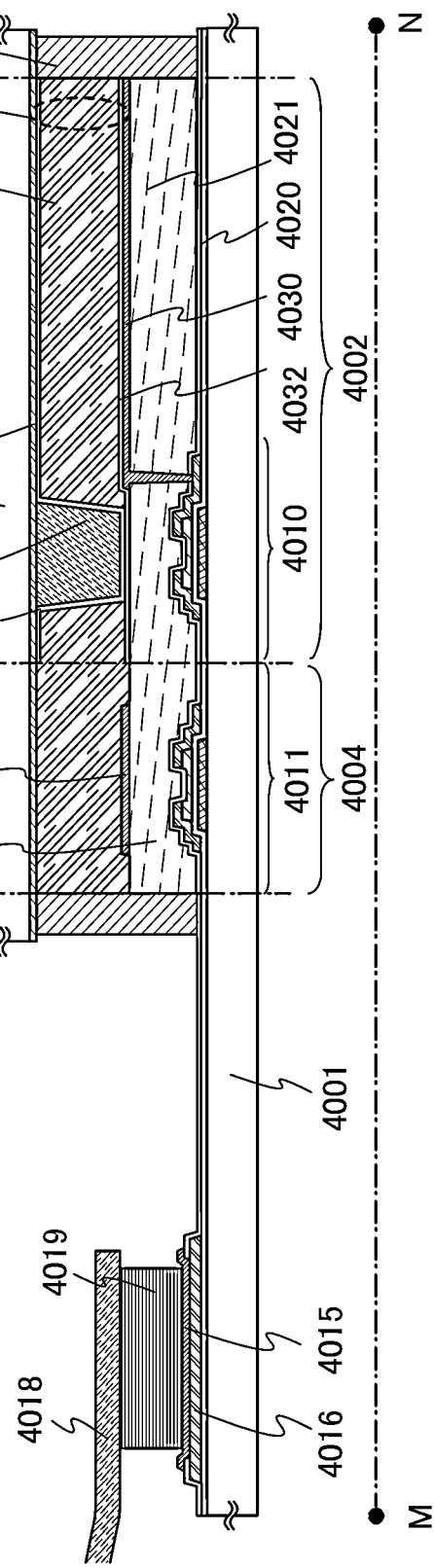
FIG. 15B

Crystal Structure of $In_2Ga_2ZnO_7$

Crystal Structure of InGaZnO₄

METHOD FOR MANUFACTURING SEMICONDUCTOR DEVICE COMPRISING FORMING OXIDE SEMICONDUCTOR BY SPUTTERING

TECHNICAL FIELD

The present invention relates to a thin film transistor which includes an oxide semiconductor layer, and a semiconductor device which includes the thin film transistor and a manufacturing method thereof.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices, and thin film transistors are rapidly developed particularly as switching elements in image display devices. Various metal oxides are used for a variety of applications. Indium oxide is a well-known material and is used as a light-transmitting electrode material which is necessary for liquid crystal displays and the like.

Some metal oxides have semiconductor characteristics. The examples of such metal oxides having semiconductor characteristics include tungsten oxide, tin oxide, indium oxide, zinc oxide, and the like. Thin film transistors in which a channel formation region is formed using such a metal oxide having semiconductor characteristics are already known (Patent Documents 1 and 2).

REFERENCE

[Patent Document 1] Japanese Published Patent Application No. 2007-123861
[Patent Document 2] Japanese Published Patent Application No. 2007-96055

DISCLOSURE OF INVENTION

An object of an embodiment of the present invention is to provide a semiconductor device which includes an oxide semiconductor layer having a novel state.

In addition, another object of an embodiment of the present invention is to provide a thin film transistor having favorable electric characteristics and high reliability and a semiconductor device which includes the thin film transistor as a switching element.

An In—Ga—Zn—O-based film having a novel state (incubation state) that shows an electron diffraction pattern, which is different from a conventionally known amorphous state and from a conventionally known crystal state, is formed. The In—Ga—Zn—O-based film having an incubation state is used for a channel formation region of a thin film transistor. When the In—Ga—Zn—O-based film having an incubation state is used as a channel formation region of a thin film transistor, an on-state current and electron field-effect mobility can be improved and further reliability can be improved.

One embodiment of the present invention disclosed in this specification is a semiconductor device provided with a thin film transistor, a channel formation region of which is partly or entirely formed using an In—Ga—Zn—O-based film having an incubation state in analysis of an electron diffraction pattern, where the incubation state of the In—Ga—Zn—O-based film is neither a crystal system where a spot appears clearly nor an amorphous system where a halo shape pattern appears.

With the above structure, at least one of the above problems can be resolved.

As the oxide semiconductor layer, a thin film expressed by $InMO_3(ZnO)_m$ (m>0) is formed, and a thin film transistor which includes the thin film as an oxide semiconductor layer is manufactured. Note that M represents one or more of metal elements selected from Ga, Fe, Ni, Mn, and Co. For example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M. In this specification, among the oxide semiconductor layers whose composition formulas are represented by $InMO_3(ZnO)_m$ (m>0), an oxide semiconductor which contains Ga as M is referred to as an In—Ga—Zn—O-based oxide semiconductor, and a thin film of the In—Ga—Zn—O-based oxide semiconductor is also referred to as an In—Ga—Zn—O-based film.

The oxide semiconductor layer is not particularly limited to the In—Ga—Zn—O-based metal oxide as long as being a metal oxide having an incubation state that shows an electron diffraction pattern, which is different from a conventionally known amorphous state and from a conventionally known crystal state. As other examples of the metal oxide applicable to the oxide semiconductor layer, any of the following metal oxides can be employed: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; or a Zn—O-based metal oxide. Silicon oxide may be contained in the oxide semiconductor layer formed using any of the above metal oxides.

As an embodiment of the present invention, a bottom gate thin film transistor is used. Specifically, the bottom gate thin film transistor is a channel etched type where each of a source electrode layer and a drain electrode layer overlaps with an oxide semiconductor layer over oxide semiconductor layer and where part of the oxide semiconductor layer is etched above a channel formation region of the oxide semiconductor layer.

According to another embodiment of the present invention, a semiconductor device includes a gate electrode layer over an insulating surface; a first insulating layer over the gate electrode layer; an oxide semiconductor layer including indium, gallium, and zinc over the first insulating layer; a source electrode layer or a drain electrode layer over the oxide semiconductor layer; and a second insulating layer which covers the source electrode layer or the drain electrode layer, where the oxide semiconductor layer includes a region whose thickness is smaller than a thickness of a region which overlaps with the source electrode layer or the drain electrode layer, where the second insulating layer is in contact with the region of the oxide semiconductor layer whose thickness is smaller, and where the region of the oxide semiconductor layer whose thickness is smaller has an incubation state in analysis of an electron diffraction pattern, which is neither a crystal system where a spot appears clearly nor an amorphous system where a halo shape pattern appears.

In this specification, the incubation state is neither a crystal system where a spot appears clearly nor an amorphous system where a halo shape pattern appears in analysis of an electron diffraction pattern but is a state where a spot thereof does not appear clearly but periodically in analysis of an electron diffraction pattern. In addition, the incubation state corresponds to the following states: a state of an oxide semiconductor film which is obtained using a target for film formation of, for example, in a molar ratio, $In_2O_3:Ga_2O_3:ZnO=1:1:1$ or $In_2O_3:Ga_2O_3:ZnO=1:1:2$, which is formed with a sputtering method; and a state just before reaching to a stable crystal structure such as a crystal structure of $InGaZnO_4$ (see FIG. 35) or a crystal structure of $In_2Ga_2ZnO_7$ (see FIG. 34), i.e. a precursor which is partly bonded but which has not yet become a crystal having a stable molecular structure to be one crystal.

FIG. 28, FIG. 29, FIG. 30, and FIG. 31 show examples of a pattern which shows an incubation state. FIG. 26 shows a photograph of a cross section of a channel etched thin film transistor, a channel formation region of which is formed using an In—Ga—Zn—O-based oxide semiconductor layer having an incubation state, which is observed with a high-resolution transmission electron microscope (TEM: "H9000-NAR" manufactured by Hitachi, Ltd.). FIG. 27 shows a high magnification photograph (four million-fold magnification) of an interface between an oxide semiconductor layer and an oxide insulating layer in contact thereover, which is observed with a scanning transmission electron microscopy (STEM: "HD-2700" manufactured by Hitachi, Ltd.) at an acceleration voltage of 200 kV.

In addition, FIG. 32 shows an example of a pattern of a crystal system where a spot appears clearly in analysis of an electron diffraction pattern as a comparative example. When known lattice constants are compared in the electron diffraction pattern of FIG. 32, a crystal structure thereof corresponds to $In_2Ga_2ZnO_7$ shown in FIG. 34. FIG. 34 is a schematic view of a crystal structure, where reference numeral 201 denotes a site of an In atom in a plane ab; 202, an In atom; 203, either a Ga atom or a Zn atom; and 204, an oxygen atom.

Moreover, FIG. 33 shows a pattern of an amorphous system where a halo shape pattern appears in analysis of an electron diffraction pattern as another comparative example.

The patterns that each show an incubation state in FIG. 28, FIG. 29, FIG. 30, and FIG. 31 are different from the patterns in FIG. 32 and FIG. 33.

In the above structure, the gate electrode layer, the source electrode layer, and the drain electrode layer of the thin film transistor are formed using a film containing a metal element selected from aluminum, copper, molybdenum, titanium, chromium, tantalum, tungsten, neodymium, and scandium as its main component or an alloy film containing any of these metal elements. Each of the source electrode layer and the drain electrode layer is not limited to a single layer containing the above-described element and may be a stack of two or more layers.

A light-transmitting oxide conductive layer of indium oxide, an indium oxide-tin oxide alloy, an indium oxide-zinc oxide alloy, zinc oxide, zinc aluminum oxide, zinc aluminum oxynitride, zinc gallium oxide, or the like is used for the source electrode layer, the drain electrode layer, and the gate electrode layer, so that a light-transmitting property in a pixel portion can be improved and an aperture ratio can be increased.

Moreover, a display device can be formed using a driver circuit portion and a pixel portion which are each formed over one substrate using a transistor which is an embodiment of the present invention, and an EL element, a liquid crystal element, an electrophoretic element, or the like.

Since a thin film transistor is easily broken due to static electricity or the like, a protective circuit for protecting a thin film transistor of a pixel portion is preferably provided on a gate line or a source line over the same substrate. The protective circuit is preferably formed using a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

In this specification, a semiconductor device generally means a device which can function by utilizing semiconductor characteristics, and an electrooptic device, a semiconductor circuit, and electronic device are all semiconductor devices.

Note that the term "successive film formation" in this specification means that during a series of a first film formation step with a sputtering method to a second film formation step with a sputtering method, an atmosphere in which a substrate to be processed is disposed is not contaminated by a contaminant atmosphere such as air, and is constantly controlled to be vacuum or an inert gas atmosphere (a nitrogen atmosphere or a rare gas atmosphere). By the successive film formation, film formation can be performed while preventing moisture or the like from being attached again to the substrate to be processed which has been cleaned.

Performing the series of the first film formation step to the second film formation step in the same chamber is within the scope of the successive formation in this specification.

In addition, the following is also within the scope of the successive treatment in this specification: in the case where the series of the first film formation step to the second film formation step is performed in different chambers, the substrate is transferred after the first film formation step to another chamber without exposure to air and subjected to the second film formation.

Note that the case where there is a substrate transfer step, an alignment step, a slow cooling step, a step of heating or cooling a substrate so that the temperature of the substrate is suitable to the second film formation step, or the like between the first film formation step and the second film formation step is also in the range of the successive treatment in this specification.

However, the case where there is a step in which liquid is used, such as a cleaning step, wet etching, or resist formation, between the first film formation step and the second film formation step is not in the scope of the successive film formation in this specification.

Generation of parasitic channel can be suppressed when an oxide semiconductor layer is partly or entirely formed in an incubation state. A thin film transistor with high on-off ratio can be obtained, so that a thin film transistor having favorable dynamic characteristics can be manufactured.

BRIEF DESCRIPTION OF DRAWINGS

FIGS. 2A to 2C are cross-sectional process views illustrating an embodiment of the present invention.

FIGS. 3A to 3C are cross-sectional process views illustrating the embodiment of the present invention.

FIGS. 8A1 and 8B1 are cross-sectional views and FIGS. 8A2 and 8B2 are plan views illustrating the embodiment of the present invention.

FIGS. 15A1 and 15A2 are plan views and FIG. 15B is a cross-sectional view illustrating an embodiment of the present invention.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments.

Embodiment 1

In this embodiment, a structure of a thin film transistor will be described with reference to FIG. 1.

Figure 1:
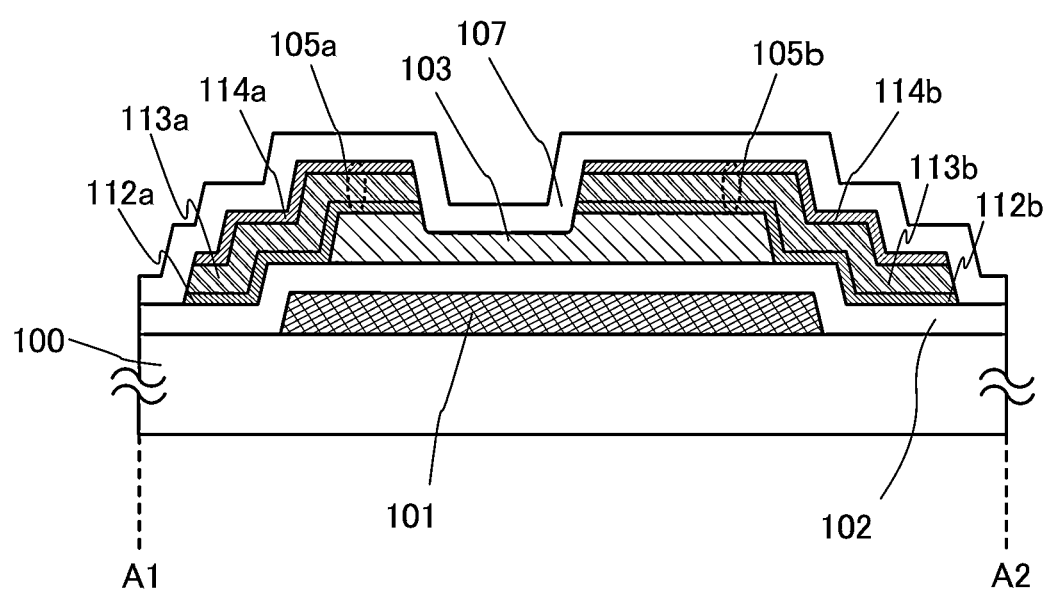
FIG. 1 is a cross-sectional view illustrating an embodiment of the present invention.
Figure 4A:
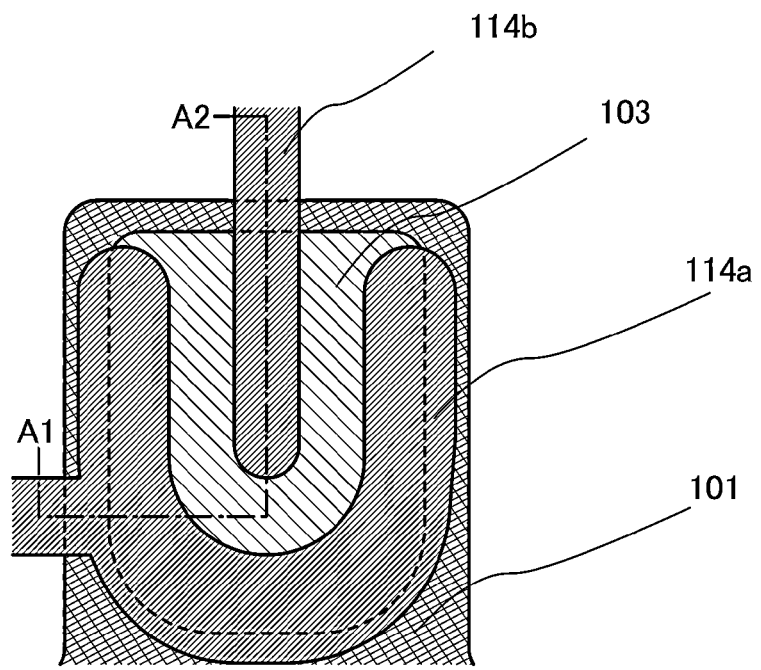
FIGS. 4A and 4B are plan views illustrating the embodiment of the present invention.

A channel etched thin film transistor of this embodiment is illustrated in FIG. 1. FIG. 1 is a cross-sectional view and FIG. 4A is a plan view thereof. FIG. 1 is a cross-sectional view taken along line A1-A2 in FIG. 4A.

The thin film transistor illustrated in FIG. 1 includes, over a substrate 100, a gate electrode layer 101, a gate insulating layer 102, an oxide semiconductor layer 103, a source electrode layer 105a, and a drain electrode layer 105b. Further, an oxide insulating layer 107 is provided over the oxide semiconductor layer 103, the source electrode layer 105a, and the drain electrode layer 105b.

Note that the thin film transistor illustrated in FIG. 1 has a structure in which part of the oxide semiconductor layer is etched between the source electrode layer 105a and the drain electrode layer 105b.

The gate electrode layer 101 can be formed to have a single-layer structure or a stacked structure using a metal material such as aluminum, copper, molybdenum, titanium, chromium, tantalum, tungsten, neodymium, or scandium; an alloy material containing any of these metal materials as its main component; or a nitride containing any of these metal materials. It is effective to form the gate electrode layer 101 with the use of a low-resistance metal material such as aluminum or copper. In addition, the low-resistance metal material is preferably used in combination with a refractory metal material because it has disadvantages such as low heat resistance and a tendency to be corroded. As the refractory metal material, molybdenum, titanium, chromium, tantalum, tungsten, neodymium, scandium, or the like can be used.

Further, in order to increase the aperture ratio of a pixel portion, a light-transmitting oxide conductive layer of indium oxide, an indium oxide-tin oxide alloy, an indium oxide-zinc oxide alloy, zinc oxide, zinc aluminum oxide, zinc aluminum oxynitride, zinc gallium oxide, or the like may be used as the gate electrode layer 101.

As the gate insulating layer 102, a single-layer film or a stacked film of any of silicon oxide, silicon oxynitride, silicon nitride oxide, silicon nitride, aluminum oxide, tantalum oxide, and the like formed with a CVD method, a sputtering method, or the like can be used.

The oxide semiconductor layer 103 is formed using an In—Ga—Zn—O-based film which contains In, Ga, and Zn and has a structure expressed by, for example, $InMO_3(ZnO)_m$ (m>0). Note that M represents one or more of metal elements selected from gallium (Ga), iron (Fe), nickel (Ni), manganese (Mn), and cobalt (Co). For example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M.

The oxide semiconductor layer 103 is formed with a sputtering method to a thickness of 10 nm to 300 nm inclusive, preferably, 20 nm to 100 nm inclusive. Note that since part of the oxide semiconductor layer 103 is etched between the source electrode layer 105a and the drain electrode layer 105b as illustrated in FIG. 1, the oxide semiconductor layer includes a region whose thickness is smaller than the thickness of a region which overlaps with the source electrode layer 105a or the drain electrode layer 105b.

Although the oxide semiconductor layer 103 is preferably in an incubation state at a film formation stage, heat treatment may be performed if necessary. In the case where the oxide semiconductor layer is amorphous with a number of dangling bonds at the film formation stage, a heating step for dehydration or dehydrogenation is performed so that adjacent dangling bonds are bonded to each other to have an incubation state. For example, the dehydration or dehydrogenation is preferably performed at high temperature with a short time with an RTA method or the like. In this specification, heat treatment in an atmosphere of an inert gas such as nitrogen or a rare gas is referred to as heat treatment for dehydration or dehydrogenation. In this specification, "dehydrogenation" does not indicate elimination of only $H_2$ by heat treatment. For convenience, elimination of H, OH, and the like is referred to as "dehydration or dehydrogenation".

The source electrode layer 105a has a three-layer structure of a first conductive layer 112a, a second conductive layer 113a, and a third conductive layer 114a while the drain electrode layer 105b has a three-layer structure of a first conductive layer 112b, a second conductive layer 113b, and a third conductive layer 114b. As each material of the conductive layers, the material similar to that of the above gate electrode layer 101 can be used.

Further, the light-transmitting oxide conductive layer is used for the source electrode layer 105a and the drain electrode layer 105b in a manner similar to that of the gate electrode layer 101, whereby light transmissivity of the pixel portion can be increased and the aperture ratio can also be increased.

Further, the oxide conductive layer may be formed between the oxide semiconductor layer 103 and each of the films containing any of the above metal materials as its main component, which are to be the source electrode layer 105a and drain electrode layer 105b, so that contact resistance can be reduced.

The oxide insulating layer 107 which functions as a channel protective layer is provided over the oxide semiconductor layer 103, the source electrode layer 105a, and the drain electrode layer 105b. The oxide insulating layer 107 is formed with a sputtering method using an inorganic insulating film, typically a silicon oxide film, a silicon nitride oxide film, an aluminum oxide film, an aluminum oxynitride film, or the like.

A metal oxide having an incubation state that shows an electron diffraction pattern, which is different from a conventionally known amorphous state and from a conventionally known crystal state, is used as a channel formation region, whereby a thin film transistor having high reliability and improved electric characteristics such as a high on-state current and high electron field-effect mobility can be provided.

Embodiment 2

In this embodiment, a manufacturing process of a display device which includes the channel etched thin film transistor described in Embodiment 1 will be described with reference to FIGS. 2A to 2C, FIGS. 3A to 3C, FIGS. 4A and 4B, FIG. 5, FIG. 6, FIG. 7, FIGS. 8A1, 8A2, 8B1, and 8B2, FIG. 9, and FIG. 10. FIGS. 2A to 2C and FIGS. 3A to 3C are cross-sectional views, and FIGS. 4A and 4B, FIG. 5, FIG. 6, and FIG. 7 are plan views. Line A1-A2 and line B1-B2 in each of FIGS. 4A and 4B, FIG. 5, FIG. 6, and FIG. 7 correspond to line A1-A2 and line B1-B2 in each of the cross-sectional views of FIGS. 2A to 2C and FIGS. 3A to 3C.

First, the substrate 100 is prepared. As the substrate 100, in addition to glass substrates formed with a fusion method or a float method, for example, plastic substrates having heat resistance sufficient to withstand a process temperature of this manufacturing process can be used. Alternatively, a metal substrate such as a stainless steel alloy substrate which is provided with an insulating film over the surface may be used.

In the case where a glass substrate is used and the temperature at which the heat treatment is to be performed later is high, a glass substrate whose strain point is greater than or equal to 730° C. is preferably used. As a material of the glass substrate, a glass material such as aluminosilicate glass, aluminoborosilicate glass, or barium borosilicate glass is used, for example. Note that more practical glass with heat resistance can be obtained when it contains a larger amount of barium oxide (BaO) than diboron trioxide ($B_2O_3$). Therefore, a glass substrate containing a larger amount of BaO than $B_2O_3$ is preferably used.

Note that, instead of the glass substrate described above, a substrate formed using an insulator such as a ceramic substrate, a quartz substrate, or a sapphire substrate may be used as the glass substrate 100. Alternatively, crystallized glass or the like may be used.

Further, an insulating film may be provided as a base film over the substrate 100. The base film may be formed to have a single-layer structure or a stacked structure of any of a silicon oxide film, a silicon nitride film, a silicon oxynitride film, and a silicon nitride oxide film with a CVD method, a sputtering method, or the like. In the case where a substrate containing mobile ions of sodium or the like, such as a glass substrate, is used as the substrate 100, a film containing nitrogen such as a silicon nitride film or a silicon nitride oxide film is used as the base film, whereby the mobile ions can be prevented from entering the oxide semiconductor layer.

Figure 4B:
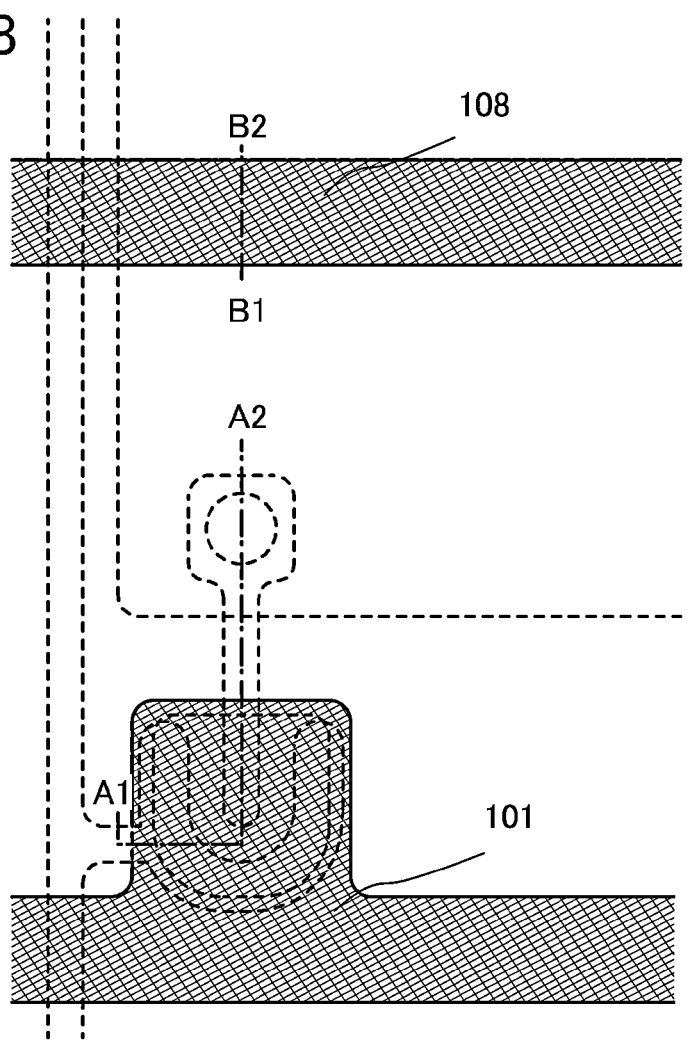

Next, a conductive film to be a gate wiring including the gate electrode layer 101, a capacitor wiring 108, and a first terminal 121 is formed over the entire surface of the substrate 100 with a sputtering method or a vacuum evaporation method. Next, after the conductive film is formed over the entire surface of the substrate 100, a resist mask is formed through a first photolithography step. Unnecessary portions are removed by etching to form wirings and an electrode (the gate wiring including the gate electrode layer 101, the capacitor wiring 108, and the first terminal 121). At this time, etching is preferably performed so that at least an end portion of the gate electrode layer 101 can be tapered in order to prevent disconnection. FIG. 2A is a cross-sectional view at this stage. Note that FIG. 4B is a plan view at this stage.

The gate wiring including the gate electrode layer 101, the capacitor wiring 108, and the first terminal 121 of a gate wiring terminal portion can be formed to have a single-layer structure or a stacked structure using a metal material such as aluminum, copper, molybdenum, titanium, chromium, tantalum, tungsten, neodymium, or scandium; an alloy material containing any of these metal materials as its main component; or a nitride containing any of these metal materials. Although it is effective to form the gate electrode layer 101 with the use of a low-resistance metal material such as aluminum or copper, the low-resistance metal material is preferably used in combination with a refractory metal material because it has disadvantages such as low heat resistance and a tendency to be corroded. As the refractory metal material, molybdenum, titanium, chromium, tantalum, tungsten, neodymium, scandium, or the like can be used.

For example, as a stacked structure of the gate electrode layer 101, the following structure is preferable: a two-layer stacked structure in which a molybdenum layer is stacked over an aluminum layer; a two-layer stacked structure in which a molybdenum layer is stacked over a copper layer; a two-layer stacked structure in which a titanium nitride layer or a tantalum nitride layer is stacked over a copper layer; or a two-layer stacked structure in which a titanium nitride layer and a molybdenum layer are stacked. As a three-layer structure, the following structure is preferable: a stacked structure which includes aluminum, an aluminum-silicon alloy, an aluminum-titanium alloy, or an aluminum-neodymium alloy in a middle layer and any of tungsten, tungsten nitride, titanium nitride, and titanium in a top layer and a bottom layer.

At that time, a light-transmitting oxide conductive layer is used for part of the electrode layer and the wiring layer to increase the aperture ratio. For example, indium oxide, an indium oxide-tin oxide alloy, an indium oxide-zinc oxide alloy, zinc oxide, zinc aluminum oxide, zinc aluminum oxynitride, zinc gallium oxide, or the like can be used as the oxide conductive layer.

Next, the gate insulating layer 102 is formed to cover the entire surface of the gate electrode layer 101. The gate insulating layer 102 is formed to a thickness of 50 nm to 250 nm inclusive with a CVD method, a sputtering method, or the like.

For example, a silicon oxide film is formed with a sputtering apparatus to a thickness of 100 nm as the gate insulating layer 102. Needless to say, the gate insulating layer 102 is not limited to such a silicon oxide film, and other insulating films such as a silicon oxynitride film, a silicon nitride oxide film, a silicon nitride film, an aluminum oxide film, or a tantalum oxide film may be used to form a single-layer structure or a stacked structure.

In addition, before an oxide semiconductor film for forming the island-shaped oxide semiconductor layer 103 is formed, reverse sputtering by which plasma is generated by introducing an argon gas is preferably performed, whereby dust attached to a surface of the gate insulating layer 102 is removed. The reverse sputtering refers to a method in which, without application of a voltage to a target side, an RF power source is used for application of a voltage to a substrate side under an argon atmosphere and plasma is generated in the vicinity of the substrate to modify a surface. Note that a nitrogen atmosphere, a helium atmosphere, or the like may be used instead of an argon atmosphere. Alternatively, an argon atmosphere to which oxygen, $N_2O$, or the like is added may be used. Further alternatively, an argon atmosphere to which $Cl_2$, $CF_4$, or the like is added may be used. After the reverse sputtering, the oxide semiconductor film is formed without being exposed to air, whereby dust or moisture can be prevented from attaching to an interface between the oxide semiconductor layer 103 and the gate insulating layer 102.

An oxide semiconductor film with a thickness of 5 nm to 200 nm inclusive, preferably, 10 nm to 40 nm inclusive is formed over the gate insulating layer 102.

As the oxide semiconductor film, any of the following oxide semiconductor films can be applied: an In—Ga—Zn—O-based oxide semiconductor film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; an Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. Alternatively, the oxide semiconductor film can be formed with a sputtering method under an atmosphere of a rare gas (typically, argon), an oxygen atmosphere, or an atmosphere of a rare gas (typically, argon) and oxygen.

Here, film formation is performed using a target for forming an oxide semiconductor including In, Ga, and Zn (in a molar ratio, $In_2O_3:Ga_2O_3:ZnO=1:1:1$ or $In_2O_3:Ga_2O_3:ZnO=1:1:2$) under the following conditions: the distance between a substrate and a target is 100 mm, the pressure is 0.6 Pa, the direct-current (DC) power supply is 0.5 kW, and the atmosphere is oxygen (the flow rate of oxygen is 100%). Note that a pulse direct current (DC) power source is preferable because powder substances (also referred to as particles or dust) generated in film formation can be reduced and the film thickness can be uniform. In this embodiment, as the oxide semiconductor film, an In—Ga—Zn—O-based film having a thickness of 30 nm is formed with a sputtering method using the target for forming an In—Ga—Zn—O-based oxide semiconductor.

It is preferable that the relative density of the target for forming the oxide semiconductor is greater than or equal to 80%, more preferably, greater than or equal to 95%, further preferably, greater than or equal to 99.9%. The impurity concentration of the oxide semiconductor film which is formed using the target having high relative density can be reduced, and thus a thin film transistor having high electric characteristics and high reliability can be obtained.

Examples of a sputtering method include an RF sputtering method in which a high-frequency power source is used for a sputtering power source, a DC sputtering method in which a DC power source is used, and a pulsed DC sputtering method in which a bias is applied in a pulsed manner. An RF sputtering method is mainly used in the case where an insulating layer is formed, and a DC sputtering method is mainly used in the case where a metal film is formed.

In addition, there is also a multi-source sputtering apparatus in which a plurality of targets of different materials can be set. With the multi-source sputtering apparatus, films of different materials can also be formed to be stacked in the same chamber, or a plurality of kinds of materials can also be formed by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a film formation method by sputtering, there are also a reactive sputtering method in which a target substance and a sputtering gas component are chemically reacted with each other during film formation to form a thin compound film thereof, and a bias sputtering method in which a voltage is also applied to a substrate during film formation.

In addition, the substrate may be heated at a temperature of 400° C. to 700° C. inclusive by light or a heater during the film formation with a sputtering method. The damage due to sputtering is repaired at the same time as the film formation by heating during the film formation.

Preheat treatment is preferably performed so as to remove moisture or hydrogen remaining on an inner wall of the sputtering apparatus, on a surface of the target, or in a target material, before the oxide semiconductor film is formed. As the preheat treatment, a method in which the inside of the film deposition chamber is heated from 200° C. to 600° C. under reduced pressure, a method in which introduction and exhaust of nitrogen or an inert gas are repeated while the inside of the film deposition chamber is heated, and the like can be given. After the preheat treatment, the substrate or the sputtering apparatus is cooled, and then the oxide semiconductor film is formed without exposure to air. In this case, not water but oil or the like is preferably used as a coolant for the target. Although a certain level of effect can be obtained when introduction and exhaust of nitrogen are repeated without heating, it is more preferable to perform the treatment with the inside of the film deposition chamber heated.

It is preferable to remove moisture or the like remaining in the sputtering apparatus with the use of a cryopump before, during, or after the oxide semiconductor film is formed.

Figure 5:
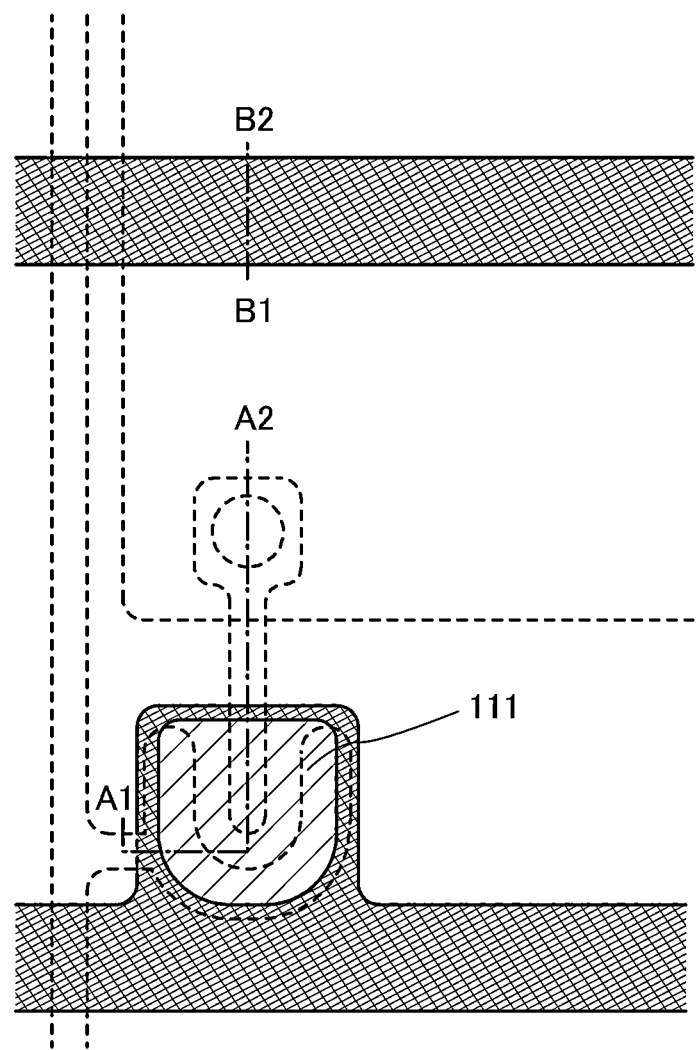
FIG. 5 is a plan view illustrating the embodiment of the present invention.

Next, a resist mask is formed through a second photolithography step. Then, the In—Ga—Zn—O-based film is etched. In the etching, organic acid such as citric acid or oxalic acid can be used for an etchant. Here, the In—Ga—Zn—O-based film is etched by wet etching with the use of ITO-07N (manufactured by Kanto Chemical Co., Inc.) to remove an unnecessary portion. Thus, the In—Ga—Zn—O-based film is processed to have an island shape, whereby an oxide semiconductor layer 111 is formed. The end portions of the oxide semiconductor layer 111 are etched to be tapered, whereby disconnection of a wiring due to a step shape can be prevented. Note that etching here is not limited to wet etching and dry etching may be performed. FIG. 2B is a cross-sectional view at this stage. Note that FIG. 5 is a plan view at this stage.

Then, if necessary, the oxide semiconductor layer is dehydrated or dehydrogenated. First heat treatment for the dehydration or dehydrogenation can be performed through rapid thermal annealing (RTA) treatment with the use of a high-temperature gas (an inert gas such as nitrogen or a rare gas) or light at a temperature of 500° C. to 750° C. inclusive (or a temperature lower than or equal to the strain point of the glass substrate) for approximately 1 minute to 10 minutes inclusive, preferably, at 650° C. for approximately 3 minutes to 6 minutes inclusive. With an RTA method, dehydration or dehydrogenation can be performed in a short time; therefore, treatment can be performed even at a temperature higher than the strain point of the glass substrate. Note that the timing of the first heat treatment is not limited to this timing after formation of the oxide semiconductor layer 111 and may be performed plural times, for example, before and after a photolithography step or formation of the oxide semiconductor layer 111.

Note that in the first heat treatment, it is preferable that water, hydrogen, and the like be not contained in the atmosphere. Alternatively, the purity of the inert gas which is introduced into a heat treatment apparatus is preferably set greater than or equal to 6N (99.9999%) or more, preferably, greater than or equal to 7N (99.99999%) (that is, the impurity concentration is less than or equal to 1 ppm, preferably, less than or equal to 0.1 ppm).

Next, a resist mask is formed through a third photolithography step. Unnecessary portions are removed by etching to form a contact hole which reaches the wiring or the electrode layer which is formed from the same material as the gate electrode layer 101. The contact hole is provided for direct connection with a conductive film to be formed later. For example, a contact hole is formed when a thin film transistor in which a gate electrode layer is in direct contact with a source electrode layer or a drain electrode layer in a driver circuit portion is formed, or when a terminal which is electrically connected to a gate wiring of a terminal portion is formed.

Next, a first conductive layer 112, a second conductive layer 113, and a third conductive layer 114 are formed over the oxide semiconductor layer 111 and the gate insulating layer 102 with a sputtering method or a vacuum evaporation method with the use of a metal material. FIG. 2C is a cross-sectional view at this stage.

As each material of the first conductive layer 112, the second conductive layer 113, and the third conductive layer 114, the material similar to that of the above gate electrode layer 101 can be used.

Here, the first conductive layer 112 and the third conductive layer 114 are formed using titanium that is a heat-resistant conductive material, and the second conductive layer 113 is formed using an aluminum alloy containing neodymium. Such a structure can reduce generation of a hillock and utilize a low resistance property of aluminum. Although a three-layer structure of the first conductive layer 112, the second conductive layer 113, and the third conductive layer 114 is used in this embodiment, an embodiment of the present invention is not limited thereto. Thus, a single-layer structure, a two-layer structure, or a stacked structure of four or more layers may be employed. For example, a single-layer structure of a titanium film or a single-layer structure of an aluminum film containing silicon may be employed.

Figure 6:
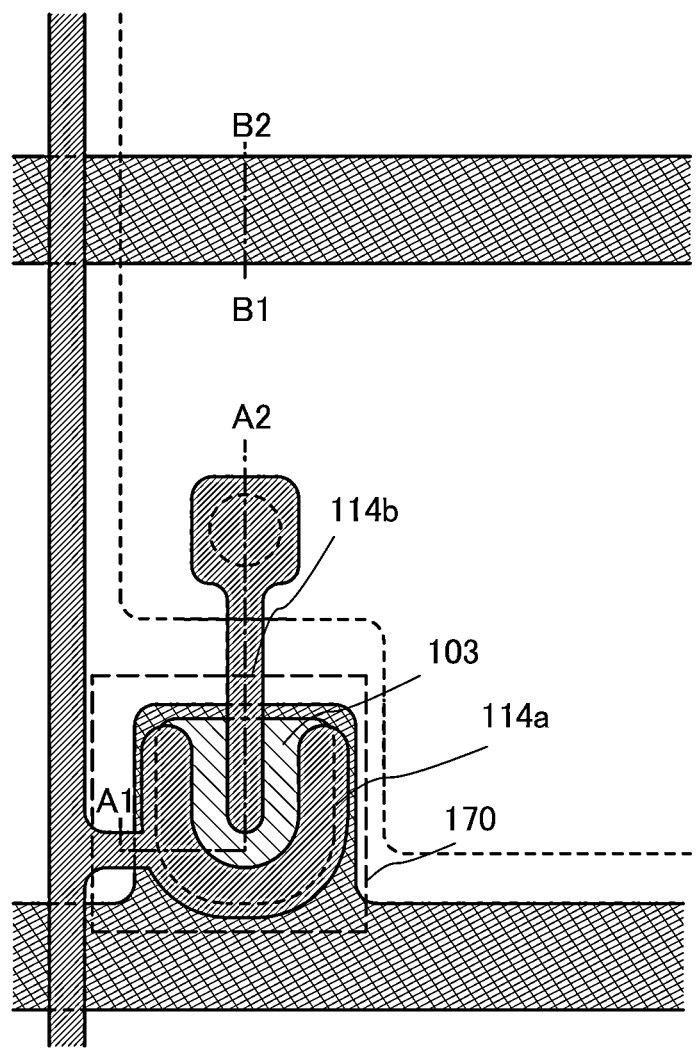
FIG. 6 is a plan view illustrating the embodiment of the present invention.

Next, a resist mask 131 is formed through a fourth photolithography step. Unnecessary portions are removed by etching to form the source electrode layer 105a, the drain electrode layer 105b, the oxide semiconductor layer 103, and a connection electrode 120. Wet etching or dry etching is employed as an etching method at this time. For example, in the case where the first conductive layer 112 and the third conductive layer 114 are formed using titanium and the second conductive layer 113 is formed using an aluminum alloy containing neodymium, wet etching can be performed by using a hydrogen peroxide solution or heated hydrochloric acid as etchant. In this etching step, part of the oxide semiconductor layer 103 is etched; thus, the oxide semiconductor layer 103 includes a region between the source electrode layer 105a and the drain electrode layer 105b, whose thickness is smaller than the thickness of a region which overlaps with the source electrode layer 105a or the drain electrode layer 105b. FIG. 3A is a cross-sectional view at this stage. Note that FIG. 6 is a plan view at this stage.

In addition, the first conductive layer 112, the second conductive layer 113, the third conductive layer 114, and the oxide semiconductor layer 103 can be etched in one step by etching in which a hydrogen peroxide solution or heated hydrochloric acid is used as etchant; therefore, an end portion of the source electrode layer 105a or the drain electrode layer 105b is aligned with an end portion of the oxide semiconductor layer 103, and a continuous structure can be formed. Moreover, wet etching allows the layers to be etched isotropically, so that the end portions of the source electrode layer 105a and the drain electrode layer 105b are recessed from the resist mask 131. Through the above-described steps, a thin film transistor 170 in which the oxide semiconductor layer 103 is used as a channel formation region can be manufactured.

Further, the light-transmitting oxide conductive layer is used for the source electrode layer 105a and the drain electrode layer 105b in a manner similar to that of the gate electrode layer 101, whereby light transmissivity of the pixel portion can be increased and the aperture ratio can also be increased.

In the fourth photolithography step, a second terminal 122 made from the same material as the source electrode layer 105a and the drain electrode layer 105b is left in a source wiring terminal portion. Note that the second terminal 122 is electrically connected to a source wiring (a source wiring including the source electrode layer 105a and the drain electrode layer 105b).

In the terminal portion, the connection electrode 120 is directly connected to the first terminal 121 in the terminal portion through the contact hole formed in the gate insulating film. Note that although not illustrated here, the source wiring or a drain wiring, and a gate electrode of the thin film transistor in the driver circuit are directly connected through the same steps as the steps described above.

Further, with the use of a resist mask having regions with plural thicknesses (typically, two different thicknesses) which is formed using a multi-tone mask, the number of resist masks can be reduced, resulting in simplified process and lower costs.

Next, the resist mask 131 is removed, and the oxide insulating layer 107 which covers the thin film transistor 170 is formed. The oxide insulating layer 107 can be formed using an oxide insulating layer such as a silicon oxide film, a silicon oxynitride film, an aluminum oxide film, a tantalum oxide film, or the like with a sputtering method or the like.

The oxide insulating layer 107 can be formed as appropriate with a sputtering method or the like, i.e. a method with which impurities such as moisture or hydrogen are not mixed into the oxide insulating layer. In this embodiment, a silicon oxide film is formed as the oxide insulating film with a sputtering method. The substrate temperature in film formation may be set from room temperature to 300° C. inclusive and, in this embodiment, is set 100° C. In order to prevent entry of an impurity such as water or hydrogen in the film formation, it is preferable to perform pre-baking under reduced pressure at a temperature of 150° C. to 350° C. inclusive for 2 minutes to 10 minutes inclusive before the film formation, to form an oxide insulating layer without exposure to the air. The formation of the silicon oxide film with a sputtering method can be performed in an atmosphere of a rare gas (typically, argon), an oxygen atmosphere, or an atmosphere of a rare gas (typically, argon) and oxygen. Moreover, a silicon oxide target or a silicon target can be used as a target. For example, with the use of a silicon target, a silicon oxide film can be formed with a sputtering method under an atmosphere of oxygen and a rare gas. The oxide insulating layer which is formed in contact with the oxide semiconductor layer in a region whose resistance is reduced is formed using an inorganic insulating film that does not contain impurities such as moisture, a hydrogen ion, and OW and blocks entry of such impurities from the outside.

In this embodiment, the film formation is performed with a pulsed DC sputtering method using a columnar polycrystalline boron-doped silicon target which has a purity of 6N (the resistivity is 0.01 Ωcm), in which the distance between the substrate and the target (T-S distance) is 89 mm, the pressure is 0.4 Pa, the direct-current (DC) power source is 6 kW, and the atmosphere is oxygen (the oxygen flow rate is 100%). The film thickness thereof is set 300 nm.

Next, if necessary, second heat treatment (preferably at a temperature of 200° C. to 400° C. inclusive, for example, at a temperature of 250° C. to 350° C. inclusive) is performed under an inert gas atmosphere. For example, the second heat treatment is performed under a nitrogen atmosphere at 250° C. for one hour. Alternatively, RTA treatment may be performed at high temperature for a short time as in the first heat treatment.

Next, a resist mask is formed through a fifth photolithography step. Then, the oxide insulating layer 107 is etched to form a contact hole 125 which reaches the drain electrode layer 105b. In addition, a contact hole 126 which reaches the connection electrode 120 and a contact hole 127 which reaches the second terminal 122 are also formed by this etching. FIG. 3B is a cross-sectional view at this stage.

Next, the resist mask is removed and then a light-transmitting conductive film is formed. The light-transmitting conductive film can be formed using a material such as indium oxide ($In_2O_3$) or an indium oxide-tin oxide ($In_2O_3$—$SnO_2$, abbreviated as ITO) alloy with a sputtering method, a vacuum evaporation method, or the like. Such a material is etched with a hydrochloric acid-based solution. However, since a residue is easily generated particularly in etching of ITO, an indium oxide-zinc oxide ($In_2O_3$—ZnO) alloy may be used in order to improve etching processability.

Next, a resist mask is formed through a sixth photolithography step. Unnecessary portions are removed by etching to form a pixel electrode layer 110.

In the sixth photolithography step, a storage capacitor is formed with the gate insulating layer 102 and the oxide insulating layer 107 in a capacitor portion, which are used as a dielectric, the capacitor wiring 108, and the pixel electrode layer 110.

In addition, in the sixth photolithography step, the first terminal 121 and the second terminal 122 are each covered with the resist mask, and conductive films 128 and 129 having light-transmitting properties are left in the terminal portions. The light-transmitting conductive films 128 and 129 serve as an electrode or a wiring connected to an FPC. The light-transmitting conductive film 128 formed over the connection electrode 120 which is directly connected to the first terminal 121 is a connection terminal electrode which functions as an input terminal of the gate wiring. The light-transmitting conductive film 129 formed over the second terminal 122 is a connection terminal electrode which functions as an input terminal of the source wiring.

Figure 7:
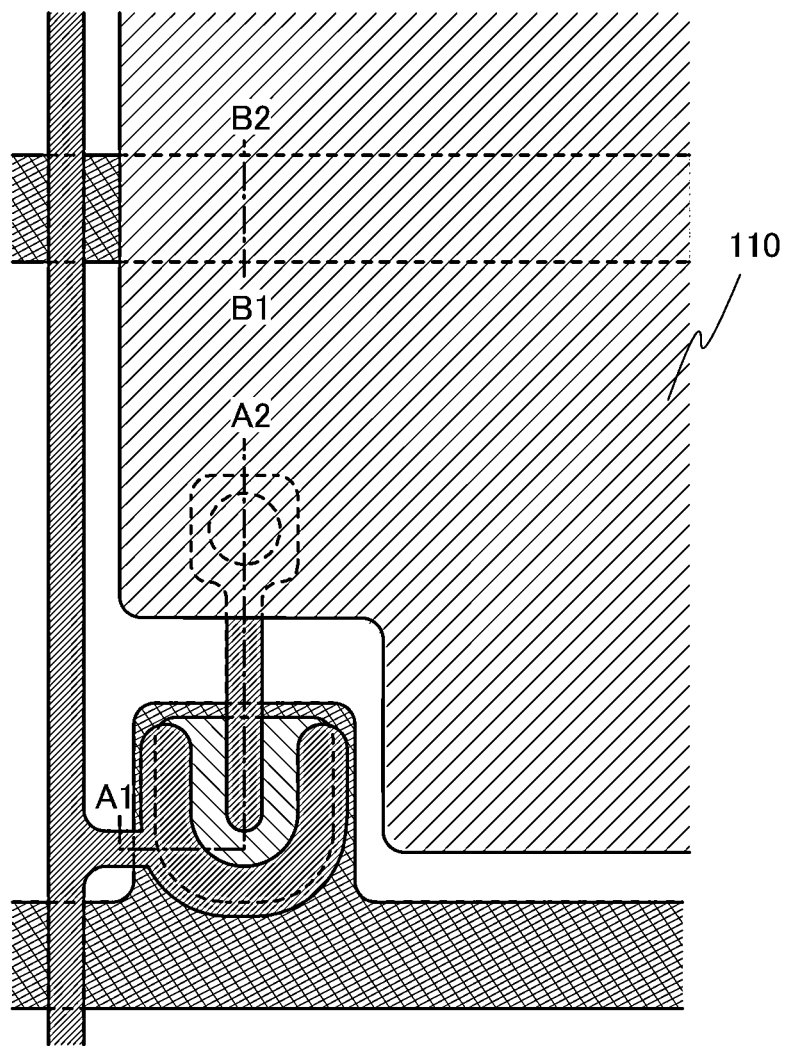
FIG. 7 is a plan view illustrating the embodiment of the present invention.

Next, the resist mask is removed. FIG. 3C is a cross-sectional view at this stage. Note that FIG. 7 is a plan view at this stage.

Further, FIGS. 8A1 and 8A2 are a cross-sectional view and a plan view of the gate wiring terminal portion at this stage, respectively. FIG. 8A1 is a cross-sectional view taken along line C1-C2 in FIG. 8A2. In FIG. 8A1, a light-transmitting conductive film 155 formed over a protective insulating film 154 and a connection electrode 153 is a connection terminal electrode which functions as an input terminal. Furthermore, in FIG. 8A1, in the gate wiring terminal portion, a first terminal 151 formed using the same material as the gate wiring and the connection electrode 153 formed using the same material as the source wiring are overlapped with each other with a gate insulating layer 152 interposed therebetween and are electrically connected. In addition, the connection electrode 153 and the light-transmitting conductive film 155 are in direct contact with each other through a contact hole provided in the protective insulating film 154 and are electrically connected.

Further, FIGS. 8B1 and 8B2 are a cross-sectional view and a plan view of the source wiring terminal portion, respectively. FIG. 8B1 is a cross-sectional view taken along line D1-D2 in FIG. 8B2. In FIG. 8B1, the light-transmitting conductive film 155 formed over the protective insulating film 154 and a second terminal 150 is a connection terminal electrode which functions as an input terminal. Furthermore, in FIG. 8B1, in the source wiring terminal portion, an electrode 156 formed using the same material as the gate wiring is located below and overlaps with the second terminal 150, which is electrically connected to the source wiring, with the gate insulating layer 152 interposed therebetween. The electrode 156 is not electrically connected to the second terminal 150, and a capacitor to prevent noise or static electricity can be formed if the potential of the electrode 156 is set to a potential different from that of the second terminal 150, such as floating, GND, or 0 V. Further, the second terminal 150 is electrically connected to the light-transmitting conductive film 155 with the protective insulating film 154 interposed therebetween.

A plurality of gate wirings, source wirings, and capacitor wirings are provided depending on the pixel density. Also in the terminal portions, the first terminal at the same potential as the gate wiring, the second terminal at the same potential as the source wiring, a third terminal at the same potential as the capacitor wiring, and the like are each arranged in plurality. The number of each of the terminals may be any number, and the number of the terminals may be determined by a practitioner as appropriate.

Figure 26:
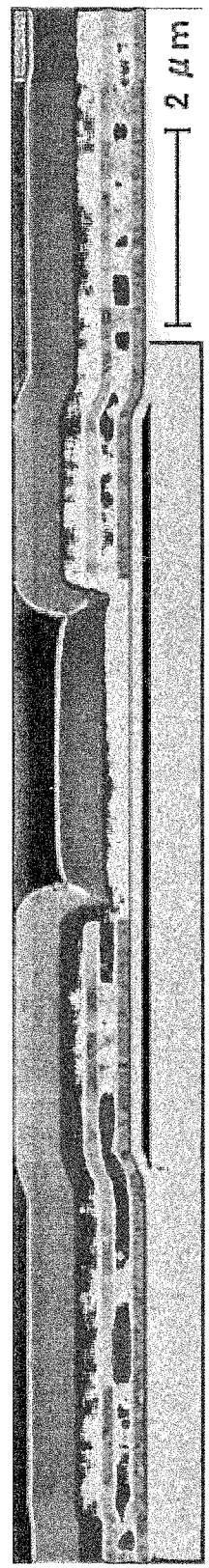
FIG. 26 is a cross-sectional TEM photograph of a thin film transistor.
Figure 27:
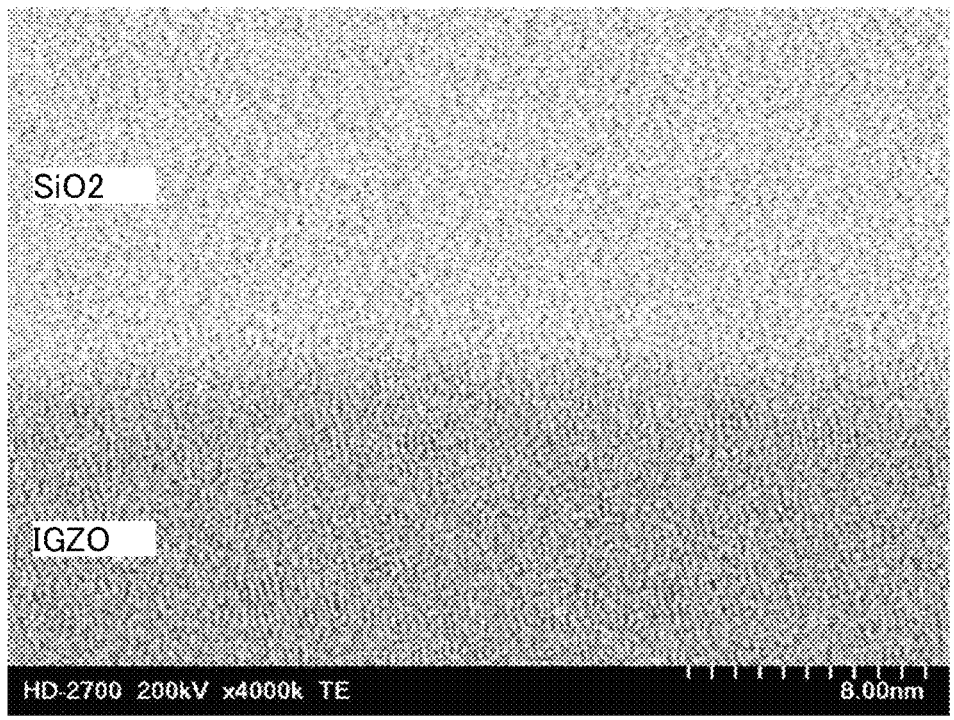
FIG. 27 is a cross-sectional TEM photograph of an interface between an oxide semiconductor layer and an oxide insulating layer of a thin film transistor, and vicinity thereof.
Figure 28:
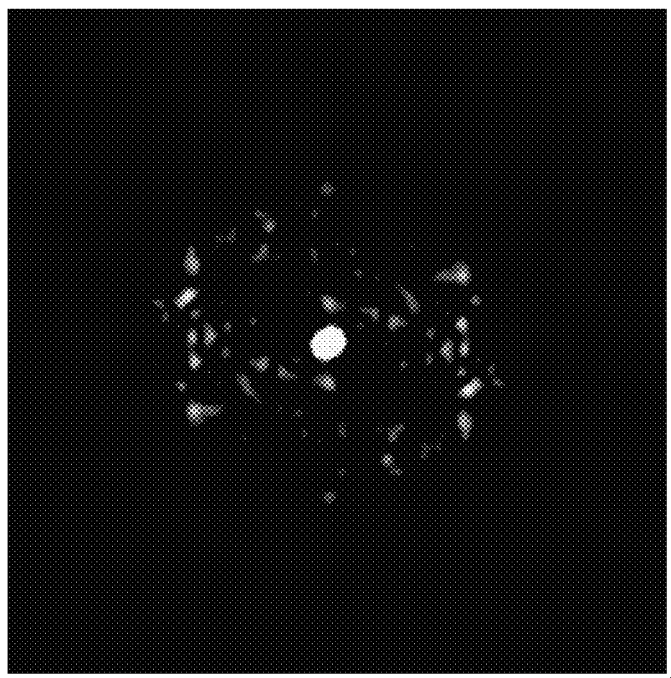
FIG. 28 shows an electron diffraction pattern of an embodiment of the present invention.
Figure 29:
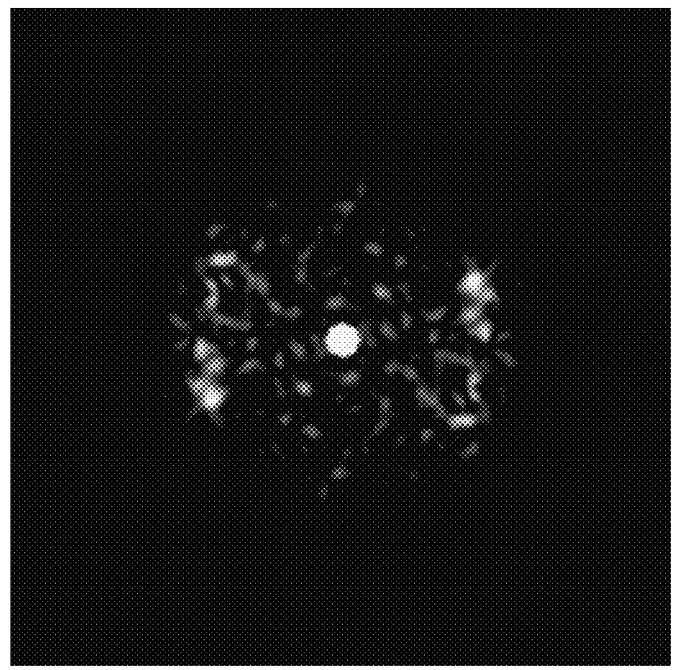
FIG. 29 shows an electron diffraction pattern of an embodiment of the present invention.
Figure 30:
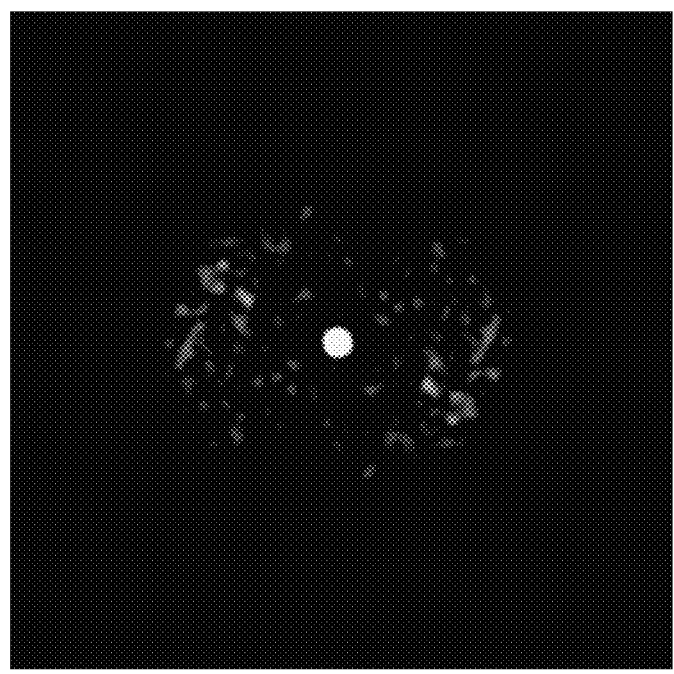
FIG. 30 shows an electron diffraction pattern of an embodiment of the present invention.
Figure 31:
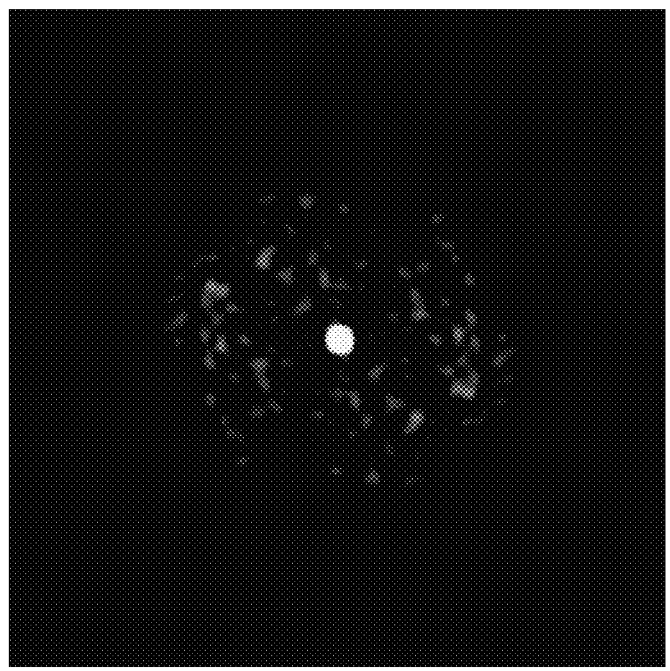
FIG. 31 shows an electron diffraction pattern of an embodiment of the present invention.
Figure 32:
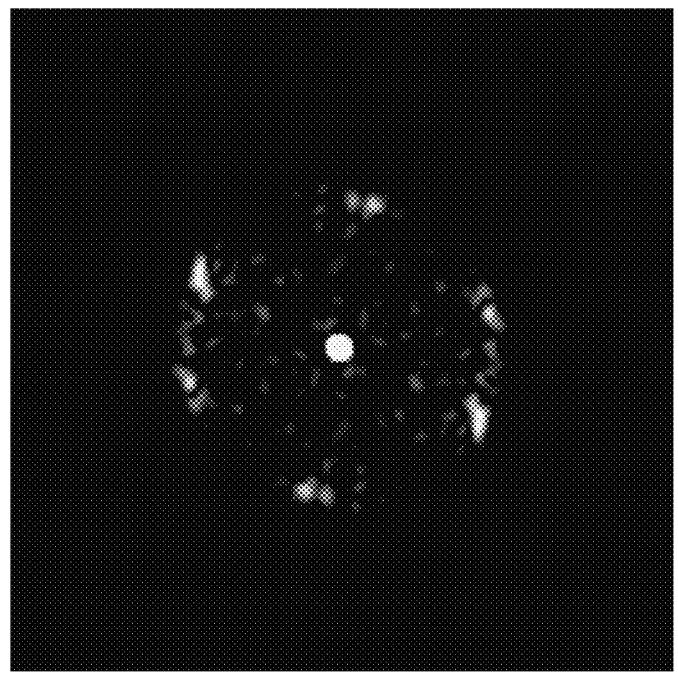
FIG. 32 shows an electron diffraction pattern of a comparative example.
Figure 33:
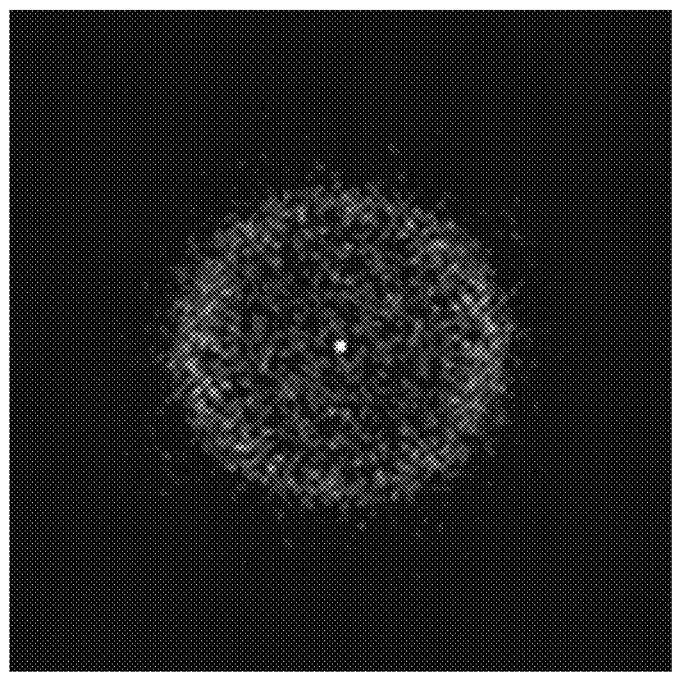
FIG. 33 shows an electron diffraction pattern of a comparative example.
Figure 34:
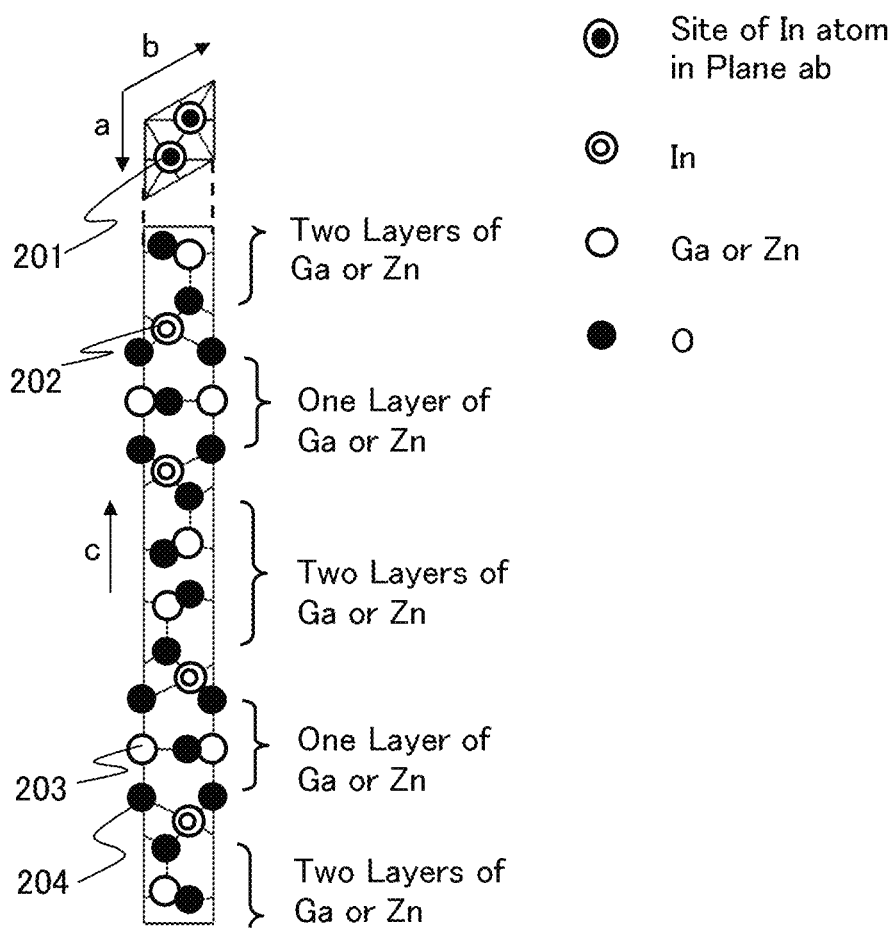
FIG. 34 is a view illustrating a comparative example of a crystal structure of an oxide semiconductor.
Figure 35:
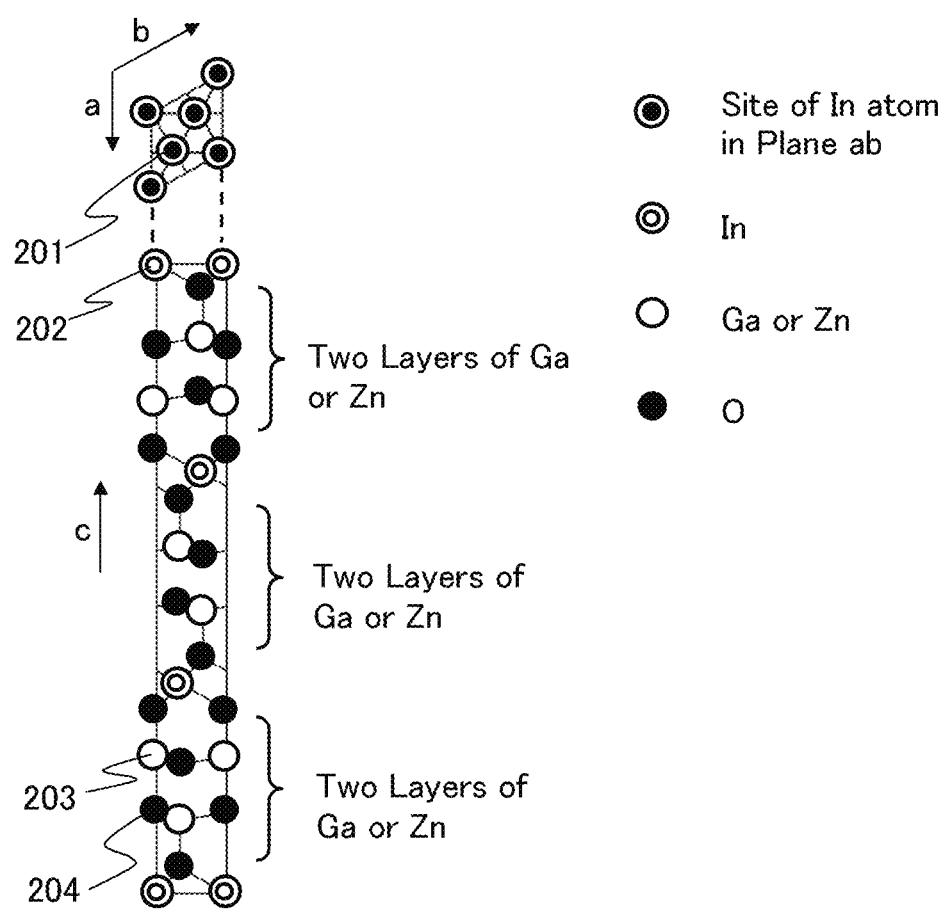
FIG. 35 is a view illustrating a comparative example of a crystal structure of an oxide semiconductor.

Through these six photolithography steps, the channel etched thin film transistor 170 and the storage capacitor portion can be completed using the six photomasks. In addition, the channel etched thin film transistor 170 is a thin film transistor, a channel formation region of which is formed using an In—Ga—Zn—O-based oxide semiconductor layer having an incubation state, and the photograph of the cross section which is observed with a high-resolution transmission electron microscope corresponds to FIG. 26.

Then, the thin film transistor 170 and the storage capacitor portion are arranged in a matrix corresponding to pixels so that a pixel portion is formed; thus, one substrate for manufacturing an active matrix display device can be formed. In this specification, such a substrate is referred to as an active matrix substrate for convenience.

In the case where an active matrix liquid crystal display device is manufactured, an active matrix substrate and a counter substrate provided with a counter electrode are fixed to each other with a liquid crystal layer interposed therebetween. Note that a common electrode electrically connected to the counter electrode on the counter substrate is provided over the active matrix substrate, and a fourth terminal electrically connected to the common electrode is provided in a terminal portion. The fourth terminal is provided so that the common electrode is set to a fixed potential such as GND or 0 V.

Figure 9:
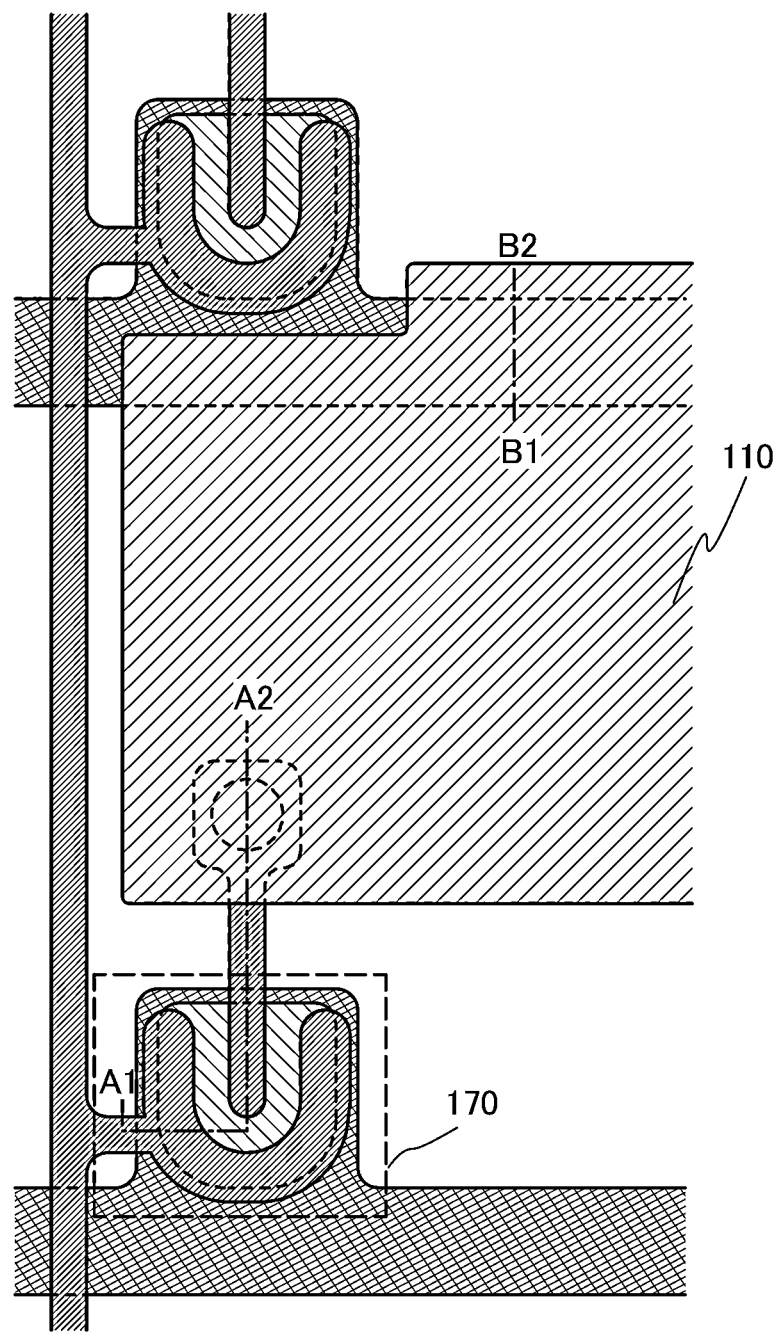
FIG. 9 is a plan view illustrating an embodiment of the present invention.

Further, this embodiment is not limited to the pixel structure in FIG. 7, and an example of a plan view different from FIG. 7 is illustrated in FIG. 9. FIG. 9 illustrates an example in which a capacitor wiring is not provided and a storage capacitor is formed with a pixel electrode and a gate wiring of an adjacent pixel which overlap with each other with a protective insulating film and a gate insulating layer interposed therebetween. In this case, the capacitor wiring and the third terminal connected to the capacitor wiring can be omitted. Note that in FIG. 9, the same portions as those in FIG. 7 are denoted by the same reference numerals.

Figure 10:
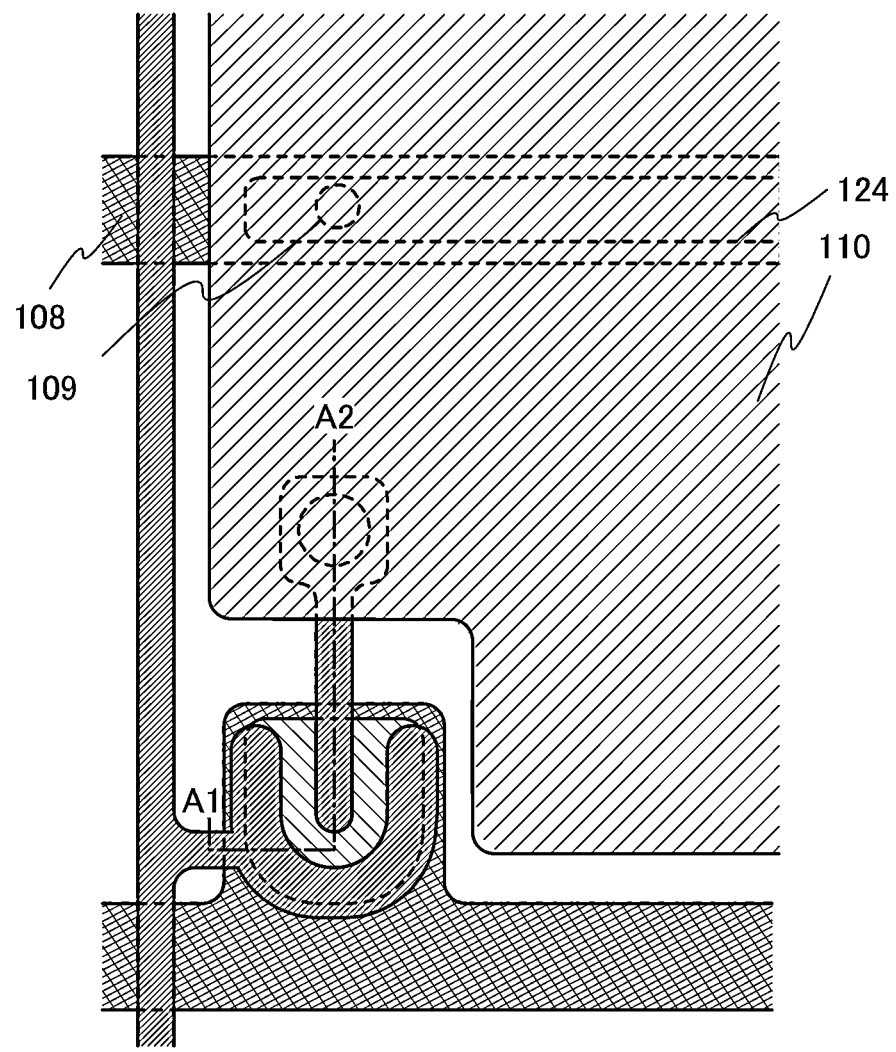
FIG. 10 is a plan view illustrating an embodiment of the present invention.

Further, another example of a pixel structure different from the pixel structure in FIG. 7 is illustrated in FIG. 10. In FIG. 10, a capacitor electrode layer 124 formed using the same material as the source electrode layer 105a and the drain electrode layer 105b is formed over the gate insulating layer 102, and the pixel electrode layer 110 is electrically connected to the capacitor electrode layer 124 through a contact hole 109 provided in the oxide insulating layer 107. In the pixel structure of FIG. 10, a storage capacitor is formed with the gate insulating layer 102 in the capacitor portion, which is used as a dielectric, the capacitor electrode layer 124, and the capacitor wiring 108.

In an active matrix liquid crystal display device, pixel electrodes arranged in a matrix are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which a vertical synchronizing frequency is 1.5 times or more, preferably, 2 times or more as high as a usual vertical synchronizing frequency, whereby the moving-image characteristics are improved.

Further alternatively, in order to improve the moving-image characteristics of a liquid crystal display device, a driving method may be employed in which a plurality of LEDs (light-emitting diodes) or a plurality of EL light sources are used to form a planar light source as a backlight, and each light source of the planar light source is independently driven in a pulsed manner in one frame period. As the planar light source, three or more kinds of LEDs may be used, or an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

These driving methods are combined, whereby the display characteristics of a liquid crystal display device, such as moving-image characteristics, can be improved as compared to those of conventional liquid crystal display devices.

In the n-channel transistor obtained in this embodiment, an In—Ga—Zn—O-based film having an incubation state is used for a channel formation region and has good dynamic characteristics. Thus, these driving methods can be applied in combination with the n-channel transistor of this embodiment.

When a light-emitting display device is manufactured, one electrode (also referred to as a cathode) of an organic light-emitting element is set to a low power source potential such as GND or 0 V; therefore, a terminal portion is provided with a fourth terminal which is provided to set the cathode to a low power source potential such as GND or 0 V. In addition, when a light-emitting display device is manufactured, a power supply line is provided in addition to a source wiring and a gate wiring. Therefore, the terminal portion is provided with a fifth terminal electrically connected to the power supply line.

Through the above-described steps, a thin film transistor having favorable electric characteristics and high reliability and a display device which includes the thin film transistor can be provided.

Note that the structure shown in this embodiment can be combined with the structure shown in Embodiment 1 as appropriate.

Embodiment 3

In this embodiment, an example will be described below in which at least part of a driver circuit portion and a thin film transistor to be disposed in a pixel portion are formed over one substrate.

The thin film transistor to be disposed in the pixel portion is formed according to Embodiment 1 or 2. Further, since the thin film transistor described in Embodiment 1 or 2 is an n-channel TFT, part of a driver circuit that can be formed using an n-channel TFT among driver circuits is formed over the same substrate as the thin film transistor of the pixel portion.

Figure 11A:
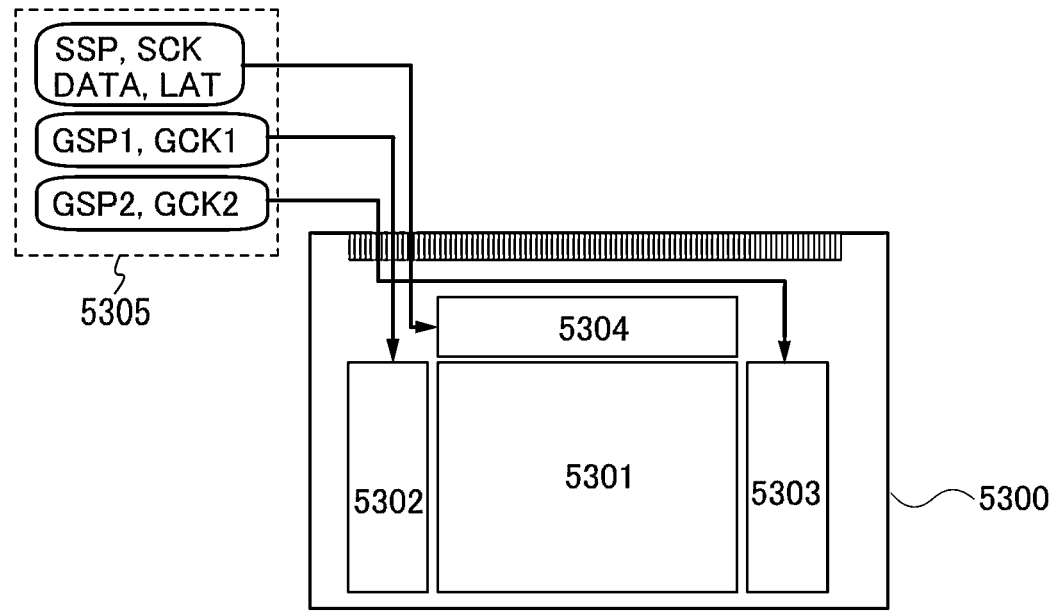
FIGS. 11A and 11B are each a block diagram of a semiconductor device.

FIG. 11A illustrates an example of a block diagram of an active matrix display device. Over a substrate 5300 in the display device, a pixel portion 5301, a first scan-line driver circuit 5302, a second scan-line driver circuit 5303, and a signal-line driver circuit 5304 are provided. In the pixel portion 5301, a plurality of signal lines which are extended from the signal-line driver circuit 5304 are provided, and a plurality of scan lines which are extended from the first scan-line driver circuit 5302 and the second scan-line driver circuit 5303 are provided. Note that in cross regions of the scan lines and the signal lines, pixels each having a display element are arranged in a matrix. Further, the substrate 5300 in the display device is connected to a timing control circuit 5305 (also referred to as a controller or a controller IC) through a connection portion such as a flexible printed circuit (FPC).

In FIG. 11A, the first scan-line driver circuit 5302, the second scan-line driver circuit 5303, and the signal-line driver circuit 5304 are provided over the same substrate 5300 as the pixel portion 5301. Accordingly, the number of components of a driver circuit and the like which are provided outside is reduced, whereby reduction in cost can be achieved. Further, if the driver circuit is provided outside the substrate 5300, wirings would need to be extended and the number of connections of wirings would be increased, but by providing the driver circuit over the substrate 5300, the number of connections of the wirings can be reduced. Accordingly, improvement in reliability and yield can be achieved.

Note that the timing control circuit 5305 supplies, for example, a first scan-line driver circuit start signal (GSP1) (a start signal is also referred to as a start pulse) and a scan-line driver circuit clock signal (GCK1) to the first scan-line driver circuit 5302. The timing control circuit 5305 supplies, for example, a second scan-line driver circuit start signal (GSP2) and a scan-line driver circuit clock signal (GCK2) to the second scan-line driver circuit 5303. The timing control circuit 5305 supplies a signal-line driver circuit start signal (SSP), a signal-line driver circuit clock signal (SCK), video signal data (DATA) (also simply referred to as a video signal), and a latch signal (LAT) to the signal-line driver circuit 5304. Note that each clock signal may be a plurality of clock signals with shifted phases or may be supplied together with an inverted clock signal (CKB) obtained by inverting the clock signal. Note that one of the first scan-line driver circuit 5302 and the second scan-line driver circuit 5303 can be omitted.

Figure 11B:
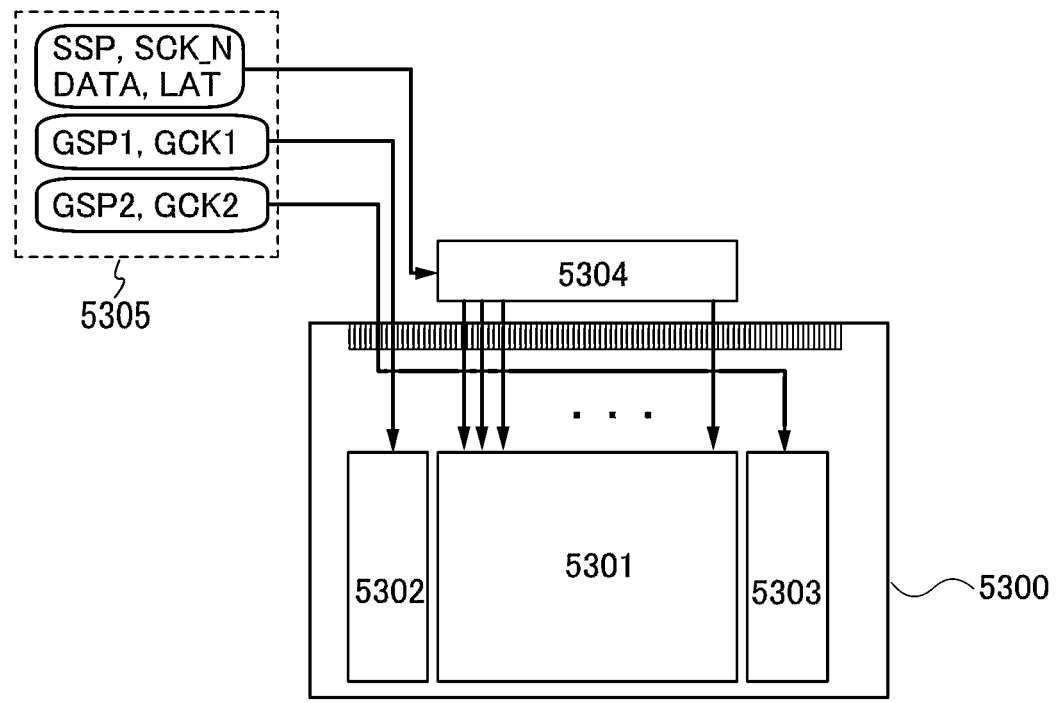

FIG. 11B illustrates a structure in which circuits with low driving frequency (e.g., the first scan-line driver circuit 5302 and the second scan-line driver circuit 5303) are formed over the same substrate 5300 as the pixel portion 5301, and the signal-line driver circuit 5304 is formed over a substrate which is different from the substrate 5300 over which the pixel portion 5301 is formed. With this structure, the driver circuits formed over the substrate 5300 can be formed by using thin film transistors with lower field-effect mobility as compared to that of a transistor formed using a single crystal semiconductor. Accordingly, an increase in the size of the display device, reduction in the number of steps, reduction in cost, improvement in yield, and the like can be achieved.

Figure 12A:
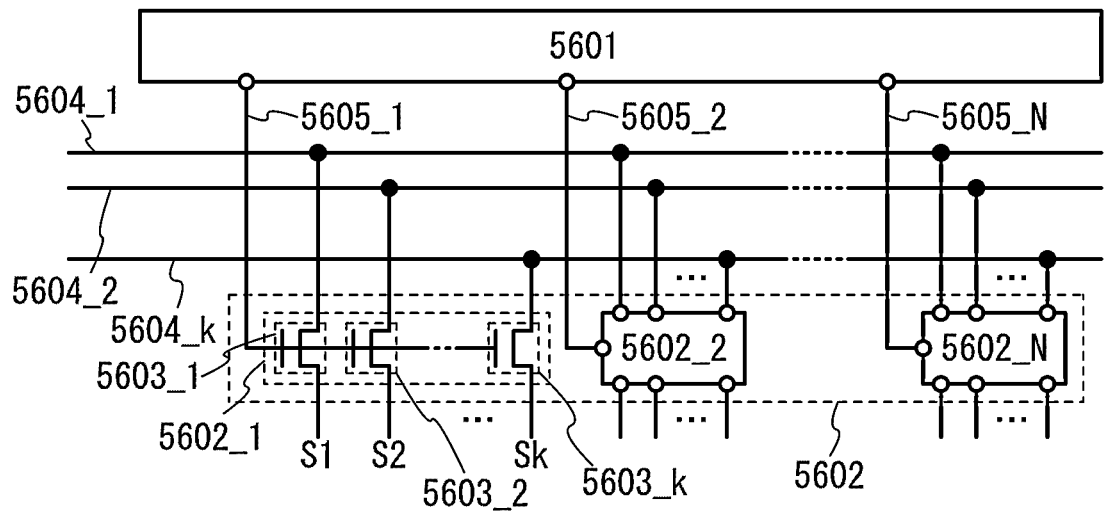
FIGS. 12A and 12B illustrate a circuit diagram and a timing chart of a signal-line driver circuit, respectively.
Figure 12B:
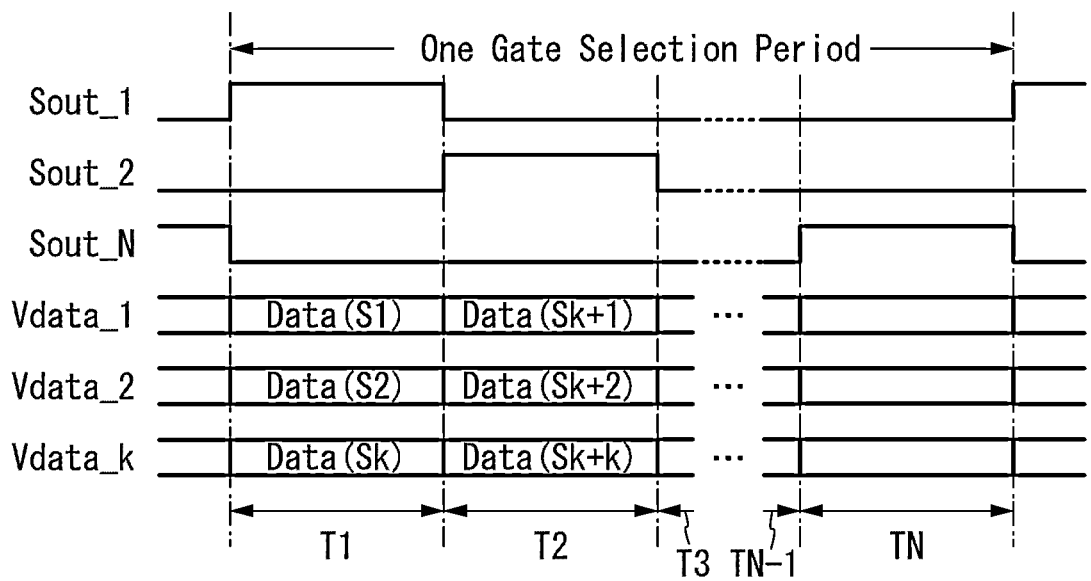

The thin film transistor described in Embodiment 1 or 2 is an n-channel TFT. In FIGS. 12A and 12B, an example of a structure and operation of a signal-line driver circuit which is formed using the n-channel TFT will be described.

The signal-line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). An example in which the thin film transistors 5603_1 to 5603_k are n-channel TFTs will be described.

A connection relation of the signal-line driver circuit will be described by using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of sequentially outputting an H level signal (also referred to as an H signal or a high power source potential level) to the wirings 5605_1 to 5605_N and sequentially selecting the switching circuits 5602_1 to 5602_N.

The switching circuit 5602_1 has a function of controlling a conducting state between the wirings 5604_1 to 5604_k and the signal lines S1 to Sk (a conducting state between the first terminal and the second terminal), i.e. a function of controlling whether or not to supply potentials of the wirings 5604_1 to 5604_k to the signal lines S1 to Sk. In this manner, the switching circuit 5602_1 functions as a selector. Further, the thin film transistors 5603_1 to 5603_k each have a function of controlling a conducting state between the wirings 5604_1 to 5604_k and the signal lines S1 to Sk, i.e. a function of controlling whether or not to supply the potentials of the wirings 5604_1 to 5604_k to the signal lines S1 to Sk. In this manner, each of the thin film transistors 5603_1 to 5603_k functions as a switch.

Note that video signal data (DATA) is inputted to each of the wirings 5604_1 to 5604_k. The video signal data (DATA) is an analog signal corresponding to image data or image signals in many cases.

Next, operation of the signal-line driver circuit in FIG. 12A will be described with reference to a timing chart in FIG. 12B. In FIG. 12B, an example of signals Sout_1 to Sout_N and signals Vdata_1 to Vdata_k is shown. The signals Sout_1 to Sout_N are examples of output signals of the shift register 5601, and the signals Vdata_1 to Vdata_k are examples of signals which are inputted to the wirings 5604_1 to 5604_k. Note that one operation period of the signal-line driver circuit corresponds to one gate selection period in a display device. For example, one gate selection period is divided into periods T1 to TN. The periods T1 to TN are periods for writing video signal data (DATA) to the pixels which belong to a selected row.

In the periods T1 to TN, the shift register 5601 sequentially outputs H level signals to the wirings 5605_1 to 5605_N. For example, in the period T1, the shift register 5601 outputs an H level signal to the wiring 5605_1. Then, the thin film transistors 5603_1 to 5603_k are turned on, so that the wirings 5604_1 to 5604_k and the signal lines S1 to Sk are brought into conduction. In this case, Data (S1) to Data (Sk) are inputted to the wirings 5604_1 to 5604_k, respectively. The Data (S1) to Data (Sk) are inputted to pixels in a selected row in a first to k-th columns through the thin film transistors 5603_1 to 5603_k, respectively. Thus, in the periods T1 to TN, video signal data (DATA) is sequentially written to the pixels in the selected row of every k columns.

By writing video signal data (DATA) to pixels of every plurality of columns, the number of video signal data (DATA) or the number of wirings can be reduced. Thus, the number of connections to an external circuit can be reduced. By writing video signals to pixels of every plurality of columns, writing time can be extended and insufficient of writing of video signals can be prevented.

Note that as the shift register 5601 and the switching circuit 5602, a circuit including the thin film transistor described in Embodiment 1 or 2 can be used. In that case, the shift register 5601 can be constituted by only unipolar transistors.

An embodiment of a shift register which is used for part of the scan-line driver circuit and/or the signal-line driver circuit is described with reference to FIGS. 13A to 13C and FIGS. 14A and 14B.

The scan-line driver circuit includes a shift register. The scan-line driver circuit may also include a level shifter, a buffer, or the like in some cases. In the scan-line driver circuit, when a clock signal (CLK) and a start pulse signal (SP) are inputted to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line must be turned on all at once, a buffer which can supply a large current is used.

Figure 13A:
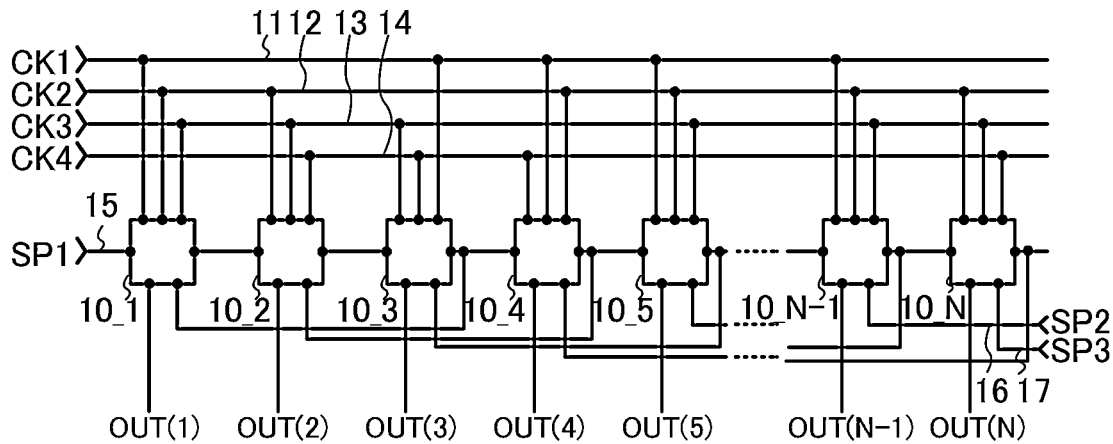
FIGS. 13A to 13C are circuit diagrams of a configuration of a shift register.

The shift register includes a first pulse output circuit 10_1 to a Nth pulse output circuits 10_N(N is a natural number greater than or equal to 3) (see FIG. 13A). In the shift register illustrated in FIG. 13A, a first clock signal CK1, a second clock signal CK2, a third clock signal CK3, and a fourth clock signal CK4 are respectively supplied from a first wiring 11, a second wiring 12, a third wiring 13, and a fourth wiring 14, to the first pulse output circuit 10_1 to the Nth pulse output circuit 10_N. A start pulse SP1 (a first start pulse) is inputted from a fifth wiring 15 to the first pulse output circuit 10_1. To the nth pulse output circuit 10_n of the second or subsequent stage (n is a natural number greater than or equal to 2 and less than or equal to N), a signal from the pulse output circuit of the previous stage (such a signal is referred to as a previous-stage signal OUT(n−1)) (n is a natural number greater than or equal to 2) is inputted. To the first pulse output circuit 10_1, a signal from the third pulse output circuit 10_3 of the stage following the next stage is inputted. Similarly, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)) is inputted. Therefore, the pulse output circuits of the respective stages output first output signals (OUT(1)(SR) to OUT(N)(SR)) to be inputted to the pulse output circuit of the respective subsequent stage and/or the pulse output circuit of the stage before the previous stage and second output signals (OUT(1) to OUT(N)) to be inputted to another wiring or the like. Note that since the subsequent-stage signal OUT(n+2) is not inputted to the last two stages of the shift register as illustrated in FIG. 13A, a second start pulse SP2 and a third start pulse SP3 may be additionally inputted from a sixth wiring 16 and a seventh wiring 17, respectively, to the pulse output circuits of the last two stages, for example. Alternatively, a signal which is additionally generated in the shift register may be used. For example, a (N+1)th pulse output circuit 10_(N+1) and a (N+2)th pulse output circuit 10_(N+2) which do not contribute to output of pulses to a display portion (such circuits are also referred to as dummy stages) may be provided, and signals corresponding to a second start pulse (SP2) and a third start pulse (SP3) may be generated from the dummy stages.

Note that a clock signal (CK) is a signal that alternates between an H level and an L level (also referred to as an L signal or a signal at low power source potential level) at regular intervals. Here, the first clock signal (CK1) to the fourth clock signal (CK4) are delayed by ¼ cycle sequentially. In this embodiment, driving of the pulse output circuit is controlled with the first to fourth clock signals (CK1) to (CK4). Note that in some cases, the clock signal is also referred to as GCK or SCK, depending on a driver circuit to which the clock signal is inputted; however, the clock signal is expressed as CK in the following description.

A first input terminal 21, a second input terminal 22, and a third input terminal 23 are electrically connected to any of the first to fourth wirings 11 to 14. For example, in the first pulse output circuit 10_1 in FIG. 13A, the first input terminal 21 is electrically connected to the first wiring 11, the second input terminal 22 is electrically connected to the second wiring 12, and the third input terminal 23 is electrically connected to the third wiring 13. In the second pulse output circuit 102, the first input terminal 21 is electrically connected to the second wiring 12, the second input terminal 22 is electrically connected to the third wiring 13, and the third input terminal 23 is electrically connected to the fourth wiring 14.

Figure 13B:
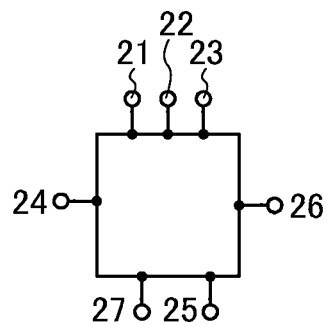

Each of the first pulse output circuit 10_1 to the Nth pulse output circuit 10_N includes the first input terminal 21, the second input terminal 22, the third input terminal 23, a fourth input terminal 24, a fifth input terminal 25, a first output terminal 26, and a second output terminal 27 (see FIG. 13B). In the first pulse output circuit 10_1, the first clock signal CK1 is inputted to the first input terminal 21, the second clock signal CK2 is inputted to the second input terminal 22, the third clock signal CK3 is inputted to the third input terminal 23, a start pulse is inputted to the fourth input terminal 24, a subsequent-stage signal OUT(3) is inputted to the fifth input terminal 25, the first output signal OUT(1)(SR) is outputted from the first output terminal 26, and the second output signal OUT(1) is outputted from the second output terminal 27.

Next, an example of a specific circuit configuration of the pulse output circuit is described with reference to FIG. 13C.

Figure 13C:
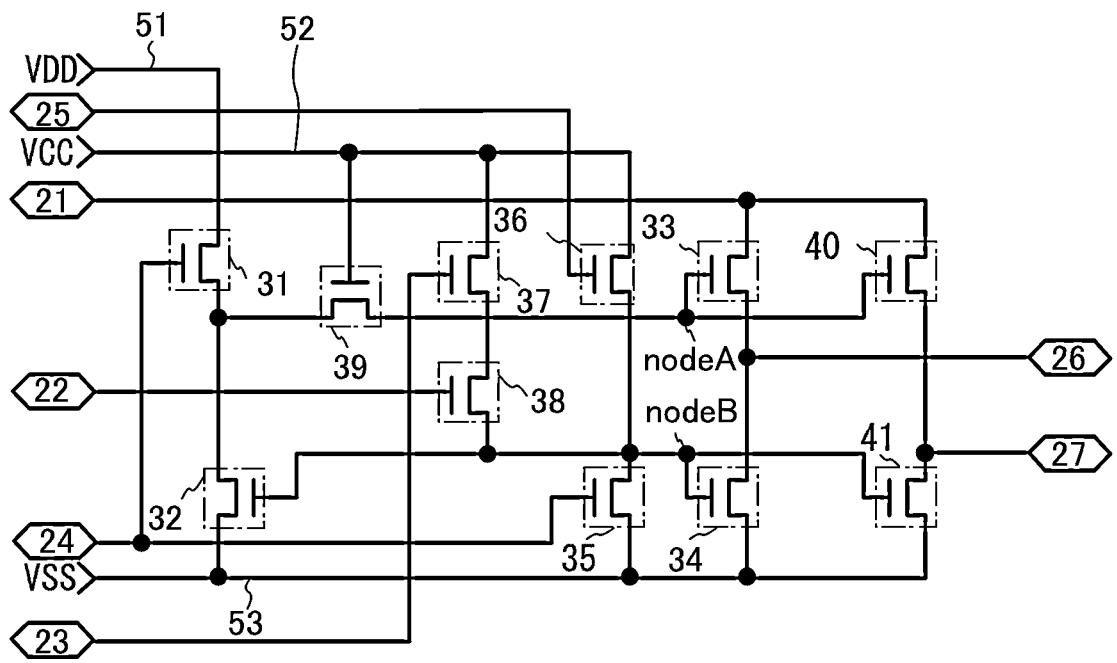

The first pulse output circuit 10_1 illustrated in FIG. 13C includes a first transistor 31 to eleventh transistor 41. A signal or a power source potential is supplied to the first transistor 31 to the eleventh transistor 41 from a power supply line 51 to which a first high power source potential VDD is supplied, a power supply line 52 to which a second high power source potential VCC is supplied, and a power supply line 53 to which a low power source potential VSS is supplied, in addition to the first input terminal 21 to the fifth input terminal 25, the first output terminal 26, and the second output terminal 27, which are described above. The relation of the power source potentials of the power supply lines in FIG. 13C is as follows: the first power source potential VDD is higher than or equal to the second power source potential VCC, and the second power source potential VCC is higher than the third power source potential VSS. Note that the first clock signal (CK1) to the fourth clock signal (CK4) each alternate between an H level and an L level at regular intervals; the clock signal at the H level is VDD, and the clock signal at the L level is VSS. By making the potential VDD of the power supply line 51 higher than the potential VCC of the power supply line 52, a potential applied to a gate electrode of a transistor can be lowered, shift in the threshold voltage of the transistor can be reduced, and deterioration of the transistor can be suppressed without an adverse effect on the operation of the transistor.

In FIG. 13C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 13C, a portion where the gate electrode of the third transistor 33, the gate electrode of the tenth transistor 40, and the second terminal of the ninth transistor 39 are connected is referred to as a node A. Moreover, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 14A).

Figure 14A:
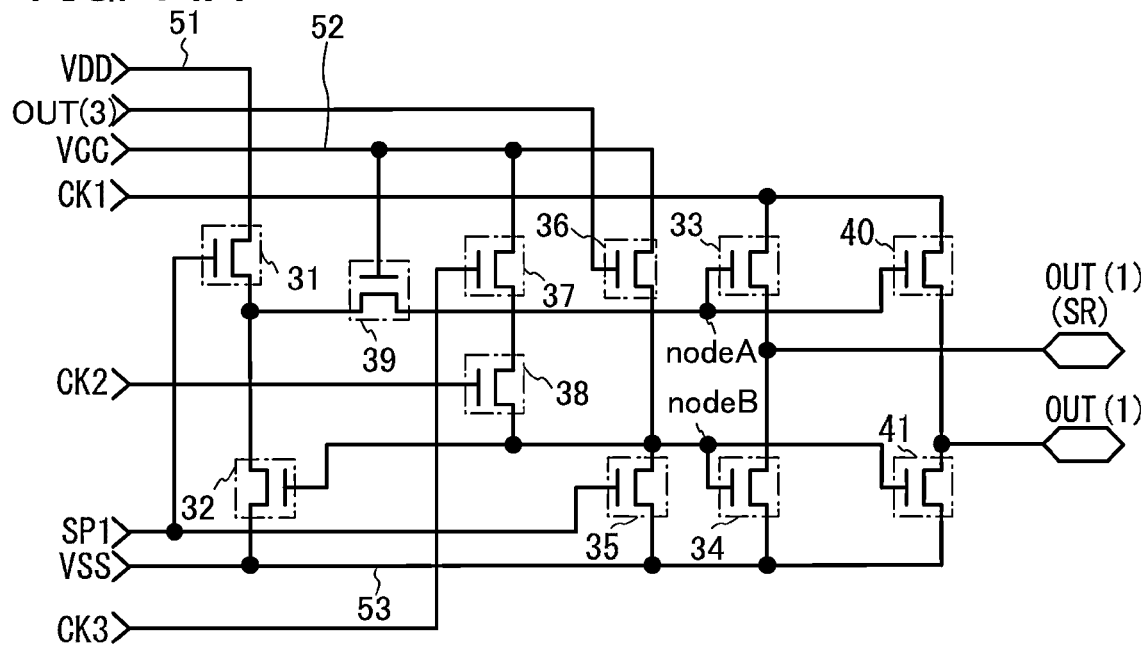
FIGS. 14A and 14B are a circuit diagram and a timing chart of operation of a shift register, respectively.

FIG. 14A illustrates signals that are inputted to or outputted from the first input terminal 21 to the fifth input terminal 25 and the first and output terminal 26 and the second output terminal 27 in the case where the pulse output circuit illustrated in FIG. 13C is applied to the first pulse output circuit 10_1.

Specifically, the first clock signal CK1 is inputted to the first input terminal 21, the second clock signal CK2 is inputted to the second input terminal 22, the third clock signal CK3 is inputted to the third input terminal 23, the start pulse is inputted to the fourth input terminal 24, the subsequent-stage signal OUT(3) is inputted to the fifth input terminal 25, the first output signal OUT(1)(SR) is outputted from the first output terminal 26, and the second output signal OUT(1) is outputted from the second output terminal 27.

Note that a thin film transistor is an element having at least three terminals of a gate, a drain, and a source. The thin film transistor has a semiconductor including a channel region formed in a region which overlaps with the gate. Current that flows between the drain and the source through the channel region can be controlled by controlling a potential of the gate. Here, since the source and the drain of the thin film transistor may change depending on the structure, the operating condition, and the like of the thin film transistor, it is difficult to define which is a source or a drain. Therefore, a region which functions as the source or the drain is not called the source or the drain in some cases. In that case, for example, such regions may be referred to as a first terminal and a second terminal, respectively.

Figure 14B:
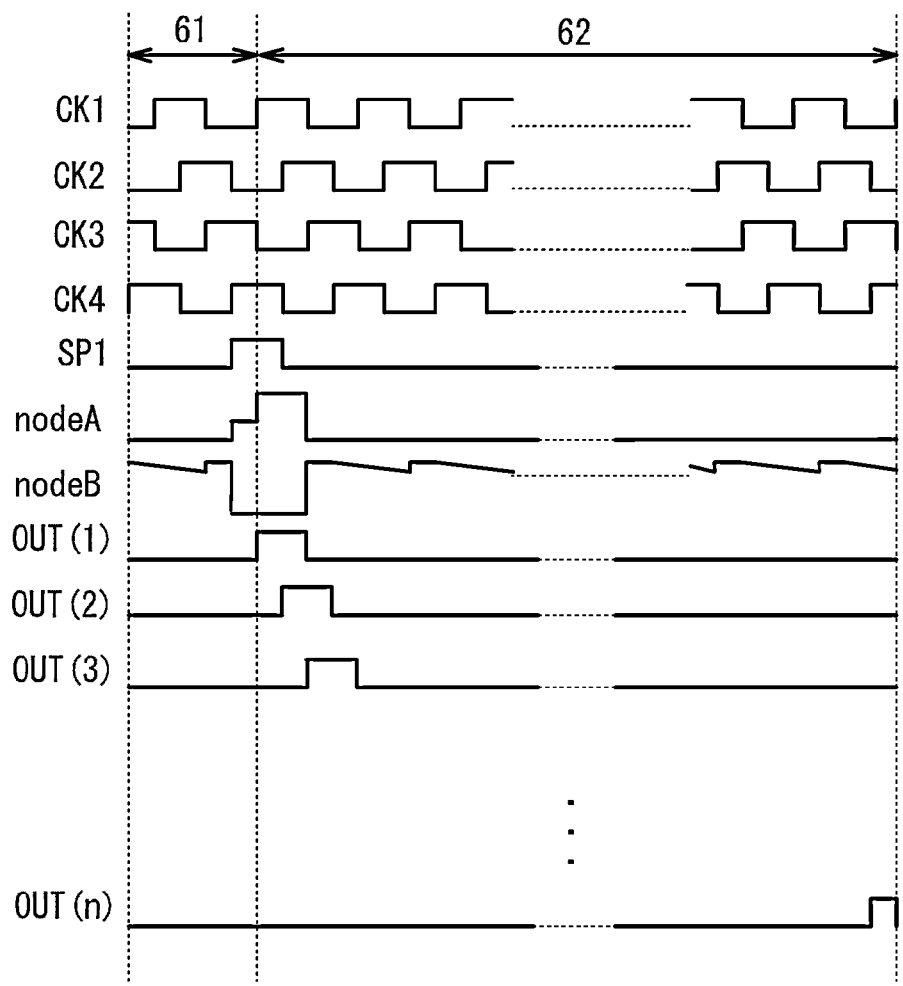

FIG. 14B illustrates a timing chart of a shift register including a plurality of pulse output circuits illustrated in FIG. 14A. Note that when the shift register is included in a scan-line driver circuit, a period 61 in FIG. 14B corresponds to a vertical retrace period and a period 62 corresponds to a gate selection period.

Note that by providing the ninth transistor 39 in which the second power source potential VCC is applied to the gate electrode as illustrated in FIG. 14A, the following advantages before and after bootstrap operation are provided.

In the case where a potential of the node A is raised by bootstrap operation without the provision of the ninth transistor 39 in which the second power source potential VCC is applied to the gate electrode, a potential of the source which is the second terminal of the first transistor 31 rises to a value higher than the first power source potential VDD. Then, the source of the first transistor 31 is switched to the first terminal side, that is, the terminal on the power supply line 51 side. Consequently, in the first transistor 31, a high bias voltage is applied and thus significant stress is applied between the gate and the source and between the gate and the drain, which might cause deterioration of the transistor. In contrast, in the case of providing the ninth transistor 39 in which the second power source potential VCC is applied to the gate electrode, an increase in the potential of the second terminal of the first transistor 31 can be prevented while the potential of the node A is raised by bootstrap operation. That is, by providing the ninth transistor 39, negative bias voltage applied between the gate and the source of the first transistor 31 can be reduced. Thus, the circuit configuration in this embodiment can reduce a negative bias voltage applied between the gate and the source of the first transistor 31, so that deterioration of the first transistor 31 due to stress can be suppressed.

Note that the ninth transistor 39 may be provided as long as the first terminal and the second terminal of the ninth transistor 39 are connected between the second terminal of the first transistor 31 and the gate of the third transistor 33. Note that in the case of the shift register including a plurality of pulse output circuits in this embodiment in a signal-line driver circuit having a larger number of stages than a scan-line driver circuit, the ninth transistor 39 can be omitted, which results in reducing the number of transistors.

Note that an In—Ga—Zn—O-based film having an incubation state is used for semiconductor layers of the first transistor 31 to the eleventh transistor 41; thus, in the thin film transistors, the off-state current can be reduced, the on-state current and field effect mobility can be increased, and the degree of deterioration can be reduced. As a result, a malfunction in the circuit can be reduced. Moreover, the degree of deterioration of the transistor, a channel formation region of which includes an In—Ga—Zn—O-based film having an incubation state, by application of a high potential to a gate electrode is smaller than that of a transistor using amorphous silicon. Consequently, similar operation can be obtained even when the first power source potential VDD is supplied to the power supply line to which the second power source potential VCC is supplied, and the number of power supply lines placed between circuits can be reduced; thus, the size of the circuit can be reduced.

Note that a similar function is obtained even when the connection relation is changed so that a clock signal which is supplied from the third input terminal 23 to the gate electrode of the seventh transistor 37 and a clock signal which is supplied from the second input terminal 22 to the gate electrode of the eighth transistor 38 are supplied from the second input terminal 22 and the third input terminal 23, respectively. In the shift register illustrated in FIG. 14A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in potentials of the second input terminal 22 and the third input terminal 23 is caused twice by fall in potential of the gate electrode of the seventh transistor 37 and fall in potential of the gate electrode of the eighth transistor 38. In contrast, when a state of the seventh transistor 37 and the eighth transistor 38 in the shift register illustrated in FIG. 14A is changed so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 occurs once, which is caused by fall in potential of the gate electrode of the eighth transistor 38. Consequently, the connection relation, in which the clock signal CK3 is supplied from the third input terminal 23 to the gate electrode of the seventh transistor 37 and the clock signal CK2 is supplied from the second input terminal 22 to the gate electrode of the eighth transistor 38, is preferable. That is because the number of times of the change in the potential of the node B can be reduced and noise can be decreased.

In such a manner, an H level signal is regularly supplied to the node B in a period during which the potentials of the first output terminal 26 and the second output terminal 27 are held at L level; thus, a malfunction of the pulse output circuit can be suppressed.

Embodiment 4

It is possible to manufacture the thin film transistor described in Embodiments 1 and 2, and a semiconductor device having a display function (also referred to as a display device) using the thin film transistor in a pixel portion and also in a driver circuit portion. Moreover, part of the driver circuit portion or the entire driver circuit portion using the thin film transistor described in Embodiments 1 and 2 can be formed over a substrate where a pixel portion is formed, whereby a system-on-panel can be obtained.

The display device includes a display element. Examples of the display element include a liquid crystal element (also referred to as a liquid crystal display element) and a light-emitting element (also referred to as a light-emitting display element). The light-emitting element includes in its category an element whose luminance is controlled by current or voltage, and specifically includes an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a unit for supplying current to the display element in each of a plurality of pixels. Specifically, the element substrate may be in a state in which only a pixel electrode of the display element is formed, a state after formation of a conductive film to be a pixel electrode and before etching of the conductive film to form the pixel electrode, or any other states.

Note that a display device in this specification refers to an image display device, a display device, or a light source (including a lighting device). Further, the display device includes any of the following modules in its category: a module including a connector such as a flexible printed circuit (FPC), a tape automated bonding (TAB) tape, or a tape carrier package (TCP); a module having a TAB tape or a TCP that is provided with a printed wiring board at the end thereof; and a module having an integrated circuit (IC) that is directly mounted on a display element by a chip on glass (COG) method.

In this embodiment, the appearance and a cross section of a liquid crystal display panel which is an embodiment of a semiconductor device will be described with reference to FIGS. 15A1, 15A2, and 15B. FIGS. 15A1 and 15A2 are top views of panels in which a thin film transistor 4010 and a thin film transistor 4011 which are formed over a first substrate 4001 and a liquid crystal element 4013 are sealed between the first substrate 4001 and a second substrate 4006 with a sealant 4005. In the thin film transistor 4010 and the thin film transistor 4011, the channel formation regions each of which include the In—Ga—Zn—O-based film having an incubation state, which is described in Embodiments 1 and 2. FIG. 15B is a cross-sectional view taken along line M-N in FIGS. 15A1 and 15A2.

The sealant 4005 is provided so as to surround a pixel portion 4002 and a scan-line driver circuit 4004 which are provided over the first substrate 4001. The second substrate 4006 is provided over the pixel portion 4002 and the scan-line driver circuit 4004. Consequently, the pixel portion 4002 and the scan-line driver circuit 4004 are sealed together with a liquid crystal layer 4008, by the first substrate 4001, the sealant 4005, and the second substrate 4006. A signal-line driver circuit 4003 which is formed using a single crystal semiconductor or a polycrystalline semiconductor over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 15A1 illustrates an example in which the signal-line driver circuit 4003 is mounted with a COG method. FIG. 15A2 illustrates an example in which signal-line driver circuit 4003 is mounted with a TAB method.

The pixel portion 4002 and the scan-line driver circuit 4004, which are provided over the first substrate 4001, each include a plurality of thin film transistors. The thin film transistor 4010 included in the pixel portion 4002 and the thin film transistor 4011 included in the scan-line driver circuit 4004 are illustrated as an example in FIG. 15B. An insulating layer 4020 and an insulating layer 4021 are provided over the thin film transistor 4010 and the thin film transistor 4011.

The thin film transistors described in Embodiments 1 and 2, the channel formation regions each of which include an In—Ga—Zn—O-based film having an incubation state, can be used as the thin film transistor 4010 and the thin film transistor 4011. In this embodiment, the thin film transistor 4010 and the thin film transistor 4011 are n-channel thin film transistors.

A conductive layer 4040 is provided over part of the insulating layer 4044 so as to overlap with a channel formation region of an oxide semiconductor layer in the thin film transistor 4011 for the driver circuit. The conductive layer 4040 can be formed using the same material in the same step as a pixel electrode layer 4030. The conductive layer 4040 is provided so as to overlap with the channel formation region of the oxide semiconductor layer, whereby the amount of change in threshold voltage of the thin film transistor 4011 before and after the BT testing can be reduced. A potential of the conductive layer 4040 may be the same as or different from that of a gate electrode layer of the thin film transistor 4011. The conductive layer 4040 can also function as a second gate electrode layer. Alternatively, the potential of the conductive layer 4040 may be GND, 0 V, or the conductive layer 4040 may be in a floating state.

The pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 which each function as alignment films, respectively, and the liquid crystal layer 4008 is interposed between the pixel electrode layer 4030 and the counter electrode layer 4031 with the insulating layer 4032 and the insulating layer 4033 therebetween. Note that although not illustrated, a color filter may be provided either on the first substrate 4001 side or on the second substrate 4006 side.

Note that the first substrate 4001 and the second substrate 4006 can be formed using glass, metal (typically, stainless steel), ceramic, or plastic. As plastics, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can also be used.

A columnar spacer denoted by reference numeral 4035 is obtained by selective etching of an insulating film and is provided in order to control the distance (a cell gap) between the pixel electrode layer 4030 and the counter electrode layer 4031. Note that a spherical spacer may be used. The counter electrode layer 4031 is electrically connected to a common potential line formed over the same substrate as the thin film transistor 4010. The counter electrode layer 4031 and the common potential line can be electrically connected to each other through conductive particles arranged between the pair of substrates, using a common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, a liquid crystal composition containing a chiral agent at 5 wt % or more so as to improve the temperature range is used for the liquid crystal layer 4008. The liquid crystal composition which includes liquid crystal exhibiting a blue phase and a chiral agent has a short response time of 10 μsec to 100 μsec inclusive, has optical isotropy, which makes the alignment process unneeded, and has a small viewing angle dependence. Note that in the case where a blue phase is used, an embodiment of the present invention is not limited to the structures in FIGS. 15A1, 15A2, and 15B, and a structure of a so-called horizontal electric field mode may be employed, in which an electrode layer corresponding to the counter electrode layer 4031 is formed on the substrate side, the substrate over which the pixel electrode layer 4030 is formed.

Note that although this embodiment shows an example of a transmissive liquid crystal display device, the present invention can also be applied to a reflective liquid crystal display device or a transflective liquid crystal display device.

An example of the liquid crystal display device in this embodiment is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film which functions as a black matrix may be provided.

In this embodiment, in order to reduce the surface roughness of the thin film transistor and to improve the reliability of the thin film transistor, the thin film transistor obtained in Embodiment 2 is covered with insulating layers which function as a protective film or a planarizing insulating film (the insulating layer 4020 and the insulating layer 4021). Note that the protective film is provided to prevent entry of contaminant impurities such as organic substance, metal, or moisture existing in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, aluminum oxynitride film, and/or an aluminum nitride oxide film with a sputtering method. Although an example in which the protective film is formed with a sputtering method is described in this embodiment, the present invention is not limited to this method and a variety of methods may be employed.

In this embodiment, the insulating layer 4020 having a stacked structure is formed as a protective film. Here, a silicon oxide film is formed with a sputtering method as a first layer of the insulating layer 4020. The use of a silicon oxide film as a protective film has an effect of preventing a hillock of an aluminum film which is used as the source electrode layer and the drain electrode layer.

As a second layer of the protective film, an insulating layer is formed. Here, a silicon nitride film is formed with a sputtering method as a second layer of the insulating layer 4020. The use of a silicon nitride film as a protective film can prevent mobile ions of sodium or the like from entering a semiconductor region so that variation in electric characteristics of the TFT can be suppressed.

After the protective film is formed, annealing (300° C. to 400° C. inclusive) may be performed on the oxide semiconductor layer.

The insulating layer 4021 is formed as the planarizing insulating film. The insulating layer 4021 can be formed using a heat-resistant organic material such as polyimide, an acrylic resin, a benzocyclobutene resin, polyamide, or an epoxy resin. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer 4021. The insulating layer 4021 can be formed, depending on the material, with a method such as a sputtering method, an SOG method, a spin coating method, a dipping method, a spray coating method, a droplet discharge method (e.g., an ink-jet method, screen printing, or offset printing), or a tool such as a doctor knife, a roll coater, a curtain coater, or a knife coater. In the case where the insulating layer 4021 is formed using a material solution, annealing (at 300° C. to 400° C. inclusive) may be performed on the oxide semiconductor layer at the same time as a baking step. The step of baking the insulating layer 4021 serves also as the annealing step of the oxide semiconductor layer, whereby the semiconductor device can be efficiently manufactured.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode layer 4030 and the counter electrode layer 4031 can be formed using a conductive composition containing a conductive macromolecule (also referred to as a conductive polymer). It is preferable that the pixel electrode formed using the conductive composition have a sheet resistance of 10,000 Ω/square or less and a light transmittance of 70% or more at a wavelength of 550 nm. Further, the resistivity of the conductive macromolecule included in the conductive composition is preferably less than or equal to 0.1 Ω·cm.

As the conductive macromolecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal-line driver circuit 4003 which is formed separately, the scan-line driver circuit 4004, and the pixel portion 4002 through an FPC 4018.

In this embodiment, a connection terminal electrode 4015 is formed from the same conductive film as the pixel electrode layer 4030 included in the liquid crystal element 4013, and a terminal electrode 4016 is formed from the same conductive film as the source electrode layers and the drain electrode layers of the thin film transistors 4010 and 4011.

The connection terminal electrode 4015 is electrically connected to a terminal included in the FPC 4018 through an anisotropic conductive film 4019.

Note that FIGS. 15A1, 15A2, and 15B illustrate an example in which the signal-line driver circuit 4003 is formed separately and mounted on the first substrate 4001; however, this embodiment is not limited to this structure. The scan-line driver circuit may be separately formed and then mounted, or only part of the signal-line driver circuit or part of the scan-line driver circuit may be separately formed and then mounted.

Figure 16:
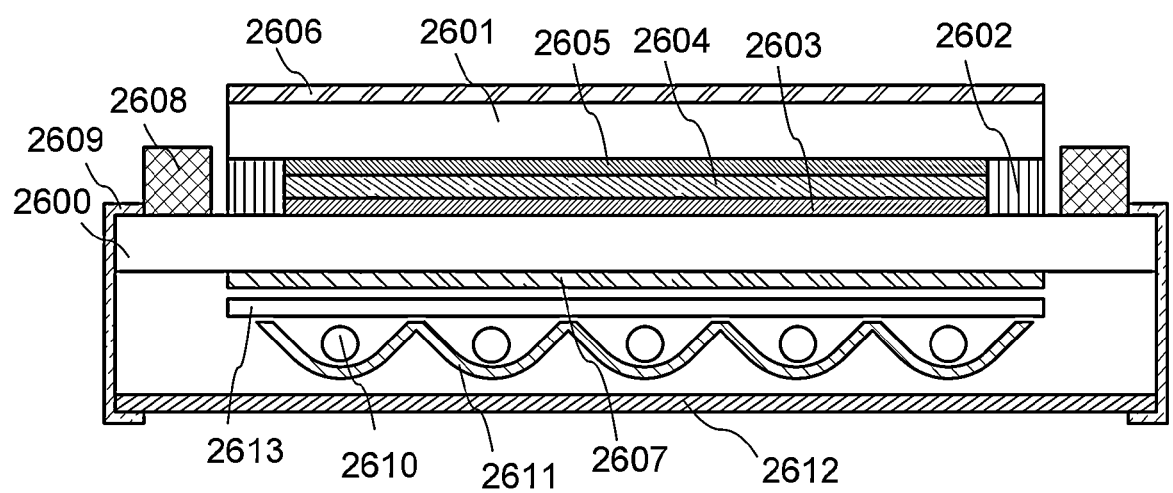
FIG. 16 is a cross-sectional view illustrating an embodiment of the present invention.

FIG. 16 illustrates an example of a liquid crystal display module which is formed as a semiconductor device using a substrate provided with a TFT which is manufactured by application of the TFT described in Embodiments 1 and 2, that is, a TFT substrate 2600.

FIG. 16 illustrates an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, a coloring layer 2605, and the like are provided to form a display region. In addition, the TFT substrate 2600 and the counter substrate 2601 are provided with a polarizing plate 2607 and a polarizing plate 2606, respectively. The coloring layer 2605 is necessary to perform color display. In the RGB system, coloring layers corresponding to colors of red, green, and blue are provided for pixels. The polarizing plate 2606, the polarizing plate 2607, and a diffusion plate 2613 are provided on the outer side of the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through the above-described steps, a highly reliable liquid crystal display panel as a semiconductor device can be manufactured.

Note that the structure shown in this embodiment can be combined with the structure shown in the other embodiments as appropriate.

Embodiment 5

In this embodiment, an example of a light-emitting display device will be described as a semiconductor device to which the thin film transistor described in Embodiments 1 and 2 is applied. As a display element included in the display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound emits light. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that here an organic EL element is described as a light-emitting element.

Figure 17:
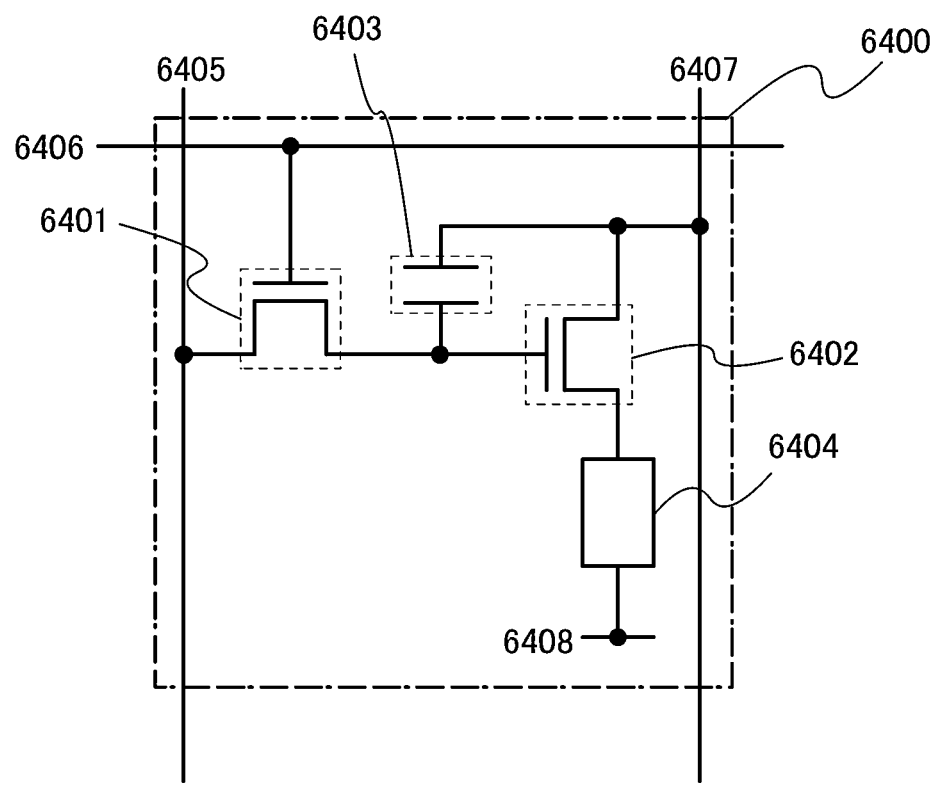
FIG. 17 is an equivalent circuit diagram of a pixel of a semiconductor device.

FIG. 17 illustrates an example of a pixel structure to which digital time grayscale driving can be applied, as an example of the semiconductor device to which the present invention is applied.

A structure and operation of a pixel to which digital time grayscale driving can be applied are described. Here, one pixel includes two n-channel transistors described in Embodiments 1 and 2, the channel formation regions each of which include an oxide semiconductor layer (an In—Ga—Zn—O-based film) having an incubation state.

A pixel 6400 includes a switching transistor 6401, a driving transistor 6402, a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the driving transistor 6402. The gate of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power source potential. Note that the low power source potential is lower than a high power source potential that is set to the power supply line 6407 when the high power source potential set to the power supply line 6407 is a reference. For example, GND or 0 V may be set as the low power source potential. A potential difference between the high power source potential and the low power source potential is applied to the light-emitting element 6404 so that current flows through the light-emitting element 6404, whereby the light-emitting element 6404 emits light. In order to make the light-emitting element 6404 emit light, each potential is set so that the potential difference between the high power source potential and the low power source potential is higher than or equal to the forward threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed between the channel region and the gate electrode.

In the case where a voltage-input voltage-driving method is employed, a video signal is inputted to the gate of the driving transistor 6402 so that the driving transistor 6402 is in either of two states of being sufficiently turned on or turned off. That is, the driving transistor 6402 is operated in a linear region. Since the driving transistor 6402 is operated in the linear region, a voltage higher than the voltage of the power supply line 6407 is applied to the gate of the driving transistor 6402. Note that a voltage higher than or equal to the following is applied to the signal line 6405: the power supply line voltage+ $V_{th}$ of the driving transistor 6402.

In the case where an analog grayscale driving is employed instead of the digital time grayscale driving, the same pixel structure as in FIG. 17 can be employed by changing signal input.

In the case where analog grayscale driving is performed, a voltage higher than or equal to the following is applied to the gate of the driving transistor 6402: the forward voltage of the light-emitting element 6404+$V_{th}$ of the driving transistor 6402. The forward voltage of the light-emitting element 6404 indicates a voltage at which a desired luminance is obtained, and includes at least a forward threshold voltage. The video signal by which the driving transistor 6402 is operated in a saturation region is inputted, so that current can be supplied to the light-emitting element 6404. In order to operate the driving transistor 6402 in the saturation region, the potential of the power supply line 6407 is set higher than the gate potential of the driving transistor 6402. When an analog video signal is used, a current corresponding to the video signal can be supplied to the light-emitting element 6404, so that analog grayscale driving can be performed.

Note that the pixel structure is not limited to that illustrated in FIG. 17. For example, a switch, a resistor, a capacitor, a transistor, a logic circuit, or the like may be added to the pixel illustrated in FIG. 17.

Next, a structure of the light-emitting element will be described with reference to FIGS. 18A to 18C. Here described is a cross-sectional structure of a pixel by taking the case where a TFT for driving a light-emitting element is an n-channel TFT as an example. TFTs 7001, 7011, and 7021 serving as TFTs for driving a light-emitting element used in semiconductor devices illustrated in FIGS. 18A, 18B, and 18C can be formed in a manner similar to that of the thin film transistors described in Embodiments 1 and 2. That is, the TFTs 7001, 7011, and 7021 are thin film transistors, channel formation regions each of which include an In—Ga—Zn—O-based film having an incubation state. The thin film transistors, the channel formation regions each of which include the In—Ga—Zn—O-based film having an incubation state, are used, whereby low power consumption of a semiconductor device having a light-emitting element can be realized.

In order to extract light emitted from the light-emitting element, at least one of an anode and a cathode needs to transmit light. A thin film transistor and a light-emitting element are formed over a substrate. The light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure illustrated in FIG. 17 can be applied to a light-emitting element having any of these emission structures.

Next, a light-emitting element having the bottom emission structure is described with reference to FIG. 18A.

Figure 18A:
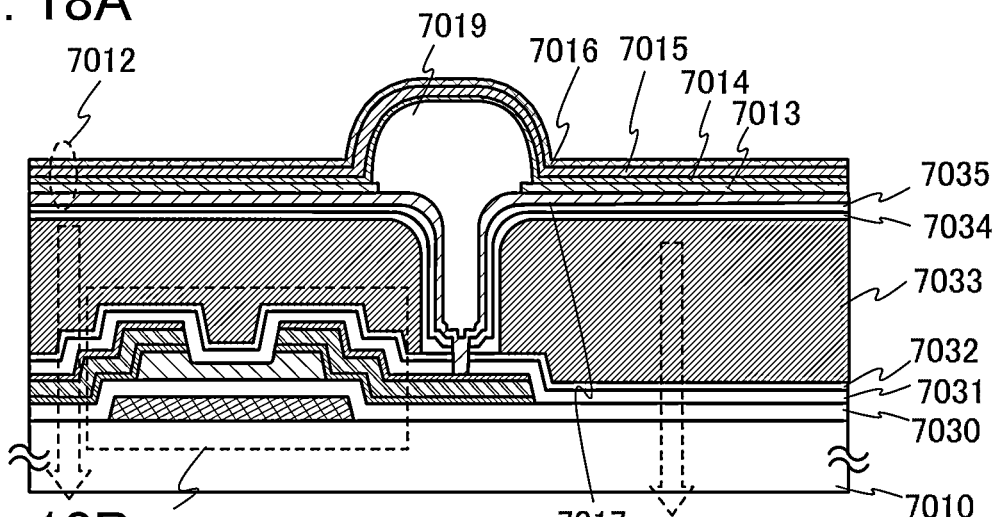
FIGS. 18A to 18C are each a cross-sectional view illustrating an embodiment of the present invention.

FIG. 18A is a cross-sectional view of a pixel in the case where a TFT 7011 for driving a light-emitting element is an n-channel TFT and light is emitted from a light-emitting element 7012 to a first electrode 7013 side. In FIG. 18A, the first electrode 7013 of the light-emitting element 7012 is formed over a light-transmitting conductive film 7017 which is electrically connected to a drain electrode layer of the TFT 7011 for driving a light-emitting element, and an EL layer 7014 and a second electrode 7015 are stacked in this order over the first electrode 7013.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the first electrode 7013 of the light-emitting element. For example, in the case where the first electrode 7013 is used as a cathode, it is preferable to use a material having a low work function, specifically, an alkali metal such as Li or Cs; an alkaline earth metal such as Mg, Ca, or Sr; an alloy containing any of these metals (e.g., Mg:Ag or Al:Li); or a rare earth metal such as Yb or Er, for example. In FIG. 18A, the first electrode 7013 is formed to have a thickness through which light can be transmitted (preferably, approximately 5 nm to 30 nm). For example, an aluminum film with a thickness of 20 nm is used as the first electrode 7013.

Alternatively, a light-transmitting conductive film and an aluminum film may be stacked and then selectively etched so as to form the light-transmitting conductive film 7017 and the first electrode 7013. In this case, the etching can be performed using the same mask, which is preferable.

Further, the periphery of the first electrode 7013 is covered with a partition wall 7019. The partition wall 7019 is formed using an organic resin film of polyimide, acrylic, polyamide, epoxy, or the like, an inorganic insulating film, or organic polysiloxane. It is particularly preferable that the partition wall 7019 be formed using a photosensitive resin material to have an opening portion over the first electrode 7013 so that a sidewall of the opening portion is formed as a tilted surface with continuous curvature. When the partition wall 7019 is formed using a photosensitive resin material, a step of forming a resist mask can be omitted.

The EL layer 7014 which is formed over the first electrode 7013 and the partition wall 7019 may include at least a light-emitting layer and be formed using a single layer or a plurality of layers stacked. When the EL layer 7014 is formed using a plurality of layers, the EL layer 7014 is formed by stacking an electron-injection layer, an electron-transport layer, a light-emitting layer, a hole-transport layer, and a hole-injection layer in that order over the first electrode 7013 which functions as a cathode. Note that not all of these layers need to be provided except for the light-emitting layer.

In addition, the stacking order is not limited to the above order of the stacked layers; that is, the first electrode 7013 may function as an anode, and the EL layer 7014 may be formed by stacking a hole-injection layer, a hole-transport layer, a light-emitting layer, an electron-transport layer, and an electron-injection layer in that order over the first electrode 7013. Note that when power consumption is contrasted, the first electrode 7013 is made to function as a cathode and an electron-injection layer, an electron-transport layer, a light-emitting layer, a hole-transport layer, and a hole-injection layer are stacked in that order over the first electrode 7013, so that an increase of voltage of the driver circuit portion can be suppressed and thus power consumption can be reduced, which is preferable.

Any of a variety of materials can be used for the second electrode 7015 which is formed over the EL layer 7014. For example, in the case where the second electrode 7015 is used as an anode, a material having a high work function, examples of which are ZrN, Ti, W, Ni, Pt, Cr, and a light-transmitting conductive material such as ITO, IZO, and ZnO, is preferable. Further, over the second electrode 7015, a light-blocking film 7016 is formed using, for example, a metal which blocks light or a metal which reflects light. In this embodiment, an ITO film is used as the second electrode 7015 and a Ti film is used as the light-blocking film 7016.

The light-emitting element 7012 corresponds to a region where the EL layer 7014 which includes a light-emitting layer is sandwiched between the first electrode 7013 and the second electrode 7015. In the case of the element structure illustrated in FIG. 18A, light is emitted from the light-emitting element 7012 to the first electrode 7013 side as indicated by an arrow.

Note that in FIG. 18A, light emitted from the light-emitting element 7012 passes through a color filter layer 7033 and then passes through a second gate insulating layer 7031, a first gate insulating layer 7030, and a substrate 7010 so as to be emitted to the outside.

The color filter layer 7033 is formed with a droplet discharge method such as an ink-jet method, a printing method, an etching method using a photolithography technique, or the like.

The color filter layer 7033 is covered with an overcoat layer 7034, and also covered with a protective insulating layer 7035. Note that although the overcoat layer 7034 is illustrated to have a small thickness in FIG. 18A, the overcoat layer 7034 has a function of reducing unevenness caused by the color filter layer 7033 with the use of a resin material such as an acrylic resin.

A contact hole which is formed in the second gate insulating layer 7031, an insulating layer 7032, the color filter layer 7033, the overcoat layer 7034, and the protective insulating layer 7035 and which reaches the drain electrode layer is in a position which overlaps with the partition wall 7019.

Next, a light-emitting element having the dual emission structure is described with reference to FIG. 18B.

Figure 18B:
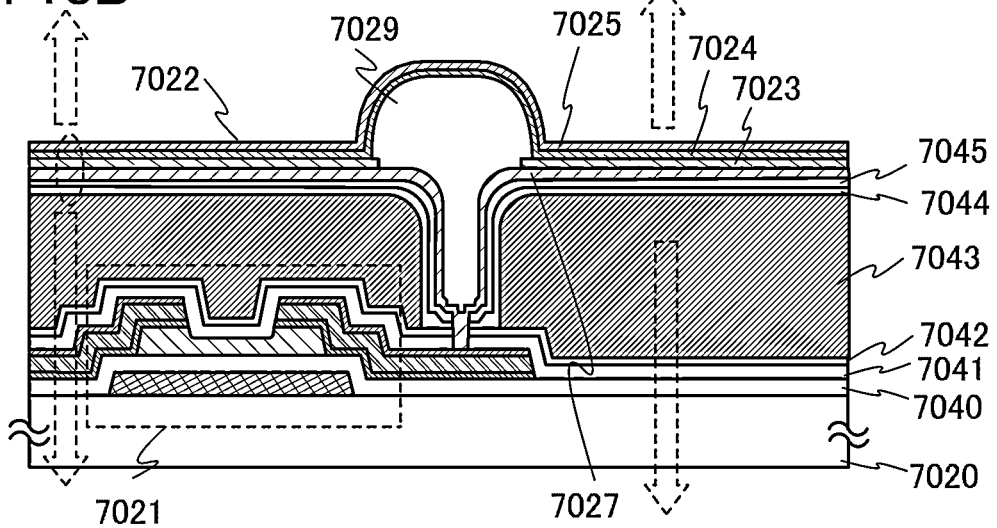

In FIG. 18B, a first electrode 7023 of a light-emitting element 7022 is formed over a light-transmitting conductive film 7027 which is electrically connected to a drain electrode layer of a TFT 7021 for driving a light-emitting element, and an EL layer 7024 and a second electrode 7025 are stacked in this order over the first electrode 7023.

As the light-transmitting conductive film 7027, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the first electrode 7023. For example, in the case where the first electrode 7023 is used as a cathode, it is preferable to use a material having a low work function, specifically, an alkali metal such as Li or Cs; an alkaline earth metal such as Mg, Ca, or Sr; an alloy containing any of these metals (e.g., Mg:Ag or Al:Li); or a rare earth metal such as Yb or Er, for example. In this embodiment, the first electrode 7023 is used as a cathode, and is formed to have a thickness through which light can be transmitted (preferably, approximately 5 nm to 30 nm). For example, an aluminum film with a thickness of 20 nm is used as the first electrode 7023.

Alternatively, a light-transmitting conductive film and an aluminum film may be stacked and then selectively etched so as to form the light-transmitting conductive film 7027 and the first electrode 7023. In this case, the etching can be performed using the same mask, which is preferable.

Further, the periphery of the first electrode 7023 is covered with a partition wall 7029. The partition wall 7029 is formed using an organic resin film of polyimide, acrylic, polyamide, epoxy, or the like, an inorganic insulating film, or organic polysiloxane. It is particularly preferable that the partition wall 7029 be formed using a photosensitive resin material to have an opening portion over the first electrode 7023 which is a cathode so that a sidewall of the opening portion is formed as a tilted surface with continuous curvature. When the partition wall 7029 is formed using a photosensitive resin material, a step of forming a resist mask can be omitted.

The EL layer 7024 which is formed over the first electrode 7023 and the partition wall 7029 may include at least a light-emitting layer and be formed using a single layer or a plurality of layers stacked. When the EL layer 7024 is formed using a plurality of layers, the EL layer 7014 is formed by stacking an electron-injection layer, an electron-transport layer, a light-emitting layer, a hole-transport layer, and a hole-injection layer in that order over the first electrode 7023 which functions as a cathode. Note that not all of these layers need to be provided except for the light-emitting layer.

In addition, the stacking order is not limited to the above order of the stacked layers; that is, the first electrode 7023 may function as an anode, and the EL layer 7024 may be formed by stacking a hole-injection layer, a hole-transport layer, a light-emitting layer, an electron-transport layer, and an electron-injection layer in that order over the first electrode 7023. Note that when power consumption is contrasted, the first electrode 7023 is made to function as a cathode and an electron-injection layer, an electron-transport layer, a light-emitting layer, a hole-transport layer, and a hole-injection layer are stacked in that order over the first electrode 7023, so that an increase of voltage of the driver circuit portion can be suppressed and thus power consumption can be reduced, which is preferable.

Any of a variety of materials can be used for the second electrode 7025 which is formed over the EL layer 7024. For example, in the case where the second electrode 7025 is used as an anode, a material having a high work function, examples of which are a light-transmitting conductive material such as ITO, IZO, and ZnO, is preferable. In this embodiment, as the second electrode 7025, an anode is used, and an ITO film containing silicon oxide is formed.

The light-emitting element 7022 corresponds to a region where the EL layer 7024 which includes a light-emitting layer is sandwiched between the first electrode 7023 and the second electrode 7025. In the case of the element structure illustrated in FIG. 18B, light is emitted from the light-emitting element 7022 to both the first electrode 7023 side and the second electrode 7025 side as indicated by an arrow.

Note that in FIG. 18B, light emitted from the light-emitting element 7022 to the first electrode 7023 side passes through a color filter layer 7043 and then passes through a second gate insulating layer 7041, a first gate insulating layer 7040, and a substrate 7020 so as to be emitted to the outside.

The color filter layer 7043 is formed with a droplet discharge method such as an ink-jet method, a printing method, a photolithography technique, an etching method, or the like.

The color filter layer 7043 is covered with an overcoat layer 7044, and also covered with a protective insulating layer 7045.

A contact hole which is formed in the second gate insulating layer 7041, the insulating layer 7042, the color filter layer 7043, the overcoat layer 7044, and the protective insulating layer 7045 and which reaches the drain electrode layer is in a position which overlaps with the partition wall 7029.

Note that when a light-emitting element having a dual emission structure is used and full color display is performed on both display surfaces, light from the second electrode 7025 side does not pass through the color filter layer 7043; therefore, a sealing substrate provided with another color filter layer is preferably provided on the second electrode 7025.

Next, a light-emitting element having the top emission structure is described with reference to FIG. 18C.

Figure 18C:
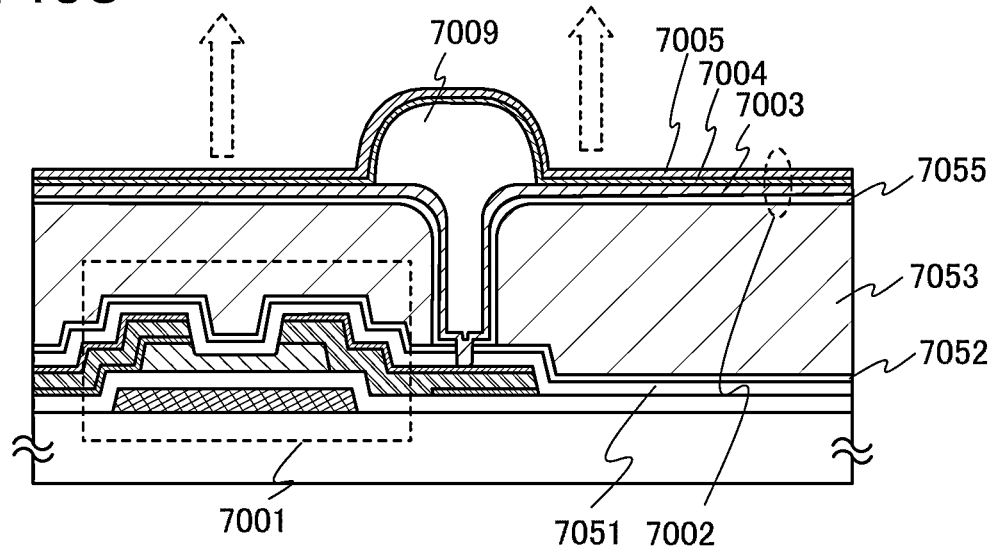

FIG. 18C is a cross-sectional view of a pixel in the case where a TFT 7001 for driving a light-emitting element is an n-channel TFT and light is emitted from a light-emitting element 7002 to a second electrode 7005 side. In FIG. 18C, a first electrode 7003 of the light-emitting element 7002 which is electrically connected to a drain electrode layer of the TFT 7001 for driving a light-emitting element is formed, and an EL layer 7004 and the second electrode 7005 are stacked in this order over the first electrode 7003.

Any of a variety of materials can be used for the first electrode 7003. For example, in the case where the first electrode 7003 is used as a cathode, it is preferable to use a material having a low work function, specifically, an alkali metal such as Li or Cs; an alkaline earth metal such as Mg, Ca, or Sr; an alloy containing any of these metals (e.g., Mg:Ag or Al:Li); or a rare earth metal such as Yb or Er, for example.

Further, the periphery of the first electrode 7003 is covered with a partition wall 7009. The partition wall 7009 is formed using an organic resin film of polyimide, acrylic, polyamide, epoxy, or the like, an inorganic insulating film, or organic polysiloxane. It is particularly preferable that the partition wall 7009 be formed using a photosensitive resin material to have an opening portion over the first electrode 7003 so that a sidewall of the opening portion is formed as a tilted surface with continuous curvature. When the partition wall 7009 is formed using a photosensitive resin material, a step of forming a resist mask can be omitted.

The EL layer 7004 which is formed over the first electrode 7003 and the partition wall 7009 may include at least a light-emitting layer and be formed using a single layer or a plurality of layers stacked. When the EL layer 7004 is formed using a plurality of layers, the EL layer 7004 is formed by stacking an electron-injection layer, an electron-transport layer, a light-emitting layer, a hole-transport layer, and a hole-injection layer in that order over the first electrode 7003 which functions as a cathode. Note that not all of these layers need to be provided except for the light-emitting layer.

In addition, the stacking order is not limited to the above order of the stacked layers; that is, over the first electrode 7003 which functions as an anode, the EL layer 7004 may be formed by stacking a hole-injection layer, a hole-transport layer, a light-emitting layer, an electron-transport layer, and an electron-injection layer in that order.

In FIG. 18C, a hole-injection layer, a hole-transport layer, a light-emitting layer, an electron-transport layer, and an electron-injection layer are stacked in that order over a stacked film in which a Ti film, an aluminum film, and a Ti film are stacked in that order, and thereover, a stacked layer of a Mg:Ag alloy thin film and ITO is formed.

Note that when the TFT 7001 is an n-channel transistor, it is preferable that an electron-injection layer, an electron-transport layer, a light-emitting layer, a hole-transport layer, and a hole-injection layer be stacked in this order over the first electrode 7003 so that the voltage of a driver circuit portion can be prevented from increasing and the power consumption can be reduced.

The second electrode 7005 is formed using a light-transmitting conductive material, and, for example, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added may be used.

The light-emitting element 7002 corresponds to a region where the EL layer 7004 which includes a light-emitting layer is sandwiched between the first electrode 7003 and the second electrode 7005. In the case of the element structure illustrated in FIG. 18C, light is emitted from the light-emitting element 7002 to the second electrode 7005 as indicated by an arrow.

Although an example in which the thin film transistor 170 is used as the TFT 7001 is illustrated in FIG. 18C, the present invention is not particularly limited thereto.

In FIG. 18C, the drain electrode layer of the TFT 7001 is electrically connected to the first electrode 7003 through a contact hole provided in a protective insulating layer 7052 and an insulating layer 7055. A planarizing insulating layer 7053 can be formed using a resin material such as polyimide, acrylic, benzocyclobutene, polyamide, or epoxy. Other than such resin materials, it is also possible to use a low-dielectric constant material (low-k material), a siloxane-based resin, phosphosilicate glass (PSG), borophosphosilicate glass (BPSG), or the like. Note that the planarizing insulating layer 7053 may be formed by stacking a plurality of insulating films formed using these materials. There is no particular limitation on the method for forming the planarizing insulating layer 7053. The planarizing insulating layer 7053 can be formed, depending on the material, with a method such as a sputtering method, an SOG method, a spin coating method, a dipping method, a spray coating method, a droplet discharge method (e.g., an ink-jet method, screen printing, or offset printing), or a tool such as a doctor knife, a roll coater, a curtain coater, or a knife coater.

The partition wall 7009 is provided so as to insulate the first electrode 7003 and a first electrode 7008 of an adjacent pixel. The partition wall 7009 is formed using an organic resin film of polyimide, acrylic, polyamide, epoxy, or the like, an inorganic insulating film, or organic polysiloxane. It is particularly preferable that the partition wall 7009 be formed using a photosensitive resin material to have an opening portion over the first electrode 7003 so that a sidewall of the opening portion is formed as a tilted surface with continuous curvature. When the partition wall 7009 is formed using a photosensitive resin material, a step of forming a resist mask can be omitted.

In the structure illustrated in FIG. 18C, for performing full-color display, the light-emitting element 7002, one of adjacent light-emitting elements, and the other of the adjacent light-emitting elements are, for example, a green light-emitting element, a red light-emitting element, and a blue light-emitting element, respectively. Alternatively, a light-emitting display device capable of full color display may be manufactured using four kinds of light-emitting elements, which include a white light-emitting element in addition to three kinds of light-emitting elements.

In the structure of FIG. 18C, a light-emitting display device capable of full color display may be manufactured in such a manner that all light-emitting elements which are arranged are white light-emitting elements and a sealing substrate having a color filter or the like is arranged on the light-emitting element 7002. A material which exhibits a single color such as white can be formed and combined with a color filter or a color conversion layer, whereby full color display can be performed.

Needless to say, display of monochromatic light emission can also be performed. For example, a lighting system may be formed with the use of white light emission, or an area-color light-emitting device may be formed with the use of a single color light emission.

If necessary, an optical film such as a polarizing film including a circularly polarizing plate may be provided.

Although an organic EL element is described here as a light-emitting element, an inorganic EL element can also be provided as a light-emitting element.

Note that the example is described in which a thin film transistor (a TFT for driving a light-emitting element) which controls the driving of a light-emitting element is electrically connected to the light-emitting element; however, a structure may be employed in which a TFT for current control is connected between the TFT for driving a light-emitting element and the light-emitting element.

A semiconductor device described in this embodiment is not limited to the structures illustrated in FIGS. 18A to 18C and can be modified in various ways based on the spirit of techniques according to the present invention.

Figure 19A:
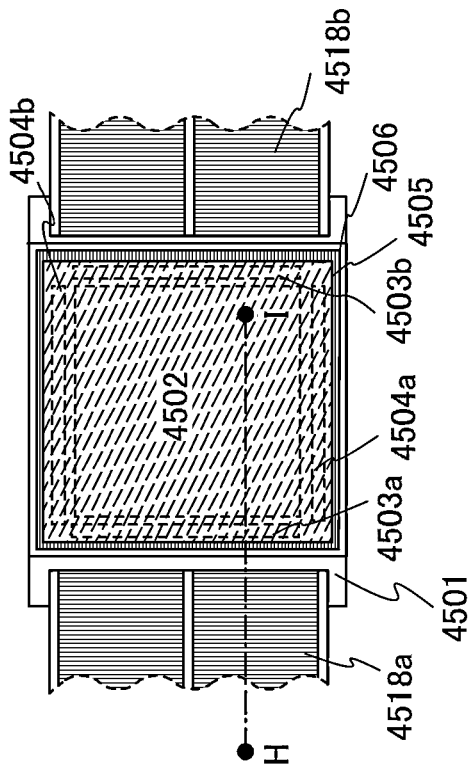
FIG. 19A is a plan view and FIG. 19B is a cross-sectional view illustrating an embodiment of the present invention.
Figure 19B:
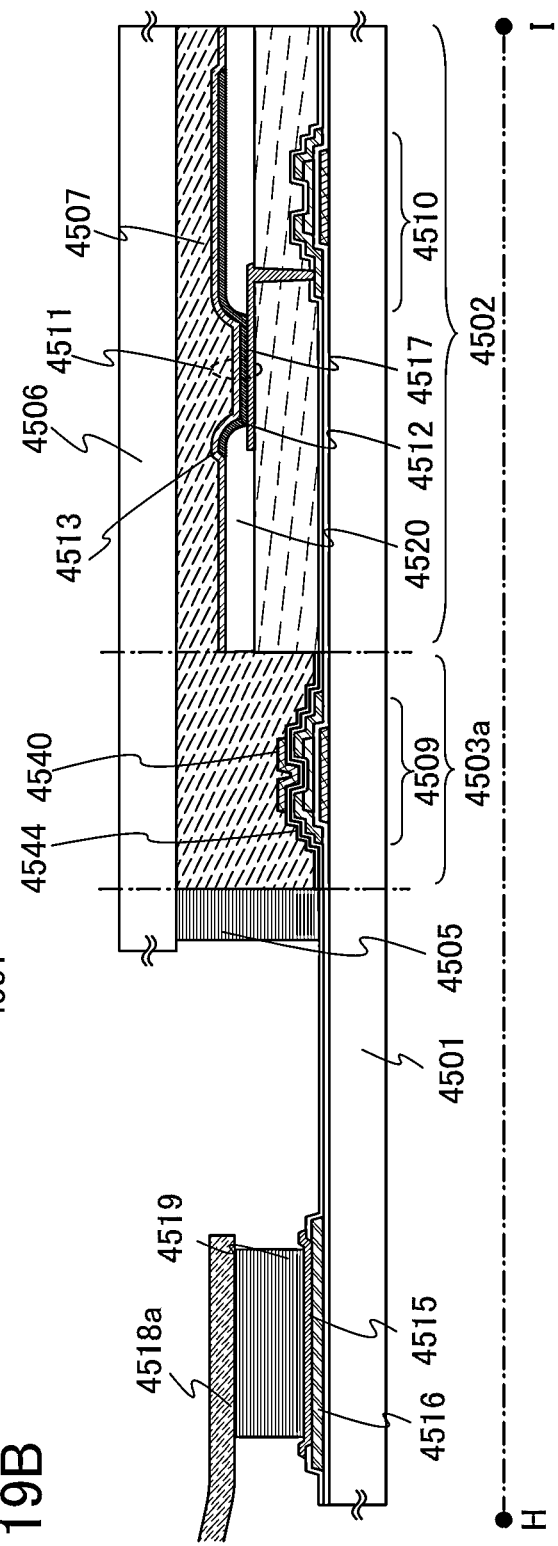

Next, the appearance and a cross section of a light-emitting display panel (also referred to as a light-emitting panel) which is an embodiment of a semiconductor device to which the thin film transistor described in Embodiments 1 and 2 is applied will be described with reference to FIGS. 19A and 19B. FIG. 19A is a top view of a panel in which a thin film transistor and a light-emitting element which are formed over a first substrate are sealed between the first substrate and a second substrate with a sealant. FIG. 19B is a cross-sectional view along H-I in FIG. 19A.

A sealant 4505 is provided so as to surround a pixel portion 4502, signal-line driver circuits 4503*a* and 4503*b*, and scan-line driver circuits 4504*a* and 4504*b* which are provided over a first substrate 4501. Moreover, a second substrate 4506 is provided over the pixel portion 4502, the signal line-driver circuits 4503*a* and 4503*b*, and the scan-line driver circuits 4504*a* and 4504*b*. Consequently, the pixel portion 4502, the signal-line driver circuits 4503*a* and 4503*b*, and the scan-line driver circuits 4504*a* and 4504*b* are sealed together with a filler 4507 by the first substrate 4501, the sealant 4505, and the second substrate 4506. In this manner, a panel is preferably packaged (sealed) with a protective film (such as a laminate film or an ultraviolet curable resin film) or a cover material with high air-tightness and little degasification so that the panel is not exposed to the outside air.

The pixel portion 4502, the signal-line driver circuits 4503*a* and 4503*b*, and the scan-line driver circuits 4504*a* and 4504*b*, which are provided over the first substrate 4501, each include a plurality of thin film transistors. A thin film transistor 4510 included in the pixel portion 4502 and a thin film transistor 4509 included in the signal-line driver circuit 4503*a* are illustrated as an example in FIG. 19B.

The thin film transistors described in Embodiments 1 and 2, the channel formation regions each of which include an In—Ga—Zn—O-based film, can be used as the thin film transistors 4509 and 4510. In this embodiment, the thin film transistors 4509 and 4510 are n-channel thin film transistors.

A conductive layer 4540 is provided over part of an insulating layer 4544 so as to overlap with a channel formation region of an oxide semiconductor layer in the thin film transistor 4509 for the driver circuit. The conductive layer 4540 is provided so as to overlap with the channel formation region of the oxide semiconductor layer, whereby the amount of change in threshold voltage of the thin film transistor 4509 before and after the BT testing can be reduced. A potential of the conductive layer 4540 may be the same as or different from that of a gate electrode layer of the thin film transistor 4509. The conductive layer 4540 can also function as a second gate electrode layer. Alternatively, the potential of the conductive layer 4540 may be GND, 0 V, or the conductive layer 4540 may be in a floating state.

Reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is a stacked structure of the first electrode layer 4517, an electroluminescent layer 4512, and a second electrode layer 4513; however, the structure of the light-emitting element 4511 is not limited to the structure described in this embodiment. The structure of the light-emitting element 4511 can be changed as appropriate depending on the direction in which light is extracted from the light-emitting element 4511, for example.

A partition wall 4520 is formed using an organic resin film, an inorganic insulating film, or organic polysiloxane. It is particularly preferable that the partition wall 4520 be formed using a photosensitive material to have an opening portion over the first electrode layer 4517 so that a sidewall of the opening portion is formed as a tilted surface with continuous curvature.

The electroluminescent layer 4512 may be formed with a single layer or a plurality of layers stacked.

A protective film may be formed over the second electrode layer 4513 and the partition wall 4520 in order to prevent the entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal-line driver circuits 4503*a* and 4503*b*, the scan-line driver circuits 4504*a* and 4504*b*, and the pixel portion 4502 from FPCs 4518*a* and 4518*b*.

In this embodiment, a connection terminal electrode 4515 is formed from the same conductive film as the first electrode layer 4517 included in the light-emitting element 4511, and a terminal electrode 4516 is formed from the same conductive film as the source electrode layers and the drain electrode layers of the thin film transistors 4509 and 4510.

The connection terminal electrode 4515 is electrically connected to a terminal included in the FPC 4518*a* through an anisotropic conductive film 4519.

The second substrate positioned in the direction in which light is extracted from the light-emitting element 4511 needs to have a light-transmitting property. In that case, a light-transmitting material such as a glass plate, a plastic plate, a polyester film, or an acrylic film is used for the second substrate.

As the filler 4507, an ultraviolet curable resin or a thermosetting resin can be used in addition to an inert gas such as nitrogen or argon. For example, polyvinylchloride (PVC), acrylic, polyimide, an epoxy resin, a silicone resin, poly(vinyl butyral) (PVB), or ethylene vinyl acetate (EVA) can be used. In this embodiment, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment can be performed by which reflected light can be diffused by projections and depressions on the surface so as to reduce glare.

Driver circuits formed using a single crystal semiconductor or a polycrystalline semiconductor over a substrate separately prepared may be mounted as the signal-line driver circuits 4503*a* and 4503*b* and the scan-line driver circuits 4504*a* and 4504*b*. Alternatively, only the signal-line driver circuits or part thereof, or only the scan-line driver circuits or part thereof may be separately formed and then mounted. This embodiment is not limited to the structure illustrated in FIGS. 19A and 19B.

Through the above-described steps, a highly reliable light-emitting display device (a display panel) which consumes less power as a semiconductor device can be manufactured.

Note that the structure shown in this embodiment can be combined with the structure shown in the other embodiments as appropriate.

Embodiment 6

In this embodiment, an example of electronic paper will be described as a semiconductor device to which the thin film transistor described in Embodiments 1 and 2 is applied.

Figure 20:
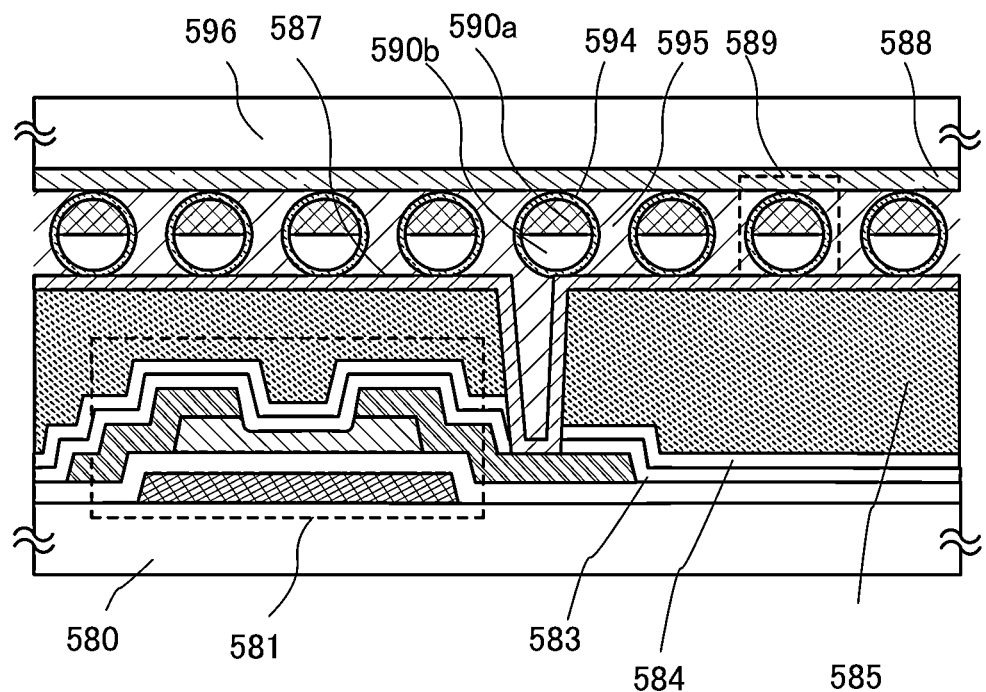
FIG. 20 is a cross-sectional view illustrating an embodiment of the present invention.

FIG. 20 illustrates an active matrix electronic paper as an example of a semiconductor device. A thin film transistor 581 used for the semiconductor device can be formed using the thin film transistor described in Embodiments 1 and 2, a channel formation region of which is partly or entirely formed using an In—Ga—Zn—O-based film having an incubation state.

The electronic paper in FIG. 20 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom gate thin film transistor. A source electrode layer or a drain electrode layer of the thin film transistor 581 is in contact with a first electrode layer 587 at an opening formed in an insulating layer 583, an insulating layer 584, and an insulating layer 585, whereby the thin film transistor 581 is electrically connected to the first electrode layer 587. Spherical particles 589 are provided between the first electrode layer 587 and a second electrode layer 588. Each of the spherical particles 589 includes a black region 590*a*, a white region 590*b*, and a cavity 594 filled with liquid around the black region 590*a* and the white region 590*b*. A space around the spherical particles 589 is filled with a filler 595 such as a resin (see FIG. 20). In this embodiment, the first electrode layer 587 corresponds to a pixel electrode and the second electrode layer 588 provided for a counter substrate 596 corresponds to a common electrode.

Alternatively, it is possible to use an electrophoretic element instead of the twisting ball. A microcapsule having a diameter of approximately 10 μm to 200 μm inclusive, in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, so that white or black can be displayed. A display element using this principle is an electrophoretic display element, and a device including the electrophoretic display element is called electronic paper in general. The electrophoretic display element has higher reflectance than a liquid crystal display element; thus, an auxiliary light is unnecessary, power consumption is low, and a display portion can be recognized in a dim place. In addition, even when power is not supplied to the display portion, an image which has been displayed once can be maintained. Consequently, a displayed image can be stored even when a semiconductor device having a display function (which may be referred to simply as a display device or a semiconductor device provided with a display device) is kept away from an electric wave source.

Through the above-described steps, electronic paper having favorable electric characteristics and high reliability as a semiconductor device can be manufactured.

Figure 21A:
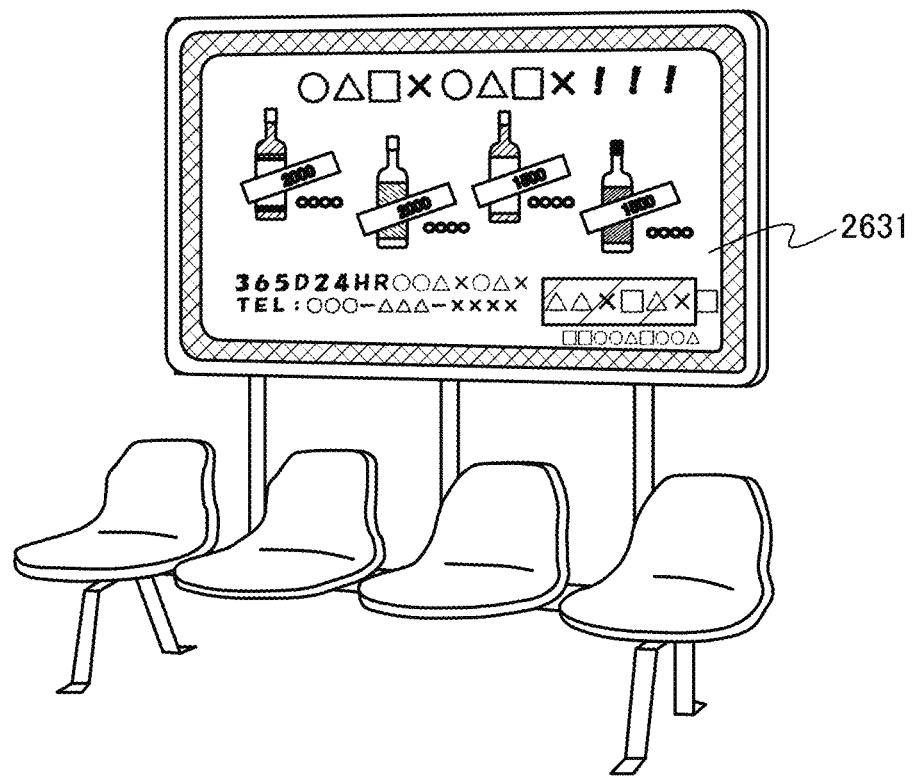
FIGS. 21A and 21B are views illustrating examples of application of electronic paper.
Figure 21B:
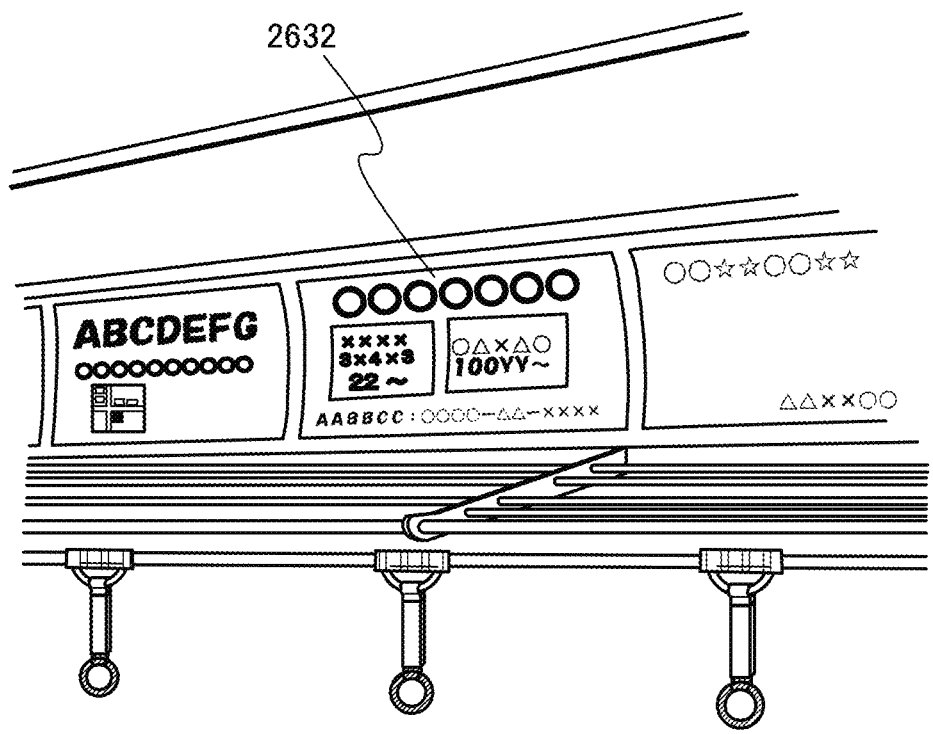
Figure 22:
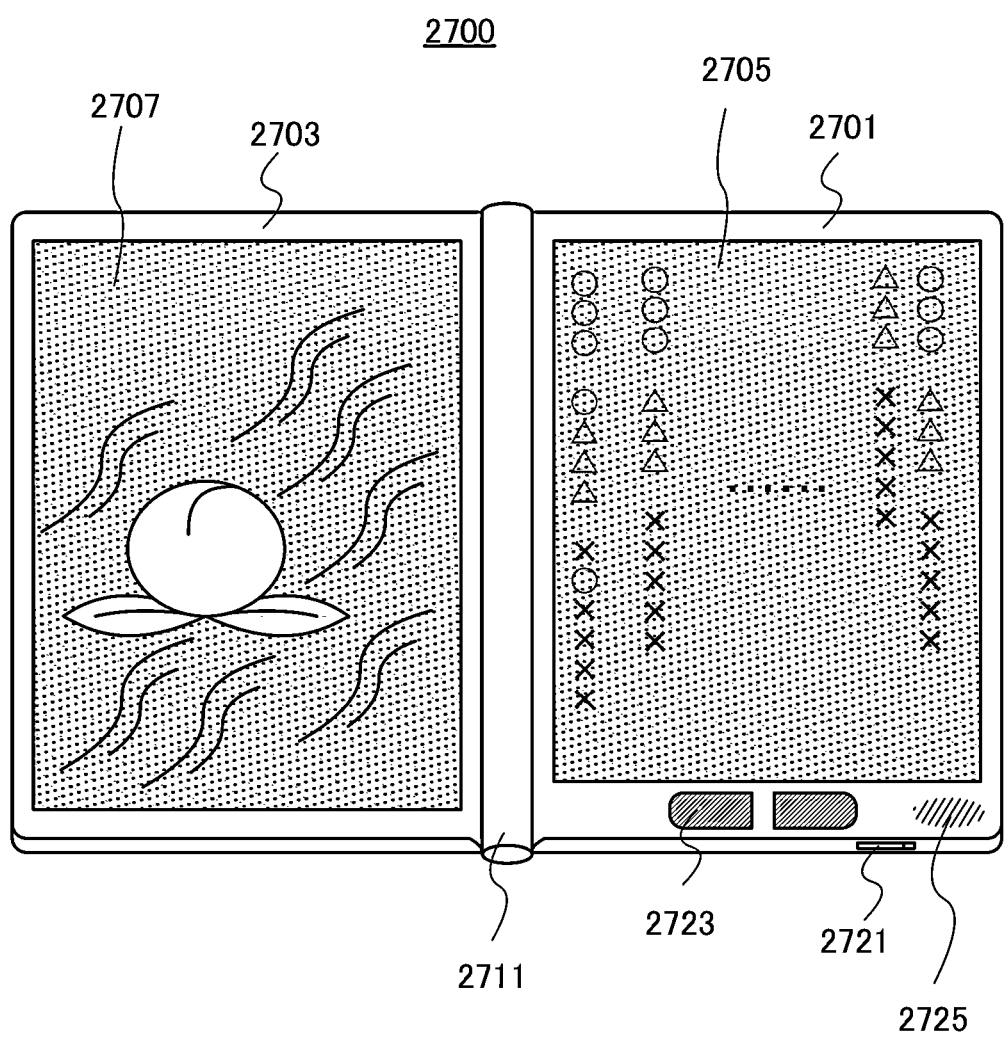
FIG. 22 is an external view illustrating an example of an e-book reader.

Electronic paper can be used for electronic devices in all fields as long as they display data. For example, electronic paper can be applied to an e-book reader (an electronic book), a poster, an advertisement in a vehicle such as a train, displays of a variety of cards such as a credit card, or the like. FIGS. 21A and 21B and FIG. 22 illustrate an example of the electronic devices.

FIG. 21A illustrates a poster 2631 formed using electronic paper. In the case where an advertising medium is printed paper, the advertisement is replaced by hands; however, by using the electronic paper, the advertising display can be changed in a short time. Furthermore, stable images can be obtained without display defects. Note that the poster may send and receive information wirelessly.

FIG. 21B illustrates an advertisement 2632 in a vehicle such as a train. In the case where an advertising medium is printed paper, the advertisement is replaced by hands; however, by using the electronic paper, the advertising display can be changed in a short time. Furthermore, stable images can be obtained without display defects. Note that the poster may send and receive information wirelessly.

FIG. 22 illustrates an example of an e-book reader. For example, an e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 22) can display text and a display portion on the left side (the display portion 2707 in FIG. 22) can display graphics.

FIG. 22 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter and a USB cable, or the like), a recording medium insertion portion, or the like may be provided on the back surface or the side surface of the housing. Moreover, the e-book reader 2700 may have a function of an electronic dictionary.

The e-book reader 2700 may send and receive information wirelessly. Through wireless communication, desired book data or the like can be purchased and downloaded from an electronic book server.

Note that the structure shown in this embodiment can be combined with the structure shown in the other embodiments as appropriate.

Embodiment 7

A semiconductor device which includes the thin film transistor described in Embodiments 1 and 2, the channel formation region of which is partly or entirely formed using an In—Ga—Zn—O-based film having an incubation state, can be applied to a variety of electronic devices (including game machines). Reliability is improved in the electronic devices which each include the thin film transistor, a channel formation region of which is partly or entirely formed using an In—Ga—Zn—O-based film having an incubation state. Examples of such electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pinball machine, and the like.

Figure 23A:
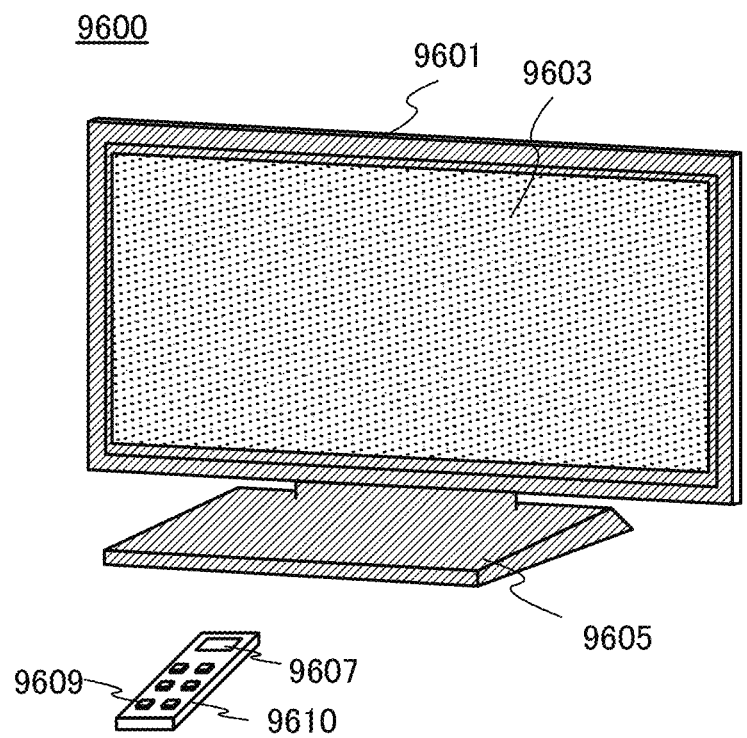
FIGS. 23A and 23B are external views illustrating examples of a television device and a digital photo frame, respectively.

FIG. 23A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data outputted from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

Figure 23B:
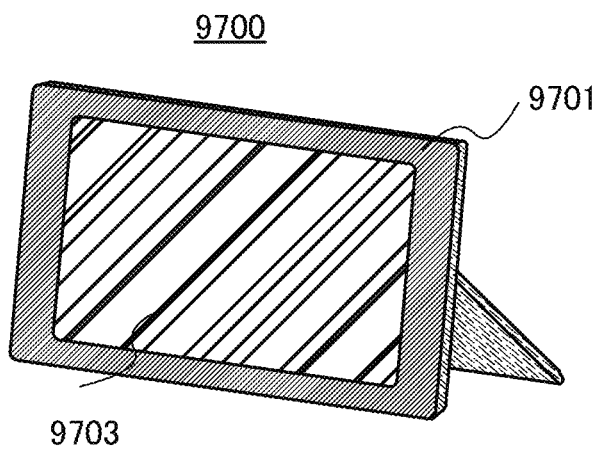

FIG. 23B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal connectable to a variety of cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame 9700 and the data is loaded, whereby the image can be displayed on the display portion 9703.

The digital photo frame 9700 may send and receive information wirelessly. Through wireless communication, desired image data can be loaded and displayed.

Figure 24A:
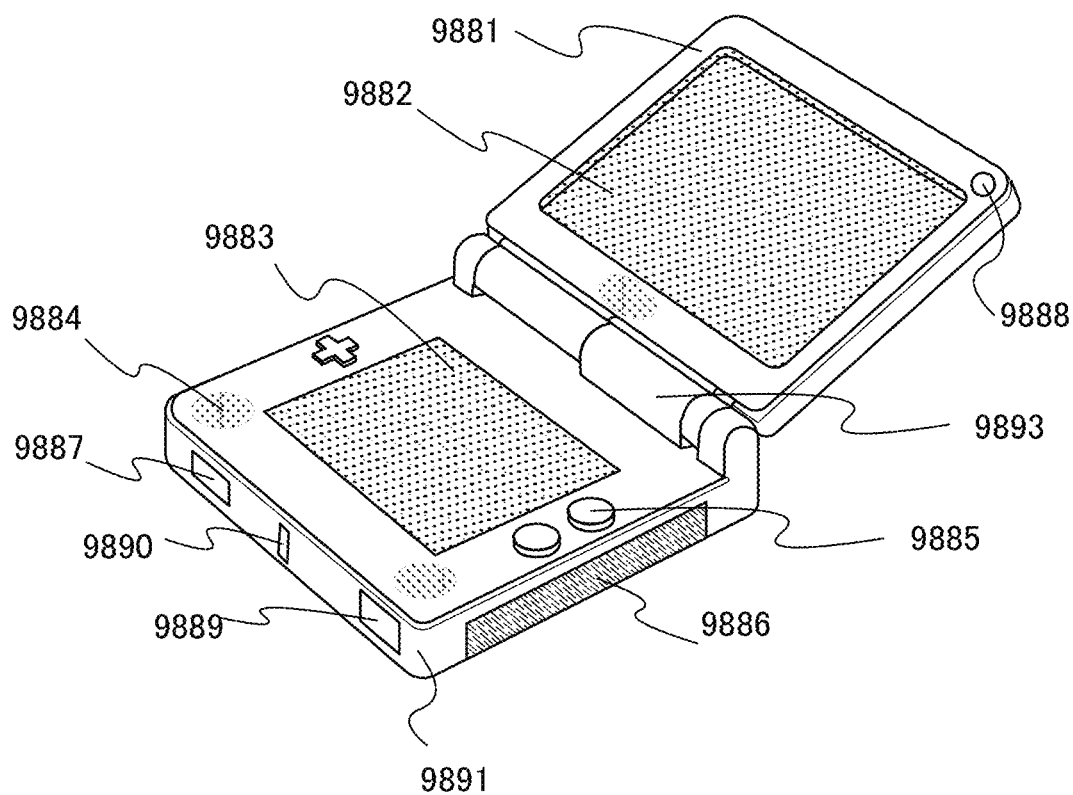
FIGS. 24A and 24B are external views illustrating examples of game machines.

FIG. 24A is a portable game machine and is constituted by two housings of a housing 9881 and a housing 9891, which are connected with a joint portion 9893 so that the portable game machine can be opened and folded. A display portion 9882 and a display portion 9883 are incorporated in the housing 9881 and the housing 9891, respectively. In addition, the portable game machine illustrated in FIG. 24A is provided with a speaker portion 9884, a recording medium insertion portion 9886, an LED lamp 9890, an input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above structure and other structures provided with at least a semiconductor device of the present invention can be employed. The portable game machine may include other accessory as appropriate. The portable game machine illustrated in FIG. 24A has a function of reading a program or data stored in the recording medium to display it on the display portion, and a function of sharing information with another portable game machine by wireless communication. Note that a function of the portable game machine illustrated in FIG. 24A is not limited to those described above, and the portable game machine can have a variety of functions.

Figure 24B:
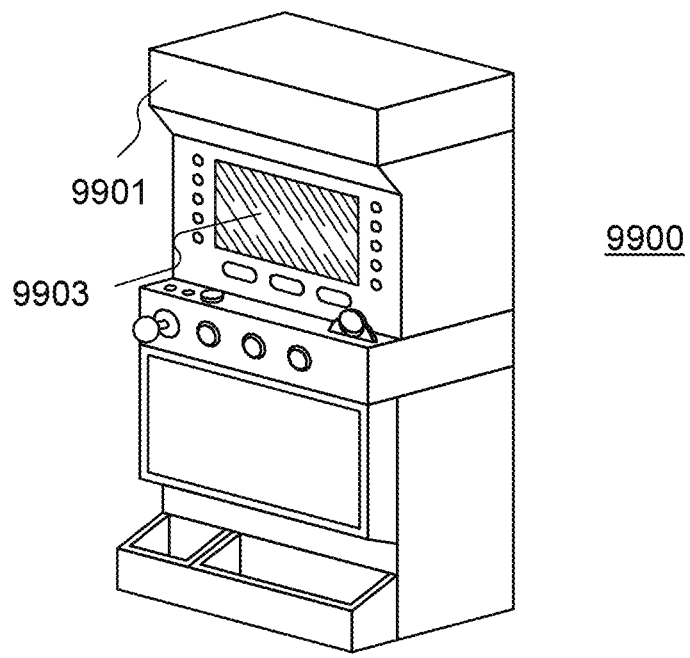

FIG. 24B illustrates an example of a slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least a semiconductor device of the present invention may be employed. The slot machine 9900 may include other accessory as appropriate.

Figure 25A:
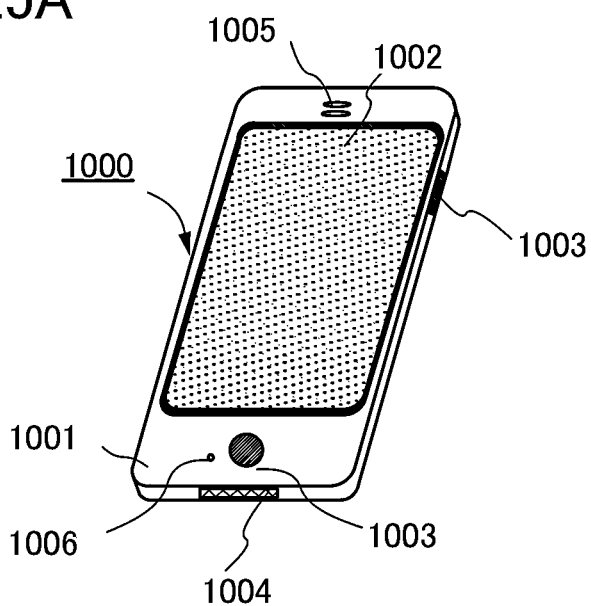
FIGS. 25A and 25B are external views illustrating examples of mobile phone handsets.

FIG. 25A illustrates an example of a mobile phone handset. A mobile phone handset 1000 is provided with a display portion 1002 incorporated in a housing 1001, operation buttons 1003, an external connection port 1004, a speaker 1005, a microphone 1006, and the like.

When the display portion 1002 illustrated in FIG. 25A is touched with a finger or the like, data can be inputted into the mobile phone handset 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be inputted. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display in the screen of the display portion 1002 can be automatically switched by determining the direction of the mobile phone handset 1000 (whether the mobile phone handset 1000 stands upright or is laid down on its side).

The screen modes are switched by touching the display portion 1002 or operating the operation buttons 1003 of the housing 1001. Alternatively, the screen modes may be switched depending on the kind of the image displayed on the display portion 1002. For example, when a signal of an image displayed on the display portion is the one of moving image data, the screen mode is switched to the display mode. When the signal is the one of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 25B:
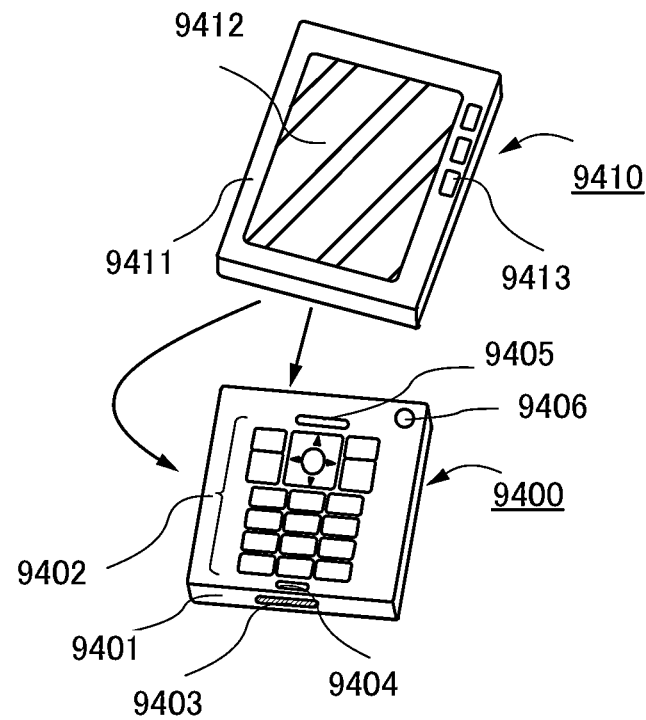

FIG. 25B also illustrates an example of a mobile phone handset. The mobile phone handset in FIG. 25B includes an a display device 9410 in which a display portion 9412 and an operation button 9413 are included in a housing 9411, and a communication device 9400 in which operation buttons 9402, an external input terminal 9403, a microphone 9404, a speaker 9405, and a light-emitting portion 9406 that emits light when a phone call is received are included in a housing 9401. The display device 9410 having a display function can be detached from or attached to the communication device 9400 having a telephone function in two directions as indicated by arrows. Thus, a minor axis of the display device 9410 can be attached to a minor axis of the communication device 9400, and a major axis of the display device 9410 can be attached to a major axis of the communication device 9400. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that the structure shown in this embodiment can be combined with the structure shown in the other embodiments as appropriate.

The present application is based on Japanese Patent Application serial No. 2009-219128 filed with the Japan Patent Office on Sep. 24, 2009, the entire contents of which are hereby incorporated by reference.

EXPLANATION OF REFERENCE

10: pulse output circuit, 11: first wiring, 12: second wiring, 13: third wiring, 14: fourth wiring, 15: fifth wiring, 16: sixth wiring, 17: seventh wiring, 21: input terminal, 22: input terminal, 23: input terminal, 24: input terminal, 25: input terminal, 26: output terminal, 27: output terminal, 28: thin film transistor, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 100: substrate, 101: gate electrode layer, 102: gate insulating layer, 103: oxide semiconductor layer, 105a: source electrode layer, 105b: drain electrode layer, 107: oxide insulating layer, 108: capacitor wiring, 109: contact hole, 110: pixel electrode layer, 112: conductive layer, 112a: conductive layer, 112b: conductive layer, 113: conductive layer, 113a: conductive layer, 113b: conductive layer, 114: conductive layer, 114a: conductive layer, 114b: conductive layer, 120: connection electrode, 121: terminal, 122: terminal, 124: capacitor electrode layer, 125: contact hole, 126: contact hole, 127: contact hole, 128: light-transmitting conductive film, 129: light-transmitting conductive film, 131: resist mask, 150: terminal, 151: terminal, 152: gate insulating layer, 153: connection electrode, 154: protective insulating film, 155: light-transmitting conductive film, 156: electrode, 170: thin film transistor, 201: site, 202: In atom, 203: atom, 204: oxygen atom, 580: substrate, 581: thin film transistor, 585: insulating layer, 587: electrode layer, 588: electrode layer, 589: spherical particles, 590a: black region, 590b: white region, 594: cavity, 595: filler, 596: counter substrate, 1000: mobile phone handset, 1001: housing, 1002: display portion, 1003: operation buttons, 1004: external connection port, 1005: speaker, 1006: microphone, 2600: TFT substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflective plate, 2612: circuit board, 2613: diffusion plate, 2631: poster, 2632: advertisement, 2700: e-book reader, 2701: housing, 2703: housing, 2705: display portion, 2707: display portion, 2711: hinge, 2721: power switch, 2723: operation keys, 2725: speaker, 4001: substrate, 4002: pixel portion, 4003: signal-line driver circuit, 4004: scan-line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4040: conductive layer, 4044:

insulating layer, 4501: substrate, 4502: pixel portion, 4503a: signal-line driver circuit, 4503b: signal-line driver circuit, 4504a: scan-line driver circuit, 4504b: scan-line driver circuit, 4505: sealant, 4506: substrate, 4507: filler, 4509: thin film transistor, 4510: thin film transistor, 4511: light-emitting element, 4512: electroluminescent layer, 4513: electrode layer, 4515: connection terminal electrode, 4516: terminal electrode, 4517: electrode layer, 4518a: FPC, 4518b: FPC, 4519: anisotropic conductive film, 4520: partition wall, 4540: conductive layer, 4544: insulating layer, 5300: substrate, 5301: pixel portion, 5302: scan-line driver circuit, 5303: scan-line driver circuit, 5304: signal-line driver circuit, 5305: timing control circuit, 5601: shift register, 5602: switching circuit, 5603: thin film transistor, 5604: wiring, 5605: wiring, 6400: pixel, 6401: switching transistor, 6402: driving transistor, 6403: capacitor, 6404: light-emitting element, 6405: signal line, 6406: scan line, 6407: power supply line, 6408: common electrode,

7001: TFT for driving a light-emitting element, 7002: light-emitting element, 7003: electrode, 7004: EL layer, 7005: electrode, 7008: electrode, 7009: partition wall, 7010: substrate, 7011: TFT for driving a light-emitting element, 7012: light-emitting element, 7013: electrode, 7014: EL layer, 7015: electrode, 7016: light-blocking film, 7017: conductive film, 7019: partition wall, 7020: substrate, 7021: TFT for driving a light-emitting element, 7022: light-emitting element, 7023: electrode, 7024: EL layer, 7025: electrode, 7027: conductive film, 7029: partition wall, 7030: first gate insulating layer, 7031: second gate insulating layer, 7032: insulating layer, 7033: color filter layer, 7034: overcoat layer, 7035: protective insulating layer, 7040: gate insulating layer, 7041: gate insulating layer, 7042: insulating layer, 7043: color filter layer, 7044: overcoat layer, 7045: protective insulating layer, 7052: protective insulating layer, 7053: planarizing insulating layer, 7055: insulating layer, 9400: communication device, 9401: housing, 9402: operation buttons, 9403: external input terminal, 9404: microphone, 9405: speaker, 9406: light-emitting portion, 9410: display device, 9411: housing, 9412: display portion, 9413: operation button, 9600: television set, 9601: housing, 9603: display portion, 9605: stand, 9607: display portion, 9609: operation keys, 9610: remote controller, 9700: digital photo frame, 9701: housing, 9703: display portion, 9881: housing, 9882: display portion, 9883: display portion, 9884: speaker portion, 9885: input means (operation keys), 9886: recording medium insertion portion, 9887: connection terminal, 9888: sensor, 9889: microphone, 9890: LED lamp, 9891: housing, 9893: joint portion, 9900: slot machine, 9901: housing, 9903: display portion.

What is claimed is:

1. A method for manufacturing a semiconductor device comprising the steps of:
   introducing a substrate into a chamber, wherein the chamber is provided with a magnet system and a target comprising In, Ga and Zn, and wherein a relative density of the target is greater than or equal to 80%;
   forming an oxide semiconductor layer by magnetron sputtering using the magnet system and the target over the substrate after reverse sputtering is performed, wherein the substrate is heated during the magnetron sputtering;
   patterning the oxide semiconductor layer into an island-shaped region including a channel formation region; and
   performing dehydration or dehydrogenation by heat treatment in a heat treatment apparatus after the oxide semiconductor layer is patterned,
   wherein the oxide semiconductor layer comprises In, Ga and Zn, and
   wherein a purity of an inert gas which is introduced into the heat treatment apparatus during the heat treatment is set greater than or equal to 99.9999%.

2. The method according to claim 1, wherein the substrate is heated at a temperature of 400° C. to 700° C. during the magnetron sputtering.

3. The method according to claim 1, further comprising:
   performing a preheat treatment, so that an inside of a film deposition chamber is heated, before forming the oxide semiconductor layer.

4. The method according to claim 1, wherein moisture in a sputtering apparatus is removed by using a cryopump.

5. The method according to claim 1, wherein an electron diffraction pattern of the oxide semiconductor layer does not show a halo shape pattern.

6. The method according to claim 1, wherein the oxide semiconductor layer is formed without being exposed to air after the reverse sputtering.

7. A method for manufacturing a semiconductor device comprising the steps of:
  forming a gate electrode over a substrate;
  forming a gate insulating layer over the gate electrode;
  introducing the substrate into a chamber, wherein the chamber is provided with a magnet system and a target comprising In, Ga and Zn, and wherein a relative density of the target is greater than or equal to 80%;
  forming an oxide semiconductor layer by magnetron sputtering using the magnet system and the target over the gate insulating layer after reverse sputtering is performed, wherein the substrate is heated during the magnetron sputtering;
  patterning the oxide semiconductor layer into an island-shaped region including a channel formation region; and
  performing dehydration or dehydrogenation by heat treatment in a heat treatment apparatus after the oxide semiconductor layer is patterned,
  wherein the oxide semiconductor layer comprises In, Ga and Zn, and
  wherein a purity of an inert gas which is introduced into the heat treatment apparatus during the heat treatment is set greater than or equal to 99.9999%.

8. The method according to claim 7, wherein the substrate is heated at a temperature of 400° C. to 700° C. during the magnetron sputtering.

9. The method according to claim 7, further comprising:
  performing a preheat treatment, so that an inside of a film deposition chamber is heated, before forming the oxide semiconductor layer.

10. The method according to claim 7, wherein moisture in a sputtering apparatus is removed by using a cryopump.

11. The method according to claim 7, wherein an electron diffraction pattern of the oxide semiconductor layer does not show a halo shape pattern.

12. The method according to claim 7, wherein the oxide semiconductor layer is formed without being exposed to air after the reverse sputtering.

13. A method for manufacturing a semiconductor device comprising the steps of:
  introducing a substrate into a chamber, wherein the chamber is provided with a magnet system and a target comprising In, Ga and Zn, and wherein a relative density of the target is greater than or equal to 80%;
  forming an oxide semiconductor layer by magnetron sputtering using the magnet system and the target over the substrate while removing moisture with use of a cryopump before, during or after the oxide semiconductor layer is formed, wherein the substrate is heated during the magnetron sputtering;
  patterning the oxide semiconductor layer into an island-shaped region including a channel formation region; and
  performing dehydration or dehydrogenation by heat treatment in a heat treatment apparatus after the oxide semiconductor layer is patterned,
  wherein the oxide semiconductor layer comprises In, Ga and Zn, and
  wherein a purity of an inert gas which is introduced into the heat treatment apparatus during the heat treatment is set greater than or equal to 99.9999%.

14. The method according to claim 13, wherein a gas containing oxygen is used when forming the oxide semiconductor layer.

15. The method according to claim 13, wherein the substrate is heated at a temperature of 400° C. to 700° C. during the magnetron sputtering.

16. The method according to claim 13, further comprising:
  performing a preheat treatment, so that an inside of a film deposition chamber is heated, before forming the oxide semiconductor layer.

17. The method according to claim 13, wherein an electron diffraction pattern of the oxide semiconductor layer does not show a halo shape pattern.

18. The method according to claim 14, wherein the gas containing oxygen is an oxygen gas.

* * * * *